United States Patent
Crane, Jr. et al.

(10) Patent No.: US 7,123,465 B2
(45) Date of Patent: Oct. 17, 2006

(54) DECOUPLING CAPACITOR FOR AN INTEGRATED CIRCUIT AND METHOD OF MANUFACTURING THEREOF

(75) Inventors: Stanford W. Crane, Jr., San Jose, CA (US); Zsolt Horvath, Millbrae, CA (US); Josh Nickel, San Jose, CA (US); Myoung-soo Jeon, Fremont, CA (US); Charley Ogata, San Jose, CA (US); Vincent Alcaria, Manteca, CA (US); Patrick Codd, Palo Alto, CA (US)

(73) Assignee: Silicon Bandwidth, Inc., San Jose, CA (US)

( * ) Notice: Subject to any disclaimer, the term of this patent is extended or adjusted under 35 U.S.C. 154(b) by 0 days.

(21) Appl. No.: 10/948,638

(22) Filed: Sep. 24, 2004

(65) Prior Publication Data

US 2006/0067031 A1    Mar. 30, 2006

(51) Int. Cl.
*H01G 4/228* (2006.01)
(52) U.S. Cl. ............... 361/306.2; 361/306.1; 361/306.3; 361/303; 361/321.2; 438/386; 438/387
(58) Field of Classification Search ............. 361/306.2, 361/306.1, 321.1, 321.2, 311–313, 306.3; 174/260–262; 257/532, 533; 438/386–387
See application file for complete search history.

(56) References Cited

U.S. PATENT DOCUMENTS

| | | | |
|---|---|---|---|
| 5,103,283 A * | 4/1992 | Hite ............... | 257/724 |
| 5,422,782 A * | 6/1995 | Hernandez et al. ...... | 361/306.2 |
| 6,137,161 A | 10/2000 | Gilliland et al. | |
| 6,191,479 B1 * | 2/2001 | Herrell et al. ............. | 257/724 |
| 6,515,842 B1 | 2/2003 | Hayworth et al. | |
| 6,806,568 B1 * | 10/2004 | Schaper ............... | 257/724 |
| 6,812,109 B1 * | 11/2004 | Ahn et al. ............. | 438/386 |

FOREIGN PATENT DOCUMENTS

| | | |
|---|---|---|
| JP | 2000-349225 | 12/2000 |
| JP | 2005-072627 | 3/2005 |

OTHER PUBLICATIONS

"Method for Soldering Capacitor Arrays Under BGAs to Improve Decoupling Capacitance", priorartdatabase.com, Jan. 22, 2003, pp. 1-8.

* cited by examiner

*Primary Examiner*—Nguyen T. Ha
(74) *Attorney, Agent, or Firm*—Morgan, Lewis & Bockius LLP

(57) ABSTRACT

A capacitor structure may be incorporated into an interposer or substrate associated with an IC chip to stabilize the input/output signals, such as power and ground, between the IC chip and a printed circuit board. In accordance with one embodiment, the capacitor structure may include a plurality of individual capacitors connected together to form a monolithic capacitor blade having a length, width, and height, wherein each of the length and height of the blade spans multiple of the individual capacitors. The blade includes multiple electrical conductive paths extending the height of the capacitor blade. According to another embodiment, the capacitor structure includes multiple interleaved power and ground layers separated by insulating layers. The power layers connect to power leads and the ground layers connect to ground leads.

21 Claims, 95 Drawing Sheets

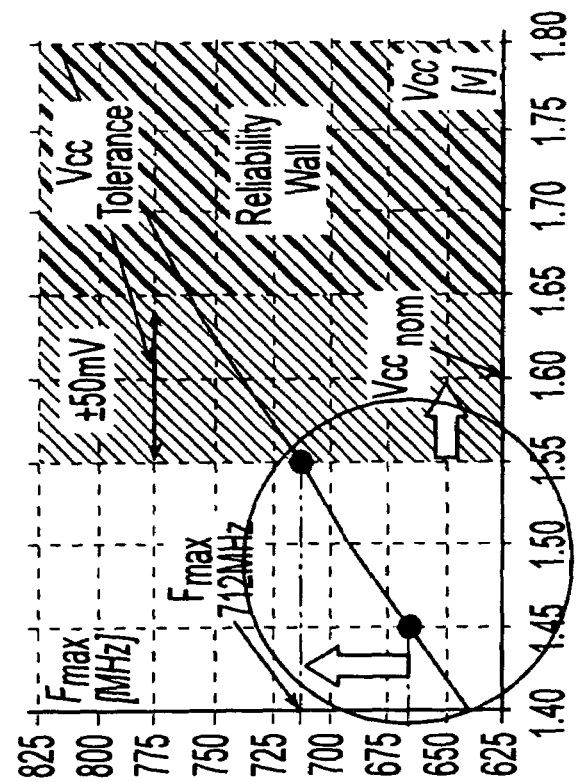
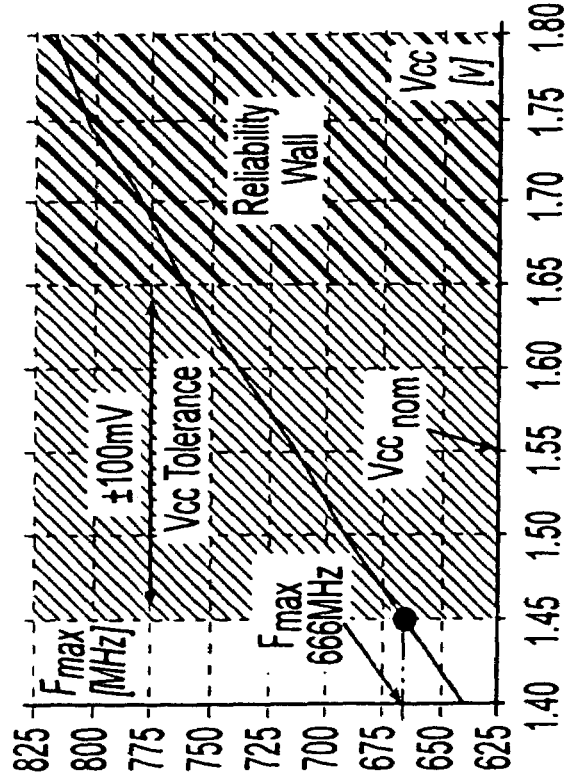
Fig. 1B
Fig. 1A

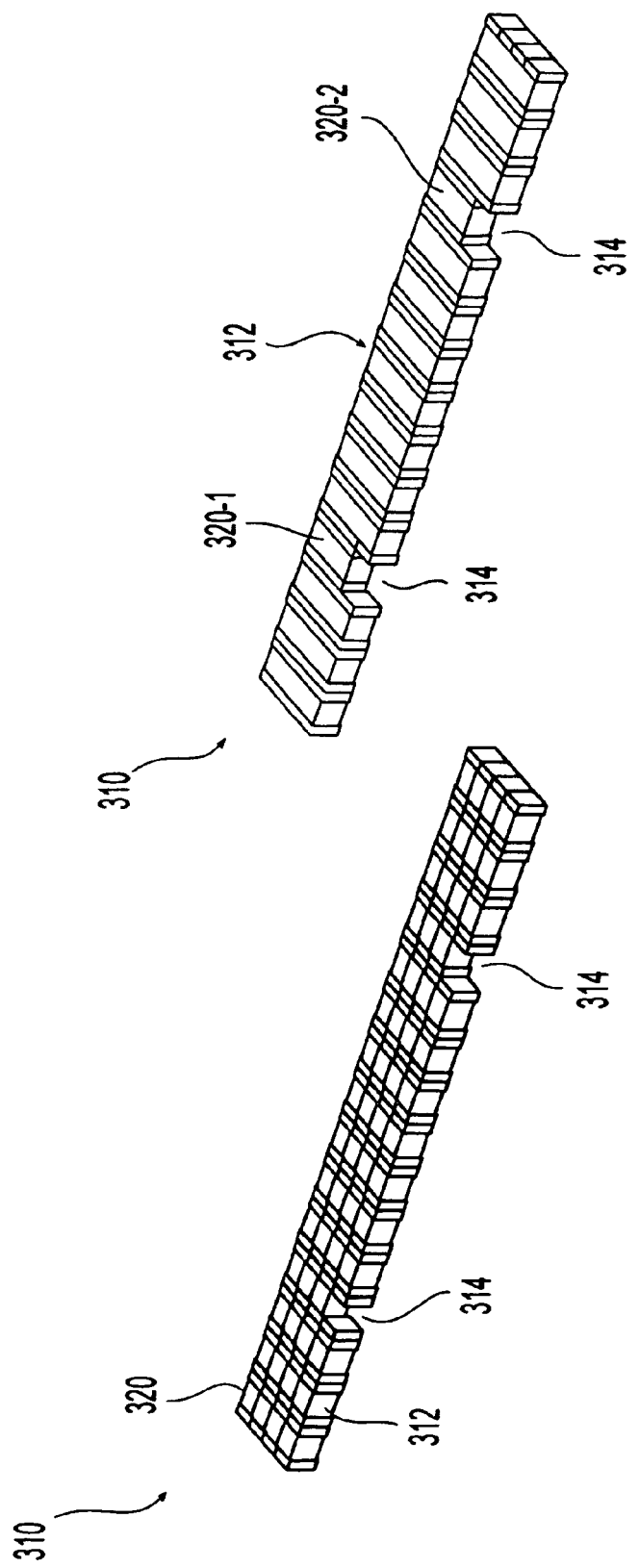

ated with a ±50 mV range. In this case, the nominal
DECOUPLING CAPACITOR FOR AN INTEGRATED CIRCUIT AND METHOD OF MANUFACTURING THEREOF

FIELD OF THE INVENTION

The present invention relates to voltage supply stabilization and, in particular, to a decoupling capacitor arrangement, to integrated circuit devices that incorporate the decoupling capacitor arrangement, and to methods of manufacturing the foregoing.

BACKGROUND OF THE INVENTION

Integrated circuits or "ICs" are the electronic components that run computers, cell phones, and other equipment. ICs are usually mounted on printed circuit boards (PCBs) housed within the equipment. The PCBs have conductive traces that electrically connect together the ICs and permit connection to other components, such as displays, keyboards, speakers, microphones, etc. The ICs are often the electronic elements that control device operation.

ICs are characterized by their operating speed, which is often indicated using their clock rate. For example, computers may be advertised as having a 500 MHz Intel Pentium III microprocessor. The "500 MHz" designation indicates the clock rate of the Pentium III microprocessor, which is one type of IC. ICs are also characterized by their density, which represents the number of devices built into an IC chip of given dimensions, or by a measure that reflects relative density, such as line width or another critical dimension. Over time, new generations of ICs have become faster in operation and denser than previous generations. The trend is expected to continue for the foreseeable future.

IC packages have pins or leads that conduct address, control or data signals, power, ground, and possibly other inputs/outputs to and from the IC. As the number of electronic devices included in the IC increases, the power needed to operate the devices may also increase. Moreover, operating voltages have decreased in part due to an effort to prevent adjacent device structures from shorting. Operating voltages have decreased, launch voltages and noise budgets have also decreased. As voltages have decreased, the number of pins has increased to provide better signal integrity for both signals and power delivery. Consequently, future ICs are expected to have more input/output pins and operate at higher speeds.

FIGS. 1A and 1B illustrate how the performance of an IC can be affected by factors external to the IC. For example, a relationship exists between the voltage supply to an IC and its clock rate. IC supply voltage (sometimes referred to generally as "Vcc" herein) is commonly indicated as a constant, e.g., 1.5 V. In fact, the actual supply voltage fluctuates or varies to some degree over time and with the downstream load driven by the supply voltage. For example, load fluctuations may occur as the result of switching circuitry within the IC. FIGS. 1A and 1B are graphs that plot maximum clock rate or frequency for a representative IC over possible voltage supply Vcc values for that IC. It is assumed that the IC voltage supply reaches a reliability wall at 1.65 V.

With respect to FIG. 1A, Vcc is assumed to vary over a range of ±100 mV. If the maximum voltage in the range is set at the reliability wall, then the nominal voltage Vccnom will be 1.55 V and the voltage supply will fluctuate between 1.45 V and 1.65 V. Because the minimum voltage is 1.45 V, the maximum clock rate in this example is 666 MHz.

FIG. 1B shows that the maximum clock rate can be increased, yielding a faster device, simply by stabilizing the voltage supply. As shown in FIG. 1B, the supply voltage varies within a ±50 mV range. In this case, the nominal voltage supply Vccnom can be set to 1.60 V, with the voltage supply varying from 1.55 V to 1.65 V. The voltage supply minimum of 1.55 V corresponds to a maximum clock rate of 712 MHz, an increase of 46 MHz over the example of FIG. 1A, achieved simply by stabilizing the voltage supply. Moreover, even higher clock rates can be achieved if the voltage supply is better stabilized.

The voltage supply can be stabilized using decoupling capacitors. As shown in FIG. 2, conventional PCBs often include rows of individual decoupling capacitors 2 surrounding an IC, such as a microprocessor. The decoupling capacitors 2 connect in the wiring lines or traces to the IC. The decoupling capacitors are useful from an electrical standpoint, but are far from ideal. For example, the individual capacitors take up too much space on the surface of the PCB, space that could be used by other components or that could be eliminated to achieve a reduction in size. In addition, the placement of the capacitors slows manufacture, leading to reduced manufacturing throughput and higher prices. Furthermore, the distance between the decoupling capacitors and the IC is not short enough. Reducing this distance would improve electrical performance. Moreover, as faster, more dense, lower voltage, higher pin count ICs are developed, these problems will become worse. More space will be required for the capacitors, larger capacitors will be required, and manufacturing will become more expensive.

SUMMARY OF THE INVENTION

The present invention relates to a platform that incorporates decoupling capacitors between an IC chip on one hand and a circuit board on the other hand. For example, decoupling capacitors may be provided in a semiconductor die package, thereby providing a decoupling capacitance between the an IC chip housed within the package and a printed circuit board on which the package is mounted. The decoupling capacitors are provided near the IC chip, yielding a lower inductive path and/or greater effective capacitance that helps to stabilize the supply voltage. This platform can enable, among other things, better supply voltage stability because the charge stored in the decoupling capacitors can offset variations. In particular, the present invention provides novel decoupling capacitor structures. These capacitor structures may be incorporated into the power and ground structures associated with an IC. For example, the decoupling capacitors can be provided in an interposer that mounts between an IC chip and substrate on one hand and the PCB on the other. In accordance with another embodiment, decoupling capacitors can be integrated into the substrate, such that the decoupling capacitors are provided between the IC chip and the PCB. In accordance with a further embodiment, the interposer having the novel decoupling capacitor structure may be adapted to connect to a socket attached to a PCB or other substrate. The structure of the decoupling capacitor may also serve as virtual pins, replacing pins that would otherwise be provided.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention.

FIGS. 1A and 1B illustrate the effect of improved supply voltage stability on the performance characteristics of an IC.

FIG. 7 illustrates an exemplary arrangement of capacitor blade having alignment notches in accordance with an embodiment of the present invention.

FIG. 8 illustrates an alternative arrangement of a capacitor blade having alignment notches in accordance with an embodiment of the present invention.

DETAILED DESCRIPTION OF THE PREFERRED EMBODIMENT(S)

Reference will now be made in detail to the present exemplary embodiment(s) of the invention illustrated in the accompanying drawings. Wherever possible, the same reference numbers will be used throughout the drawings to refer to the same or like parts.

Figure 2:
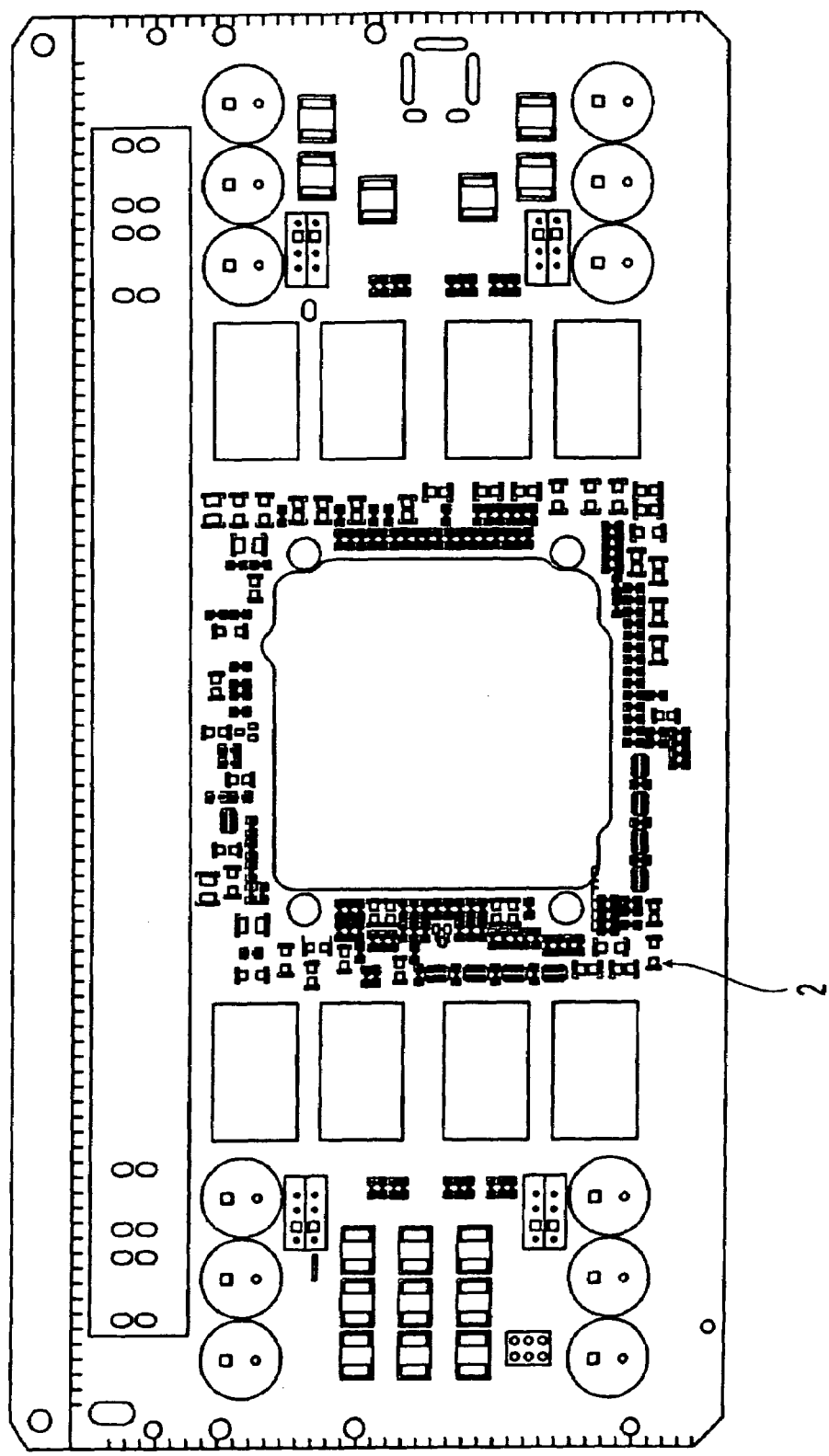
FIG. 2 illustrates a conventional printed circuit board having individual decoupling capacitors surrounding an IC chip.
Figure 3:
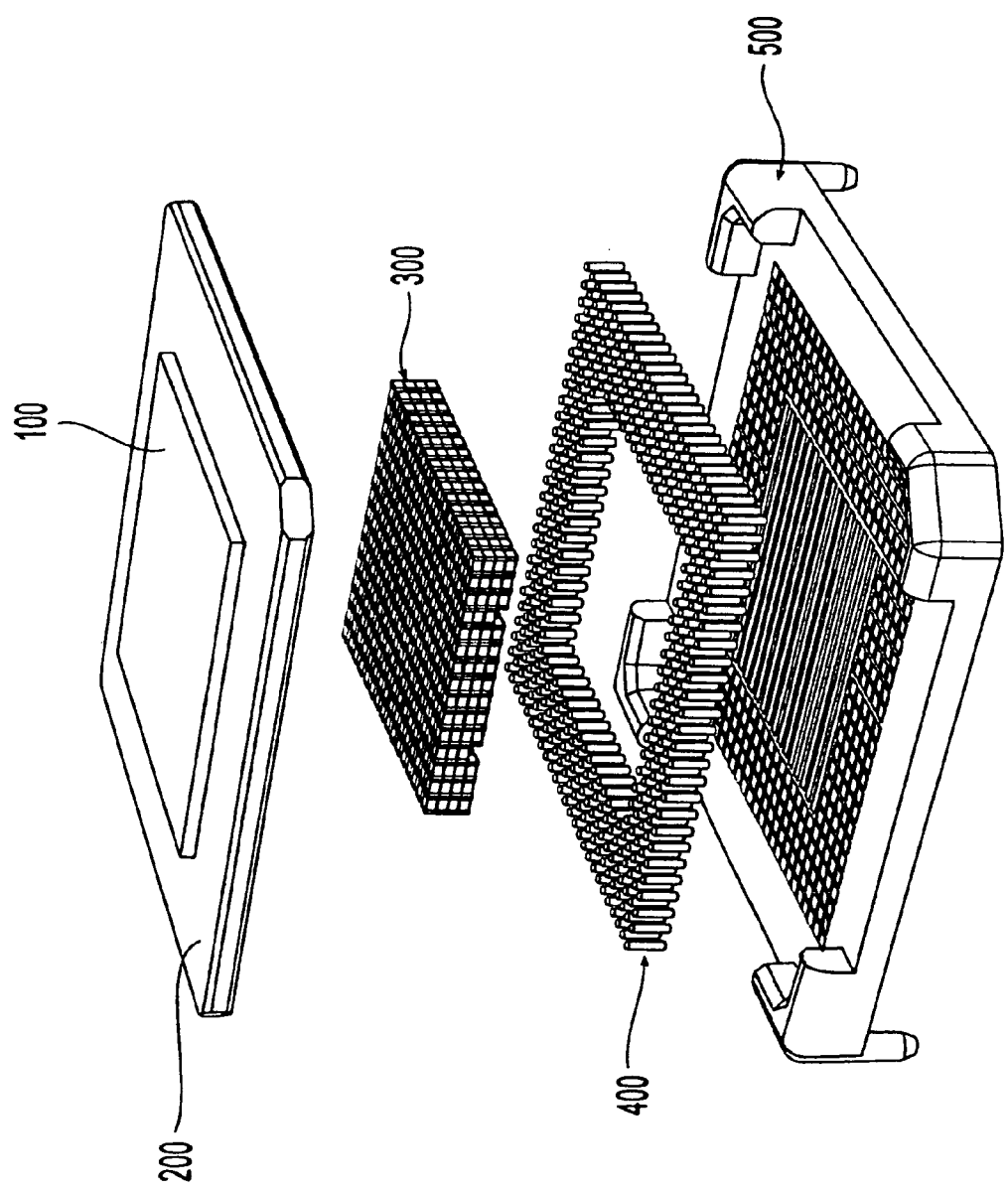
FIG. 3 illustrates an exploded view of a first exemplary embodiment of a device arrangement.

FIG. 3 illustrates an exploded view of a first exemplary embodiment of a device arrangement 10. The arrangement includes an IC chip or die 100, substrate 200, decoupling capacitor block 300, electrically-conductive pins 400, and main body 500. Chip 100 may include semiconductor devices and circuitry embodying, for example, a microprocessor, microcomputer, application specific integrated circuit, digital signal processor, or other IC. Chip 100 mounts to substrate 200 and makes electrical connection thereto using, for example, bumps, a bumpless interface, tape automated bonding, jumpers, or wire bonds. While FIG. 3 illustrates a single chip 100, it should be appreciated that main body 500 may house multiple chips 100.

The substrate 200 includes traces or wiring paths that couple a first set of landing pads on the first side of the substrate to a second set of landing pads on the second side of the substrate. The landing pads on the first side electrically connect to the chip 100, e.g., directly or indirectly using solder, wire bonds, a conductive adhesive, etc. The landing pads on the second side electrically connect to the pins 400 and to the capacitor block 300. Again, this connection may be direct or through a conductive medium, such as solder, a conductive adhesive, or other medium. The density of the first set of landing pads may be greater that the density of the second set.

Figure 4:
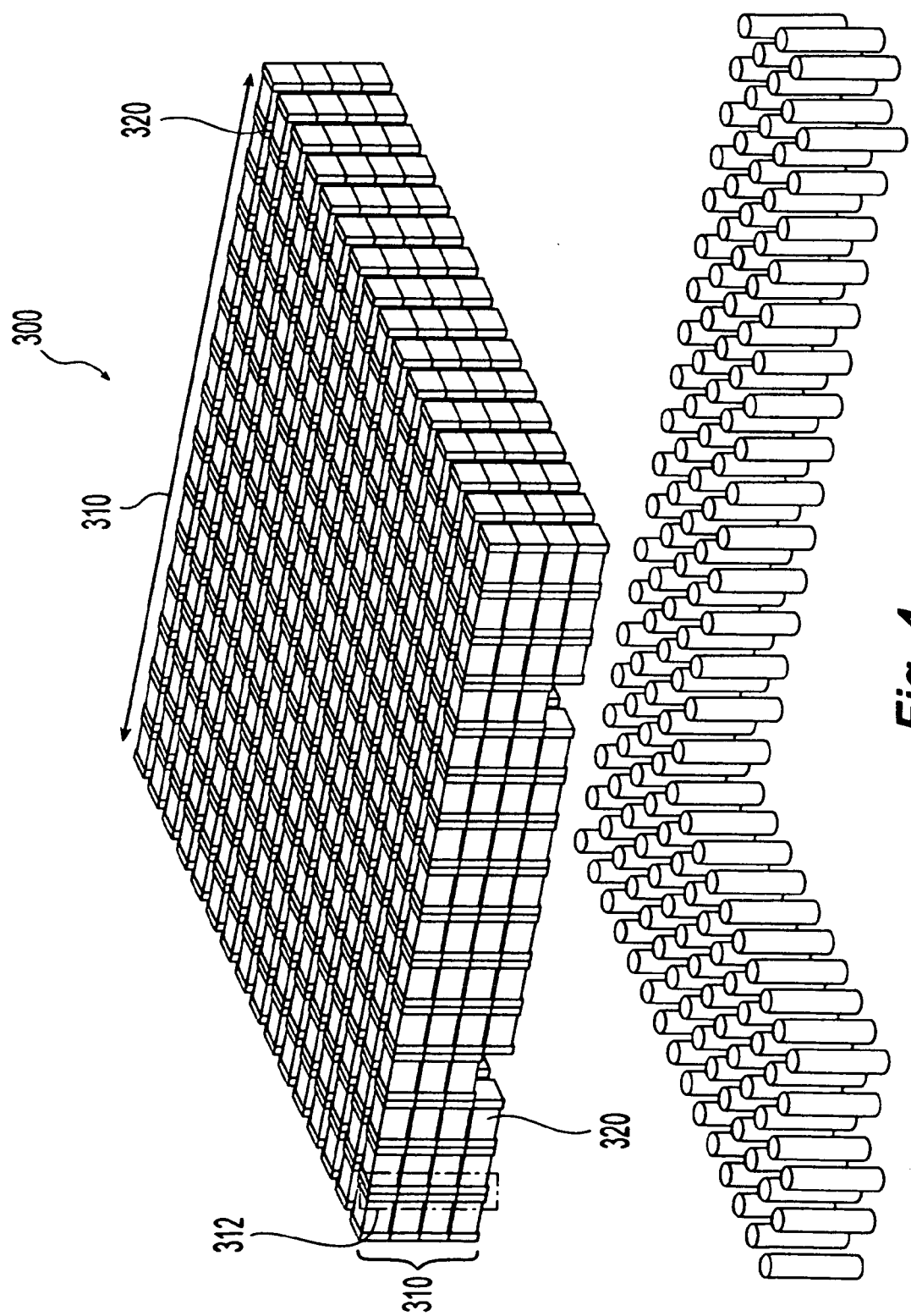
FIG. 4 illustrates a first embodiment of a decoupling capacitor block in accordance with an embodiment of the present invention.

FIG. 4 illustrates a first embodiment of a decoupling capacitor block 300. In this example, block 300 is made up of 16 capacitor blades 310, each blade having 58 individual capacitors 320. This example of block 300 provides 928 capacitors in a 15 mm×15 mm area. Of course, these values are intended as examples and other blocks can vary by the number of blades, the spacing of the blades, the number of capacitors per blade, and the size of the capacitors and blades to achieve a variety of capacitor values and sizes.

Some discrete capacitors are specified according to their length and width dimensions in hundredths of an inch. For example, a capacitor 0.04 inches long and 0.02 inches wide is commonly referred to as an 0402 capacitor. The example illustrated in FIG. 4 uses 0402 capacitors. However, other capacitors, or combinations of capacitors, may be used.

Assuming each of the 0402 capacitors has a capacitance value of 0.22 µF, the total capacitance of the exemplary capacitor block is over 200 µF. The alternating 1 mm grid pattern results in approximately 14 pH of inductance. Of course, these values are intended to be exemplary and other values may be obtained using other arrangements and/or materials.

As shown in FIG. 4, each blade 310 may include multiple capacitors 320 stacked vertically and end-to-end. The capacitors 320 may be coupled together, for example, by soldering together the endcaps, as shown in FIG. 4. Of course, other mechanisms may be used to couple the capacitors together, such as a conductive adhesive, conductive springs, compression bonding, and welding, for example. When coupled together as shown in FIG. 4, the coupled endcaps of capacitors 320 may form multiple conductive paths 312, each extending from the top to the bottom of the blade 310. The conductive paths 312 form pin columns that can connect between the substrate 200 and the PCB on which the IC is mounted. More specifically, the upper portion of the conductive path 312 may connect to the landing pads on the bottom of substrate 200. The connection may be direct, or it may be indirect, for example, using solder, a conductive paste or tape or film, a combination of solder and a trace, or another conductive medium, In addition, the lower portion of the conductive path 312 may connect, either directly or indirectly as above, to landing pads on the PCB to which the IC is mounted.

Figure 5:
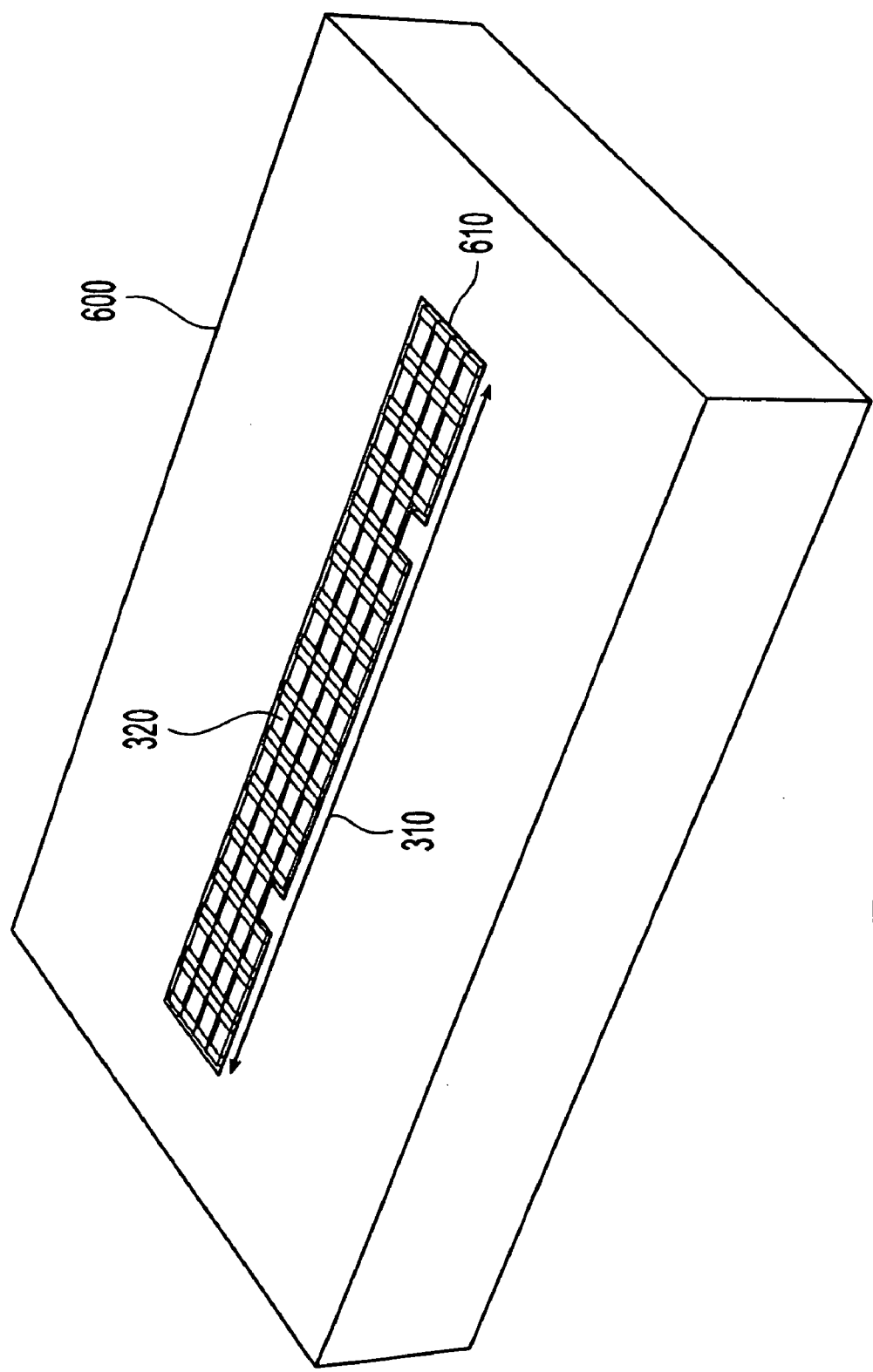
FIGS. 5 and 6 illustrate an example of forming a capacitor blade using a soldering tray.
Figure 6:
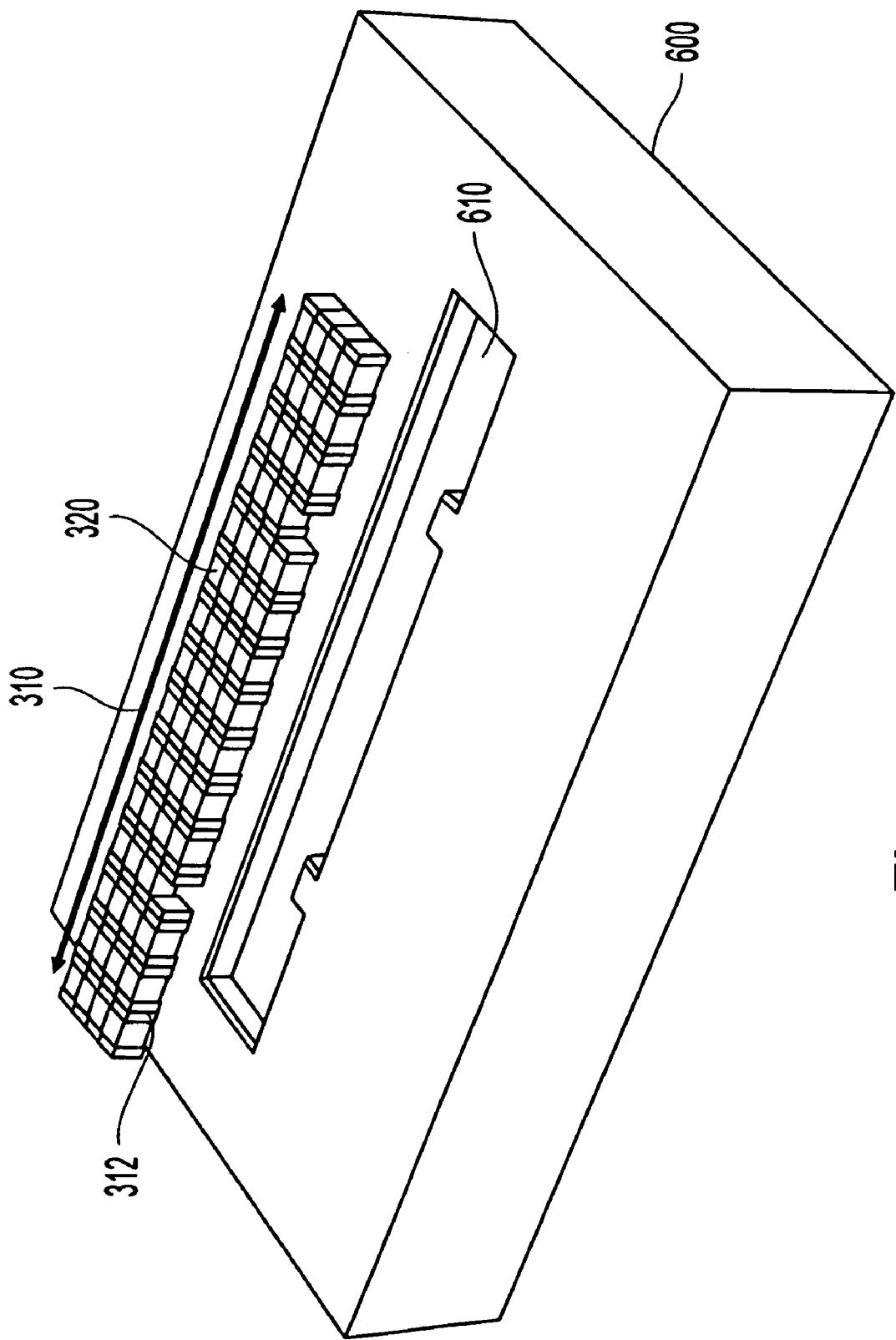

FIGS. 5 and 6 illustrate an example of forming a capacitor blade 310 using a soldering tray 600. The soldering tray can be provided with a shape or form corresponding to the desired shape of the capacitor blade. For example, as shown in FIGS. 5 and 6, the soldering tray 600 includes an indentation 610 shaped like the capacitor blade to be formed. Individual capacitors 320, or smaller groups of capacitors, may be set in the indentation and soldered together. The individual capacitors 320 may be of the same size, but this is not required and it is possible to form the capacitor blade 310 of individual capacitors having more that one size. The tray 600 may be formed of a non-stick material for easy removal of the completed blade. Alternatively, portions of the tray, for example, portions of the indentations contacting the capacitors, may be formed of or coated with a non-stick material. Using the soldering tray 600 for placement, the capacitors 320 may be soldered together to form a capacitor blade 310. For example, the soldering tray may position the capacitors for application of solder and hold the capacitors in place during reflow of the solder. The particular solder paste may have a higher melting point than the solder used to couple components in succeeding steps, e.g., soldering leads or pins to the PCB. The solder may be applied to the capacitors by brushing or with a dispenser, such as a jet-type dispenser. Following reflow, the blade may then be removed from the tray. While FIGS. 5 and 6 illustrate an example of a soldering tray, it should be understood that the capacitor blades may be formed using other arrangements and/or other mechanisms, including other shaping forms or holders.

FIG. 7 illustrates an exemplary arrangement of capacitor blade 310 having alignment notches 314. As shown, the alignment notches 314 may be provided by omitting or removing one or more capacitors 320 from the blade 310 at one or more predetermined location. In the example of FIG. 7, the blade is made up of 15×4 array of capacitors 320, with two capacitors omitted, thus totaling 58 capacitors. It is also possible to remove only a portion of one or more capacitors 320 to form the alignment notches 314. For example, a portion of dielectric material between the endcaps of a capacitor 320 may be removed.

FIG. 8 illustrates an alternative arrangement of a capacitor blade 310 having alignment notches 314. In this example, the alignment notches 314 are formed by using capacitors 320 of different dimensions. More specifically, the blade 310 is made up of a 15×1 array of capacitors 320, with two capacitors 320-1, 320-2 having a different dimension (in this case length) than the other capacitors in the blade. Of course, the different dimension may be width or thickness, or a combination of width, thickness, and length.

Figure 9:
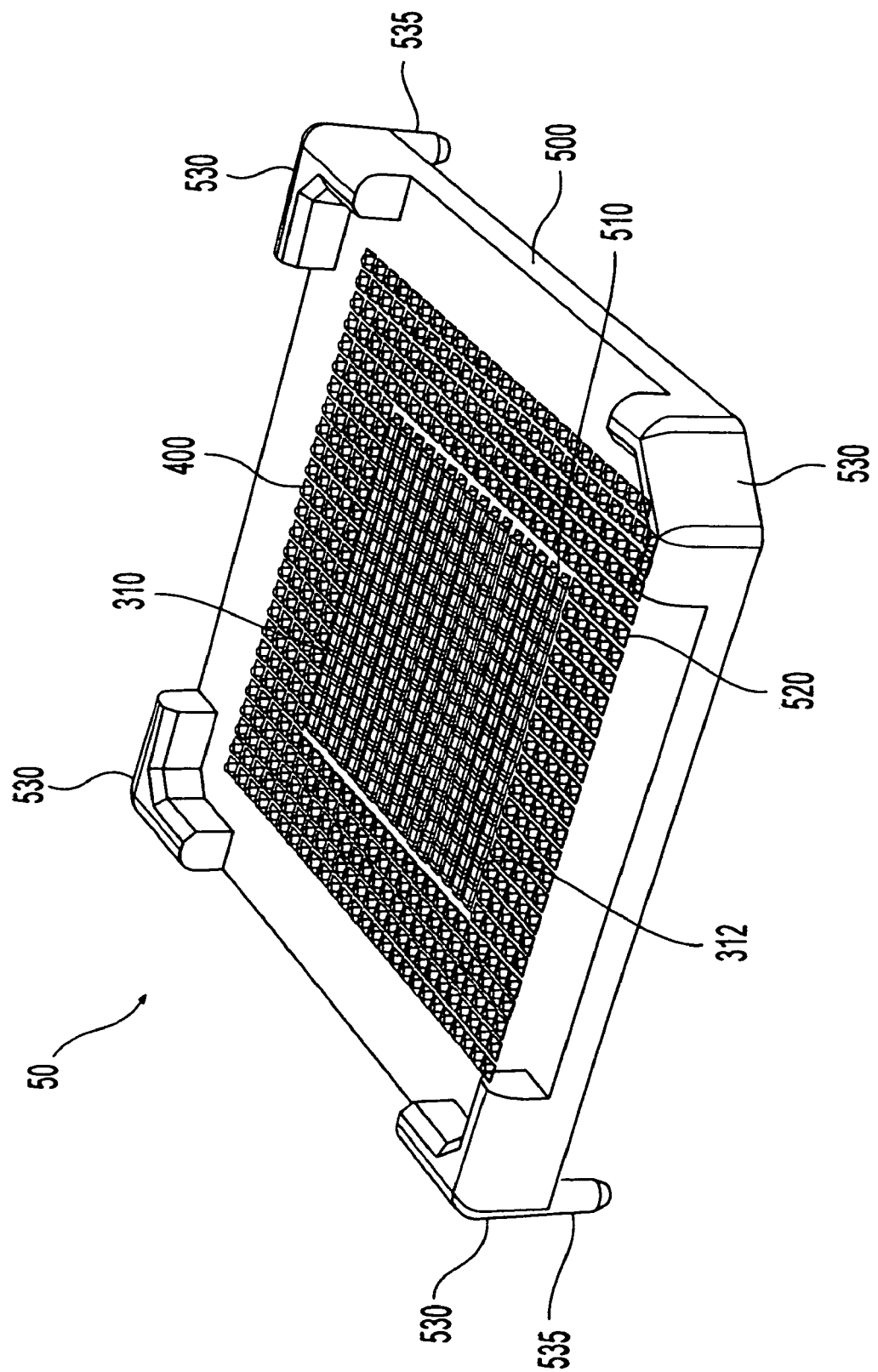
FIG. 9 illustrates an exemplary embodiment of an interposer in accordance with the present invention.

FIG. 9 illustrates an exemplary embodiment of an interposer 50 including an insulating main body 500, signal pins 400, and multiple capacitor blades 310. The term "signal pins" is used to encompass data input/output and control pins as well as power voltage and ground pins. The insulating main body 500 may be molded from a polymer material, for example, a liquid crystal polymer or polytetrafluoroethylene. Portions of the main body 500 may be metallized or plated, for example, to provide electromagnetic interference (EMI) shielding and/or to provide a ground return path for the signal pins and/or act as a ground plane. Main body 500 may include a plurality of trenches 510 for receiving the capacitor blades 310 and a plurality of holes 520 for receiving the signal pins 400. The trenches 510 are linear with a length sufficient to accommodate and position the capacitor blade 310. The holes 520 may be shaped to retain signals pins 400 therein, for example, by friction and/or other mechanical expedients. In the example of FIG. 9, the signal pins 400 surround the capacitor blades 310. However, other arrangements are possible as well. For example, one or more of the capacitor blades may be adjacent to the signal pins, or the pins may be interspersed between one or more blades, or the blades may surround the pins.

In the example of FIG. 9, the pitch or spacing of the capacitors' conductive paths 312 matches that of the signal pins 400. Alternatively, some or all of the paths 312 may have a larger (or smaller) pitch than the signal pins.

The insulating main body 500 may further include corner walls 530 to aid in positioning and retaining the IC chip(s) 100 and substrate 200. The edges of the corner walls may be chamfered to ease insertion of the substrate 200 and chip(s) 100. Moreover, the corner of one of the corner walls 530 may be truncated for alignment of the interposer 50 on a printed circuit board (PCB). In addition, the insulating body may include mounting pegs 535 to stabilize the interposer 50 on a PCB or other substrate and/or to provide polarization features to ensure that the interposer 50 mounts only in a predetermined orientation on the PCB, thereby correctly matching signals between device arrangement 10 and the PCB to which it mounts.

Figure 10:
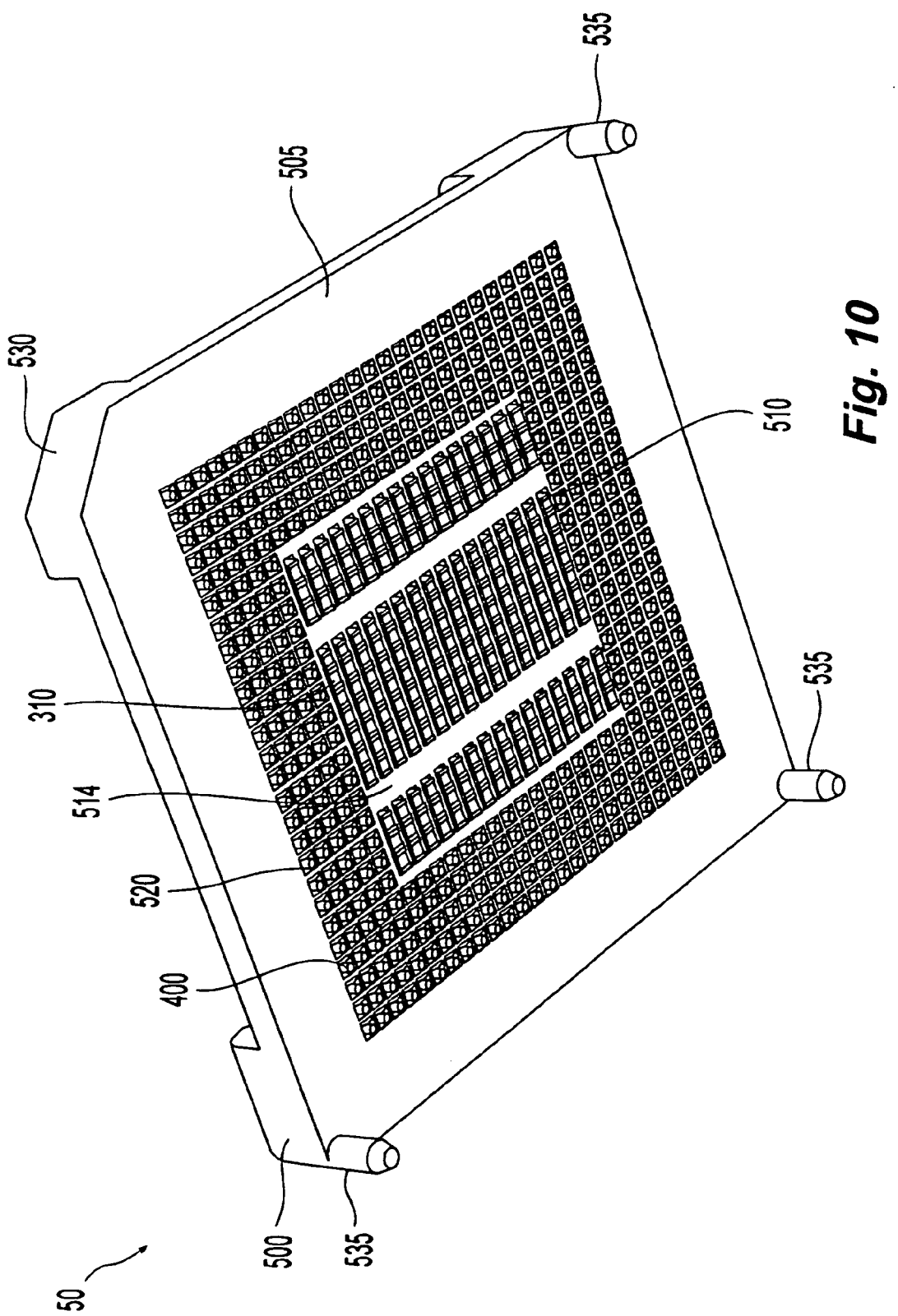
FIG. 10 illustrates a bottom view of the exemplary interposer of FIG. 9.

FIG. 10 illustrates a bottom view of the exemplary interposer 50 of FIG. 9. As shown in FIG. 10, the signal pins 400 and the capacitor blades 310 extend from a bottom surface 505 of the insulating body 500. In the embodiment shown in FIG. 10, the capacitor blades 310 include alignment notches 314 as discussed above in connection with FIG. 7. The notches 314 engage alignment ribs 514 extending across trenches 510. The alignment ribs 514 aid in aligning and retaining the capacitor blades 310. While FIG. 10 shows alignment ribs 514 extending across the capacitor section of the interposer 50, other arrangements are possible as well. For example, while two alignment ribs 514 are shown, a single alignment rib may be provided, or three or more ribs. In addition, the alignment ribs 514 may be provided at the ends of the capacitor blades 310. Further, the alignment ribs 514 may be separated by different widths that key to different capacitor blade 310 configurations. Accordingly, the alignment ribs 514 may not appear as parallel, linear stripes, as shown in FIG. 10. It is also possible for the conductive paths 312 of the capacitor blades 310 to couple to a lead arrangement above and/or below the blades 310 to facilitate electrical connection.

Figure 11:
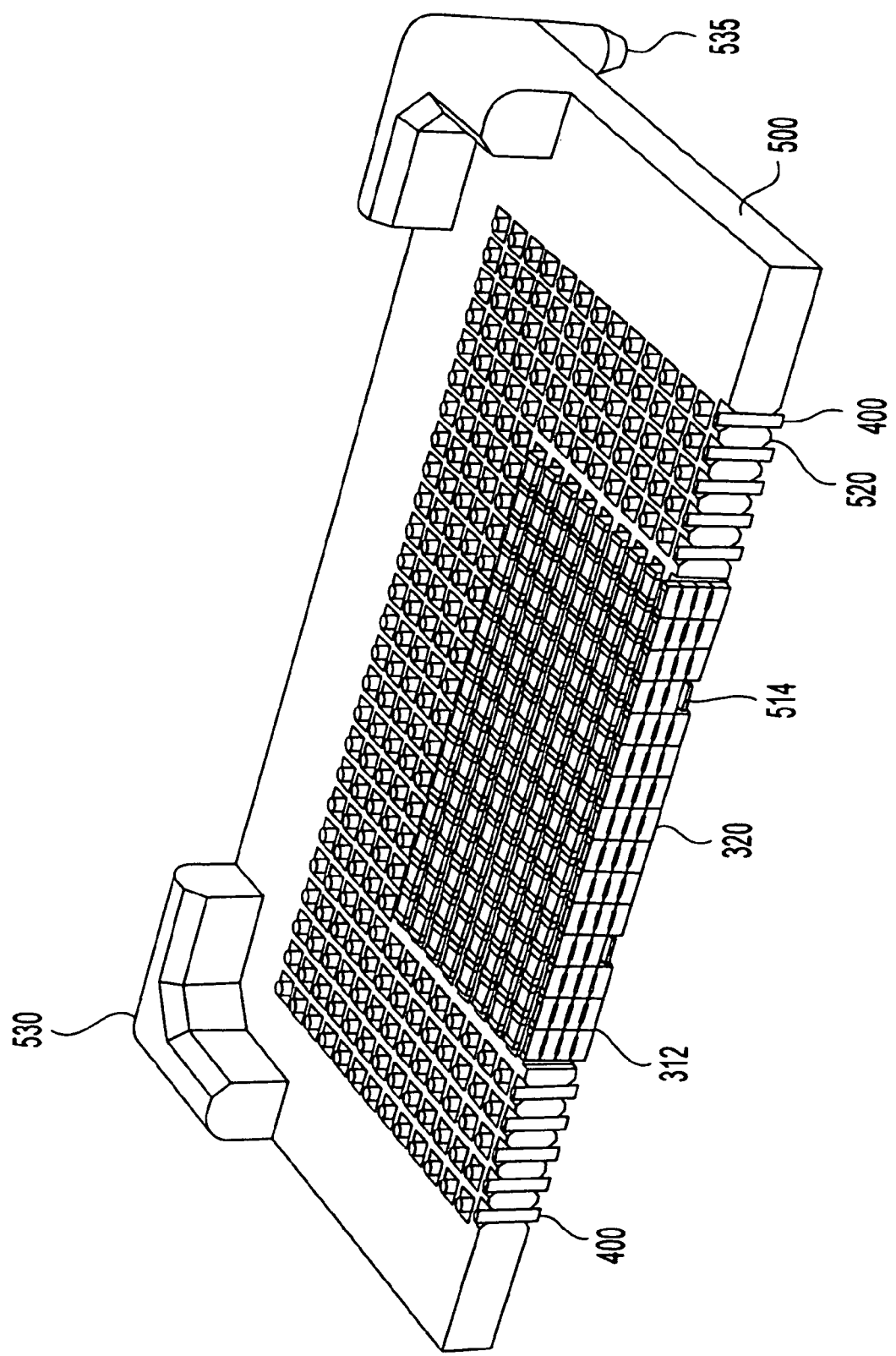
FIG. 11 illustrates a cross section of an interposer in accordance with an embodiment of the present invention. The cross section is taken through one of the capacitor blades.

FIG. 11 illustrates a cross section of an interposer 50. The cross section is taken through one of the capacitor blades 310. The chip or die may mount to a substrate and the substrate may then mount to the interposer 50. Of course, in some embodiments, the chip may mount directly to the interposer 50. In general, the substrate 200 may be made of an insulative material, such as a ceramic or polymer, and may include landing pads on first and second sides thereof and electrically conductive traces between the landing pads, as described above. The landing pads and traces may be used to couple electrical signals (including power and ground voltages as well as information signals) between the chip and the interposer. Landing pads coupled to the chip may be more densely spaced than the landing pads coupled to the signal pins and capacitors. In this case, the traces may spread out from the first side of the substrate to the second side.

In the context of FIG. 11, the landing pads on the substrate may connect to ends of the conductive paths 312 of the capacitor blades 310 and to ends of the pins or conductive elements 400. While not shown, these connections may be made using solder, a conductive paste or another conductive adhesive (such as an anisotropic conductive film), or another conductive medium. The capacitor blade 310 is aligned and retained by alignment ribs 514. The pins 400 are held within the holes 520 in the main body 500. The opposite ends of the conductive paths 312 and pins 400 may connect to landing pads on the PCB, as described above.

Figure 12:
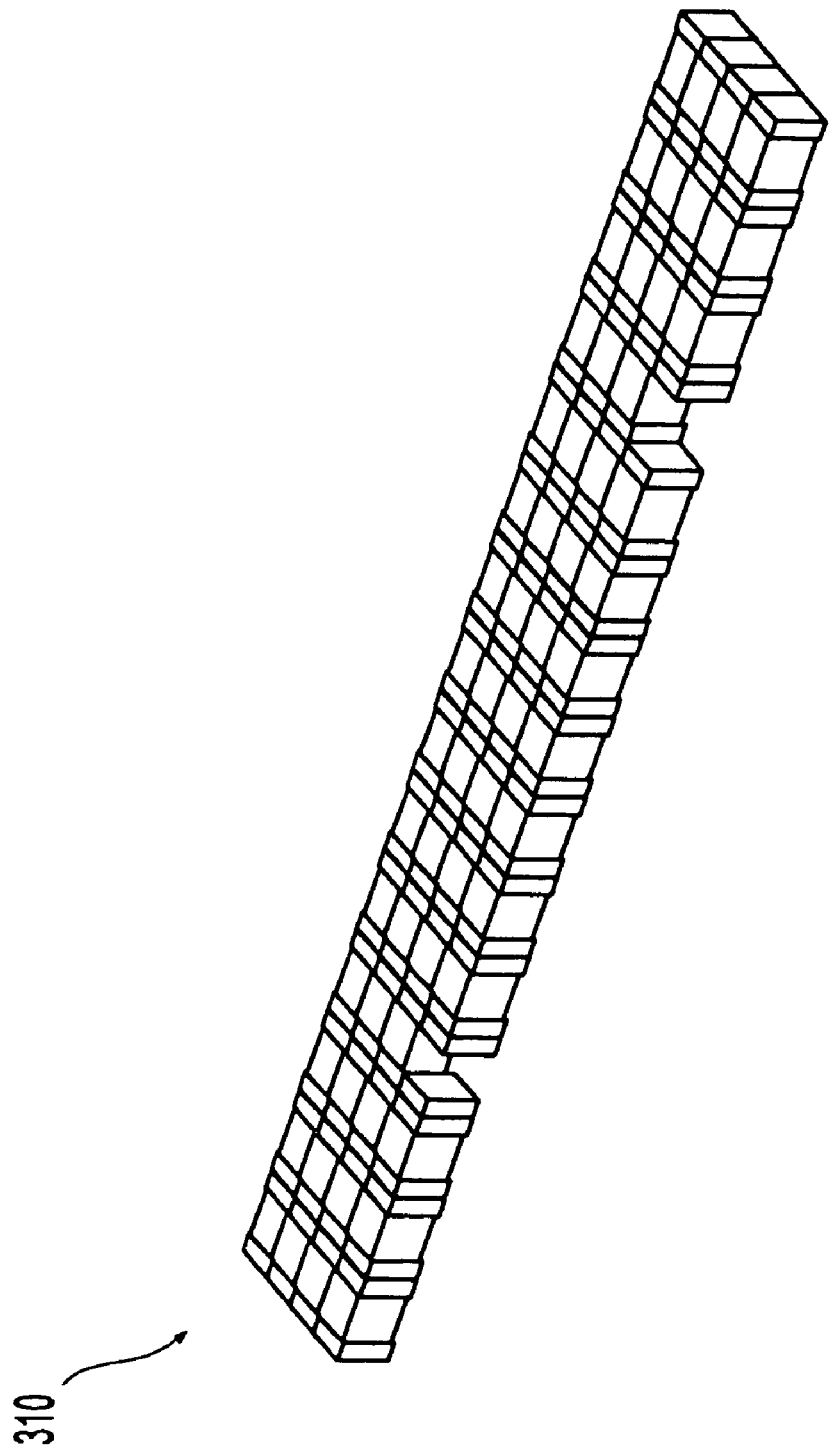
FIG. 12 illustrates the small size of an exemplary capacitor blade.

FIG. 12 illustrates the small size of exemplary capacitor blades 310. The exemplary capacitor blade shown in FIG. 12 has a length of 0.6 in. (15 mm), a height of 0.08 in. (2 mm), and a width of 0.024 in. (0.6 mm). It should be understood that these dimensions are exemplary.

Figure 13:
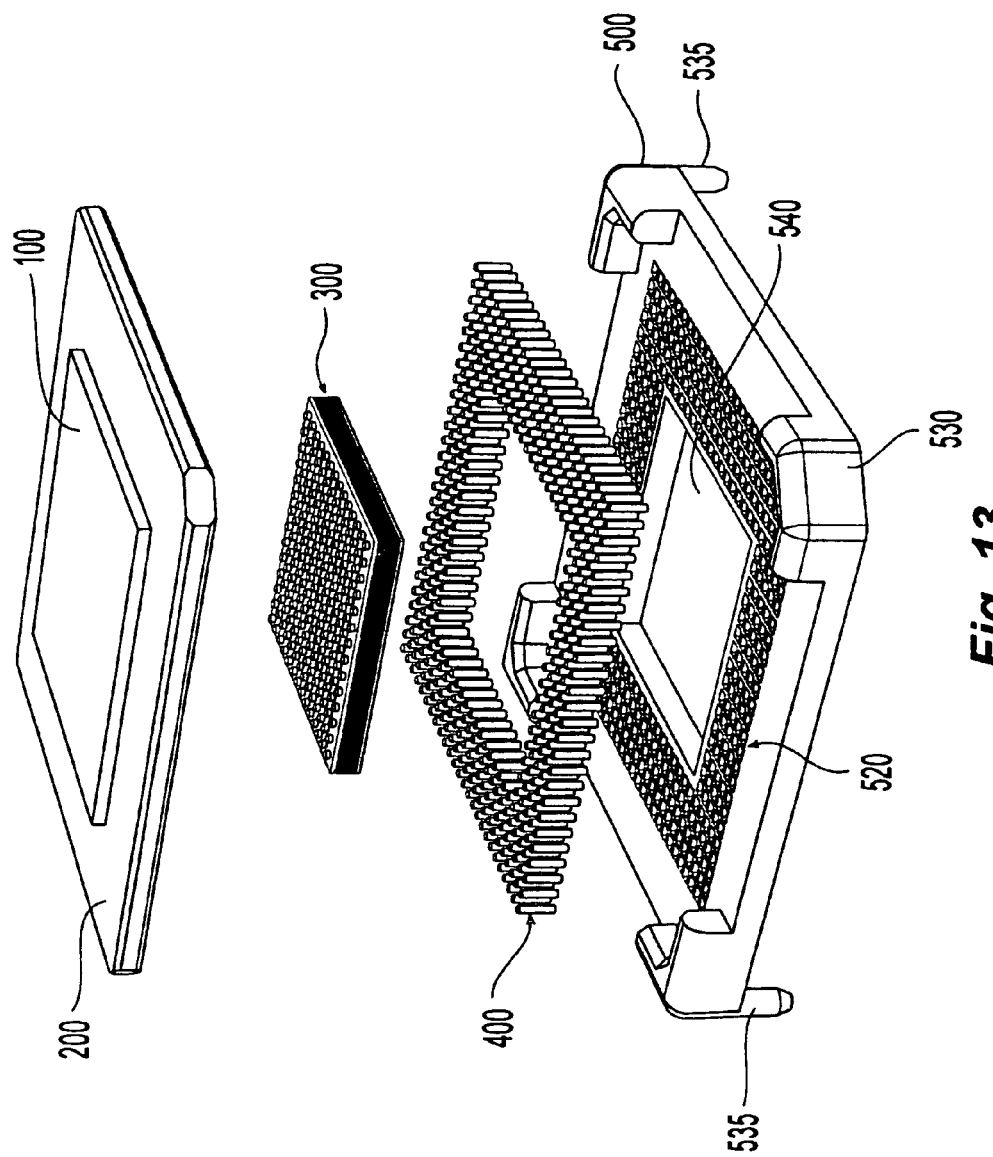
FIG. 13 illustrates a second exemplary embodiment of a device arrangement in accordance with the invention.

FIG. 13 illustrates a second exemplary embodiment of the invention. In accordance with FIG. 13, a chip or die 100 mounts to a substrate 200. The substrate 200 couples to an interposer 50 that can be mounted to a PCB. The interposer 50 includes a unified capacitor module 300, a plurality of signal pins 400, and an insulative main body 500. The signal pins 400 extend through individual holes 520 formed in the main body 500. The main body 500 also includes a hole or window 540 for receiving the capacitor module 300. In this case, the signal pins 400 surround the capacitor module 300.

Figure 14:
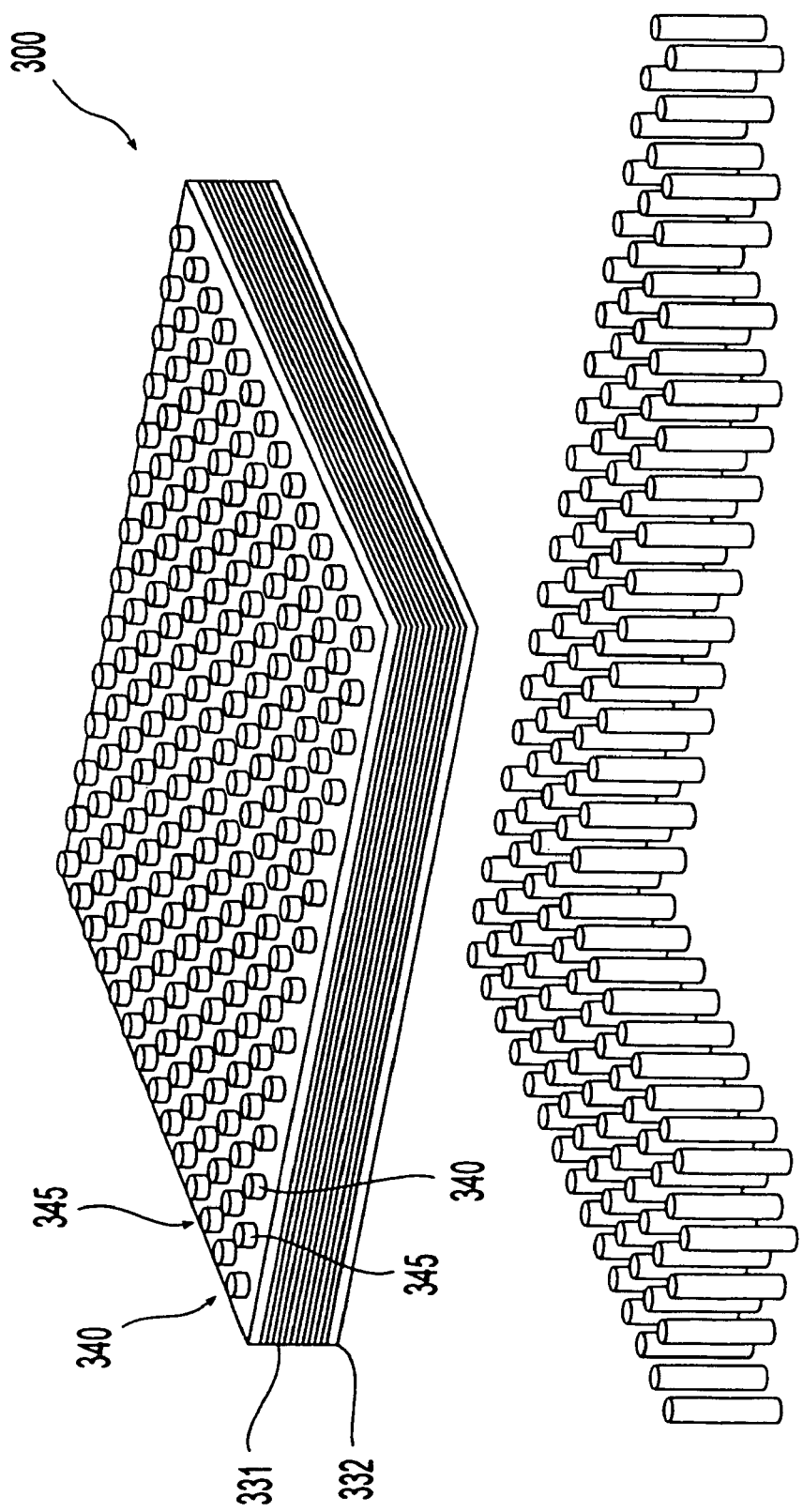
FIG. 14 illustrates the capacitor module of FIG. 13 in greater detail.

FIG. 14 illustrates the capacitor module 300 of FIG. 13 in greater detail. As shown, the module 300 includes a stack of power layers, ground layers insulative layers, and cover layers, which will be described below. Power pins 340 and ground pins 345 running through the stack from a first side 331 to a second side 332. The pins 340, 345 may connect power and ground layers within the module 300 in a checkerboard or other pattern. For example, adjacent pins may alternate between power and ground pins. Capacitance is increased, without a corresponding increase in size, because the need for separate housings for each capacitor is eliminated.

Figure 16:
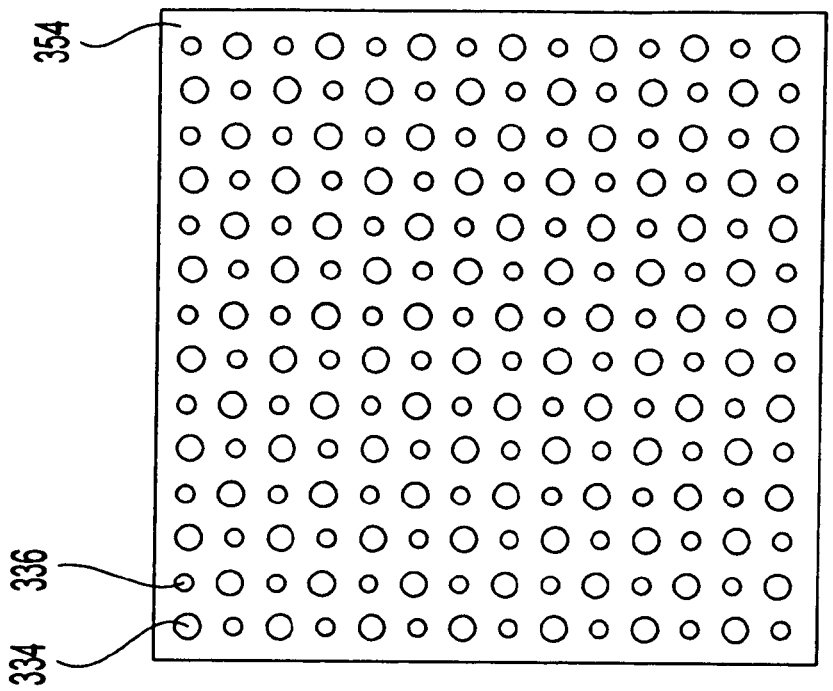
FIG. 16 illustrates an exemplary ground layer of the capacitor module in accordance with an embodiment of the present invention.
Figure 15:
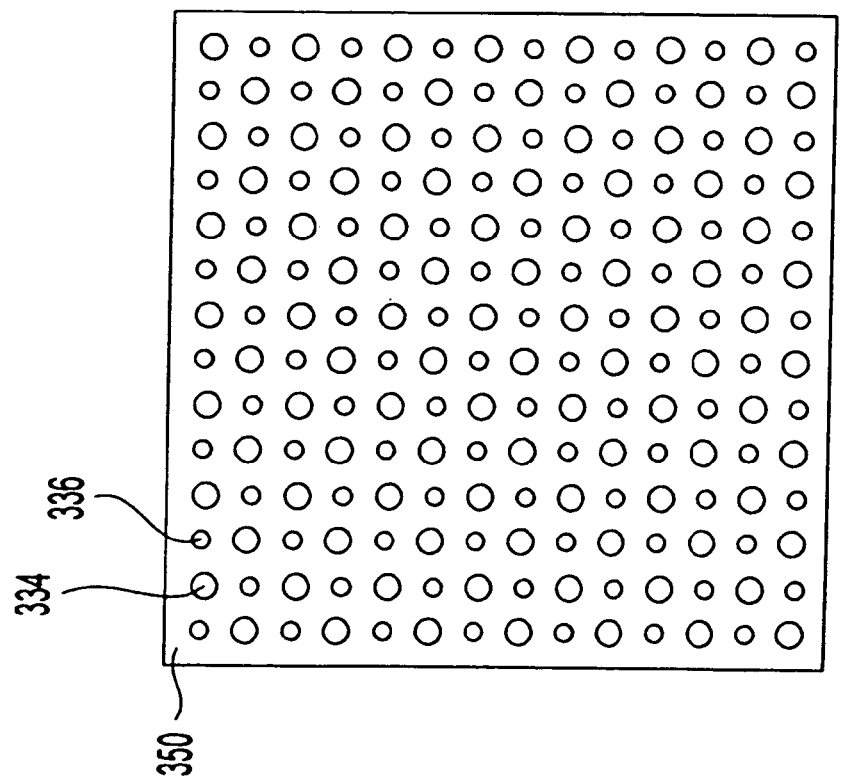
FIG. 15 illustrates an exemplary power layer of the capacitor module in accordance with an embodiment of the present invention.

FIGS. 15 and 16 illustrate an exemplary power layer 350 and an exemplary ground layer 354 of the capacitor module 300. The layers 350, 354 have large holes 334 and small holes 336 that alternate in a checkerboard pattern. The large holes 334 provide clearance to the conductive surface, while small holes 336 provide contact. As above, patterns other than a checkerboard may be used. The pattern of large and small holes in FIG. 15 is opposite of that in FIG. 16. The holes may be sized such that pins 340, 345 extending through the holes contact the small holes 336 but do not touch the large holes 334. For example, the pins may press fit against the small holes. Alternatively, a conductive medium may be provided between a layer and a pin to provide an electrical connection. The large holes may have a diameter close to that of the pins without touching the pins and without experiencing dielectric breakdown given the voltages applied to the capacitive structure. The power and ground layers 350, 354 are made of a conductive material, such as a metal plate or film. Highly conductive metals or metal alloys are best, such as copper or gold. The power and ground layers may be made of entirely of metal or metal alloy, or may comprise one or more metal layers, such as a metal- or metal alloy-coated substrate. The material(s) selected for a particular application may depend on cost, workability, conductivity, durability, and ability to form an electrical connection, among other factors. It should be appreciated that, instead of or in addition to varying the size of the holes 334, 336, the diameter of the pins 340, 345 may be varied to provided the desired contact and clearance pattern.

Figure 18:
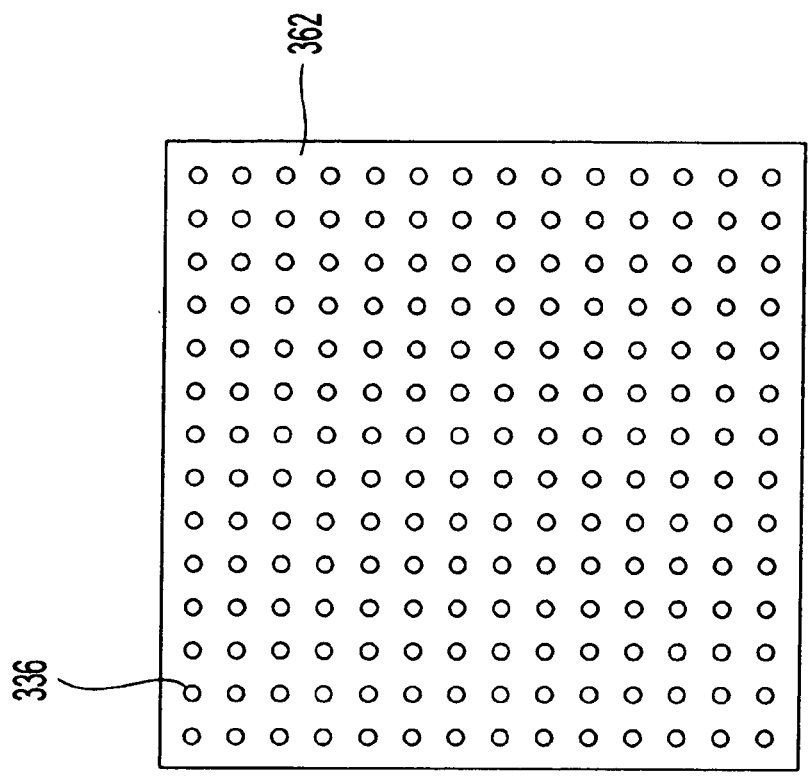
FIG. 18 illustrates an exemplary cover layer of the capacitor module in accordance with an embodiment of the present invention.
Figure 17:
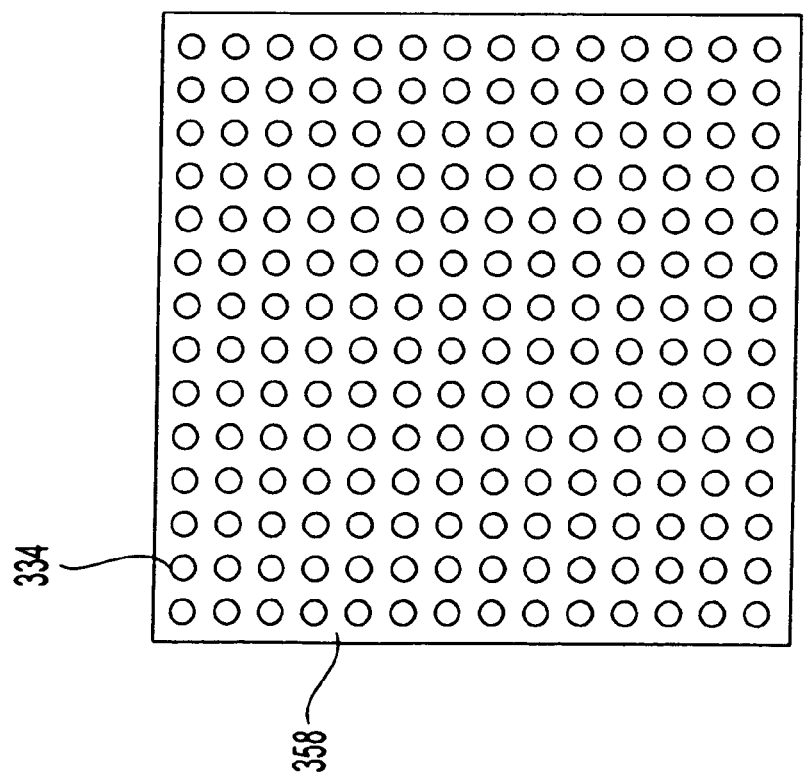
FIG. 17 illustrates an exemplary insulator layer of the capacitor module in accordance with an embodiment of the present invention.

FIGS. 17 and 18 illustrate an exemplary insulator layer 358 and an exemplary cover layer 362 of the capacitor module 300. The insulator layer 358 is made of an insulative material, preferably have high dielectric constant, such as a thin film ceramic, an oxide, or a nitride, and in some applications even air may suffice. The insulative layer 358 may include a grid pattern of large holes 334. However, this is not essential. The holes made in the insulator 358 need only be large enough to receive the pins 340, 345. The cover layer 362 may also be made of an insulative material, such as a plastic, and may include a grid pattern of small holes 332. The cover layers 362 are provided on the outside of the stack and are intended to protect the interior layers of the module 300 from dirt, oxidation, and other factors that could impair the operation of the capacitor module 300. It should be noted that the cover layer may extend over the sides of the capacitor module 300. For example, it may be a coating over the entire module, except for the end portions of the pins.

While the exemplary capacitor module 300 has been described and shown with a checkerboard pattern of holes, other hole patterns are possible as well. For example, an offset pattern of holes may be used wherein the holes of adjacent rows are offset by specified distance. In such a case, the offset may be half the distance between holes. The offset pattern may be provided both in row and column directions. Of course, other offset values and other patterns are possible. In addition, instead of planar layers, the capacitor module 300 may be formed of layers having other shapes, such as cylindrical layers, e.g., with alternating power, insulating, and ground layers. The cylindrical layers may have a circular cross section, an elliptical cross section, or another shape. As a further alternative, the layers may spiral outward. The pins may extend from or along the power and ground layers. Of course, the above are merely intended as examples.

Figure 19:
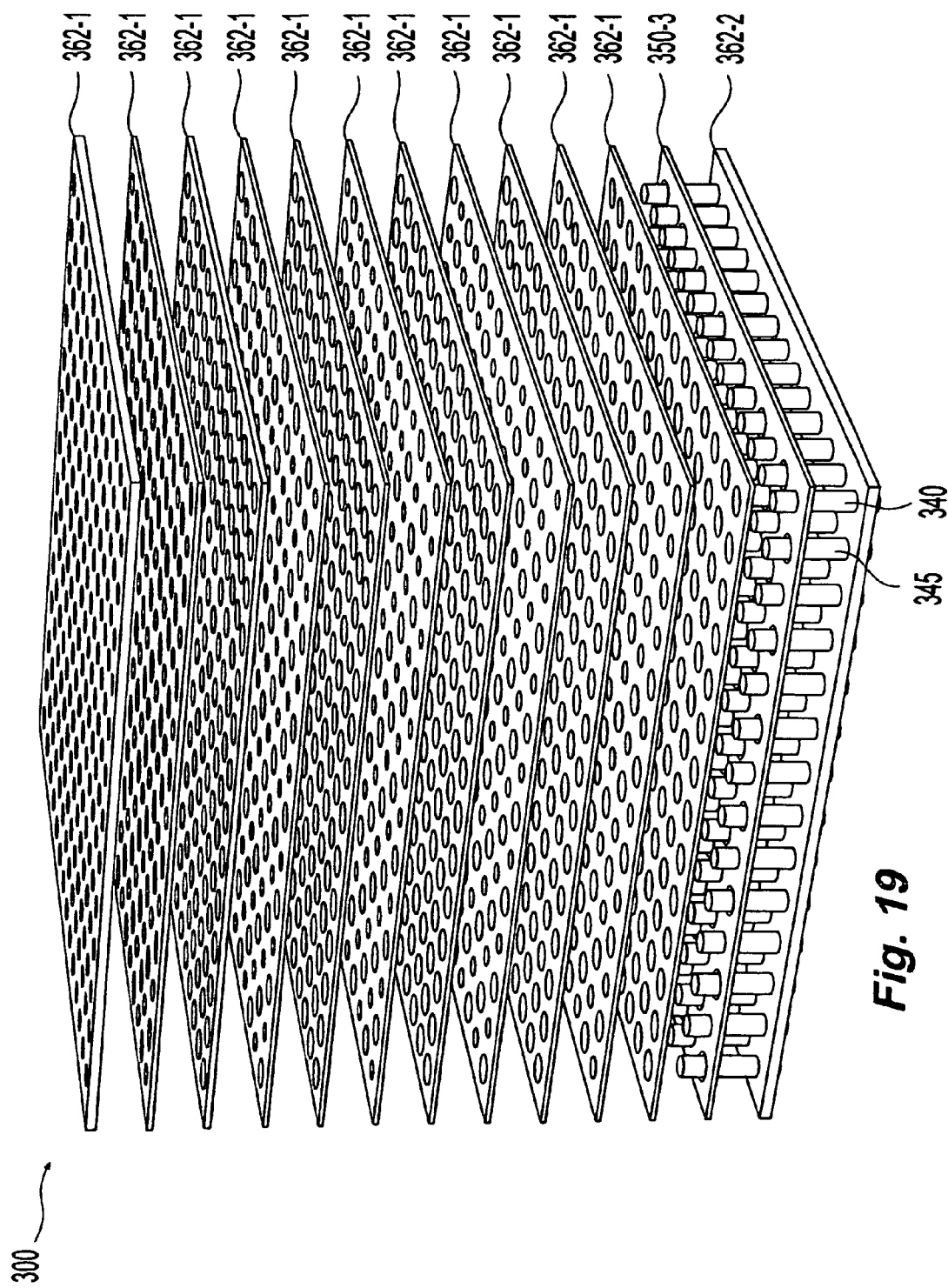
FIG. 19 illustrates an exploded view of the exemplary capacitor module in accordance with an embodiment of the present invention.

FIG. 19 illustrates an exploded view of the exemplary capacitor module 300 using planar layers. In this example, module 300 includes a first cover layer 362-1, a first ground layer 354-1, and first insulative layer 358-1, a first power layer 350-1, and second insulative layer 358-2, a second ground layer 354-2, a third insulative layer 358-3, a second power layer 350-2, a fourth insulative layer 358-4, third ground layer 354-3, a fifth insulative layer 359-5, a third power layer 350-3, and a cover layer 362-2. Pins 340, 345 extend through the aligned holes, contacting either the ground layers 350 or the power layers 354. The example illustrated in FIG. 19 includes three ground layers 354 and three power layers 350. However, it should be understood that another number of ground and/or power layers may be provided, for example, to increase or decrease capacitance value. Increasing the number of layers, forming the insulating layers of material with increased dielectric constant, and reducing the thickness of the insulating layers will each increase the capacitance of the capacitor module 300.

Figure 20:
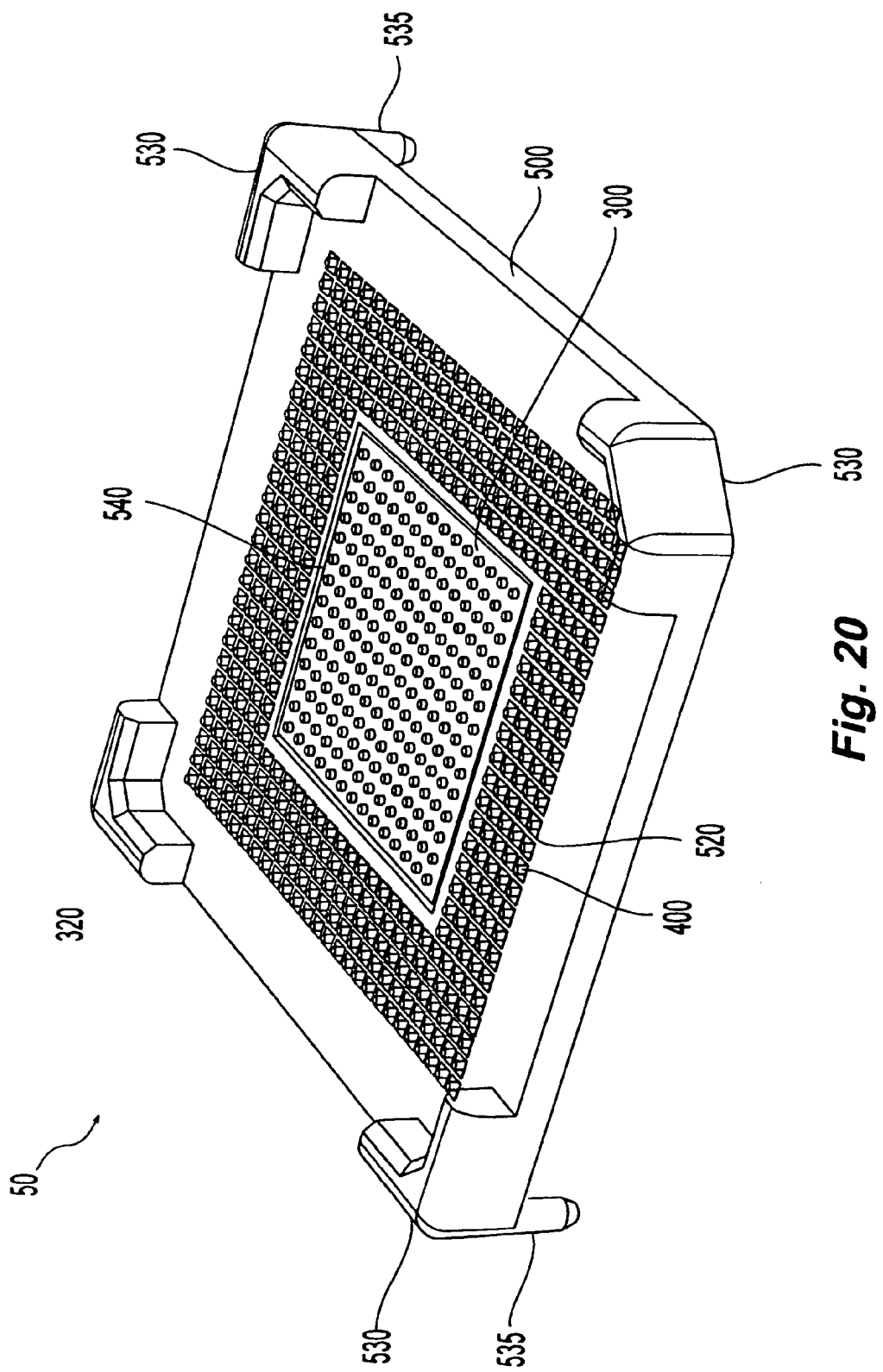
FIG. 20 illustrates a further exemplary embodiment of the interposer in accordance with an embodiment of the present invention.

FIG. 20 illustrates an exemplary embodiment of the interposer 50. As noted above, the interposer includes an insulative main body 500 with holes 520 to receive the signal pins 400 and a window 540 for receiving the capacitor module 300. The window 540 may be through the approximate center of the main body 500 as shown in FIG. 20, or located elsewhere. Hold down pegs 535 for engaging a PCB may extend from the bottom surface of the main body 500 near the corners. The pegs 535 may function both for polarization as well as for stabilizing the interposer relative to the PCB. The edges of the corner walls 530 may be chamfered to ease insertion of the chip 100 and substrate 200.

Figure 21:
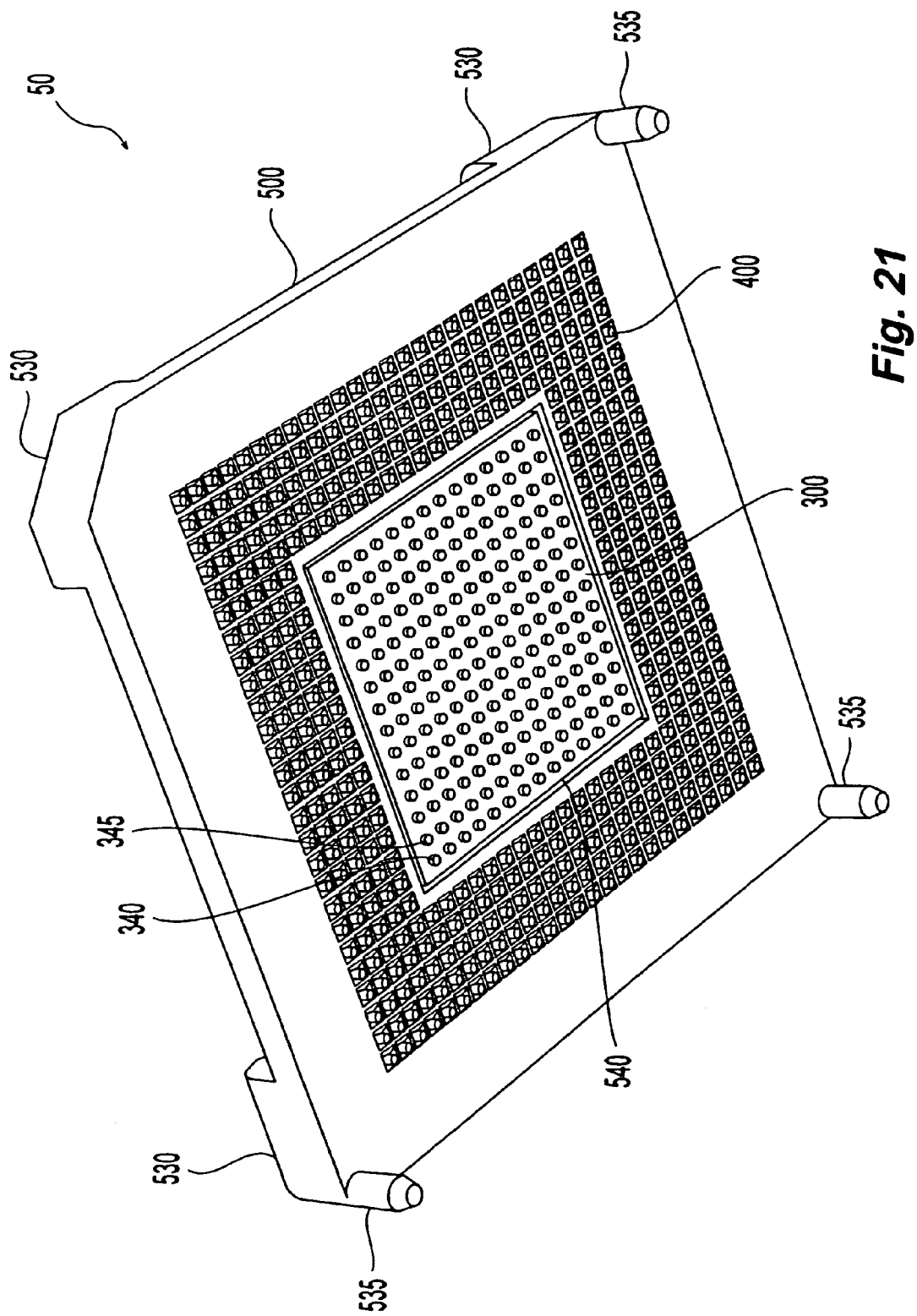
FIG. 21 illustrates a bottom surface of the exemplary interposer of FIG. 20.

FIG. 21 illustrates a bottom surface of the exemplary interposer of FIG. 20. As shown in FIG. 21, three mounting pegs 535 may be provided at the corners of the bottom surface for alignment, polarization and mounting stabilization to the PCB. FIG. 21 also shows the signal pins 400 and the capacitor module pins 340, 345 extending from the bottom surface of the main body 500. As shown in FIG. 21, the pitch of the capacitor module pins 340, 345 may be the same as the pitch of the signal pins 400. However, in alternative arrangements, the module pins may have a larger pitch than the signal pins, or a smaller pitch. The ends of the signal pins 400 and the capacitor module pins 340, 345 can connect to landing pads on a surface of the PCB, for example, to form a surface-mount connection. If a multi-layer circuit board is provided, the length of the pins 340, 345, 400 may be vary depending on the required depth for connection to the appropriate layer of the circuit board. For example, in some multi-layer circuit embodiments, some or all of the signal and/or capacitor module pins can extend into vias or unplated holes formed in the circuit board.

Figure 22:
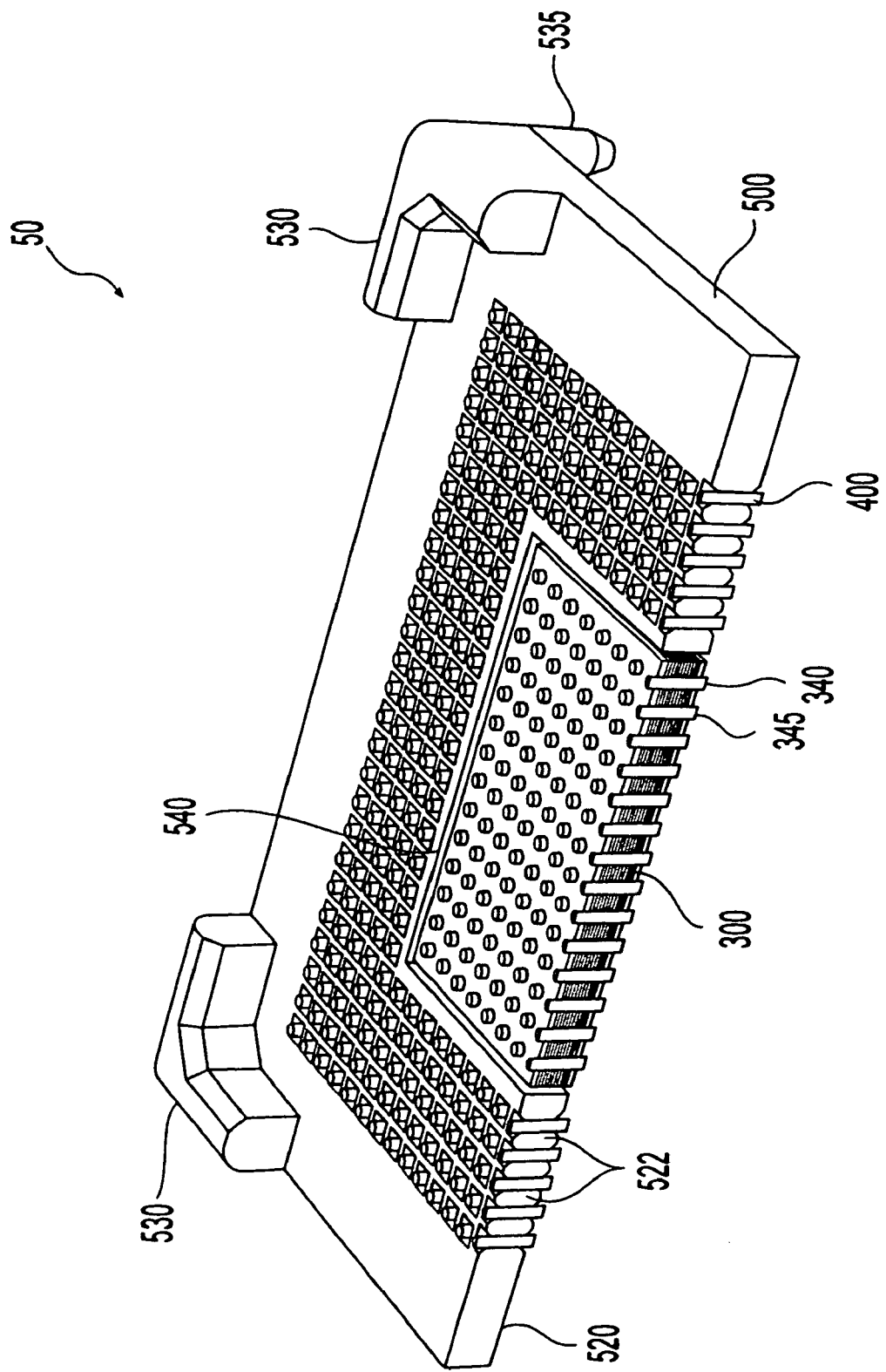
FIG. 22 illustrates a cross section of the exemplary interposer in accordance with an embodiment of the present invention.

FIG. 22 illustrates a cross section of the interposer 50 with capacitor module 300. The cross section is taken through one of the rows of pins 340, 345 of the capacitor module 300. As shown in FIG. 22, the capacitor module 300 is positioned in window 540. The capacitor module 300 may be secured to the main body 500 using an adhesive and/or one or more ledges or seats formed at the periphery of window 540. Alternatively, the capacitor module 300 may be molded into or insert-molded into the main body 500. FIG. 22 further shows that holes 520 through main body 50 can include funnels or chamfers 522 at top and/or bottom portions. The funnels or chamfers 522 can be used to guide pins 400 through the holes 520, in the event that the pins 400 are inserted. In addition, the funnels or chamfers 522 may provide a reservoir for solder or other conductive material used in connecting the pins 400 to the body 500 or to a PCB or other substrate, if appropriate for the arrangement employed. It should be noted that the main body 500 may be molded around pins 400.

Figure 23:
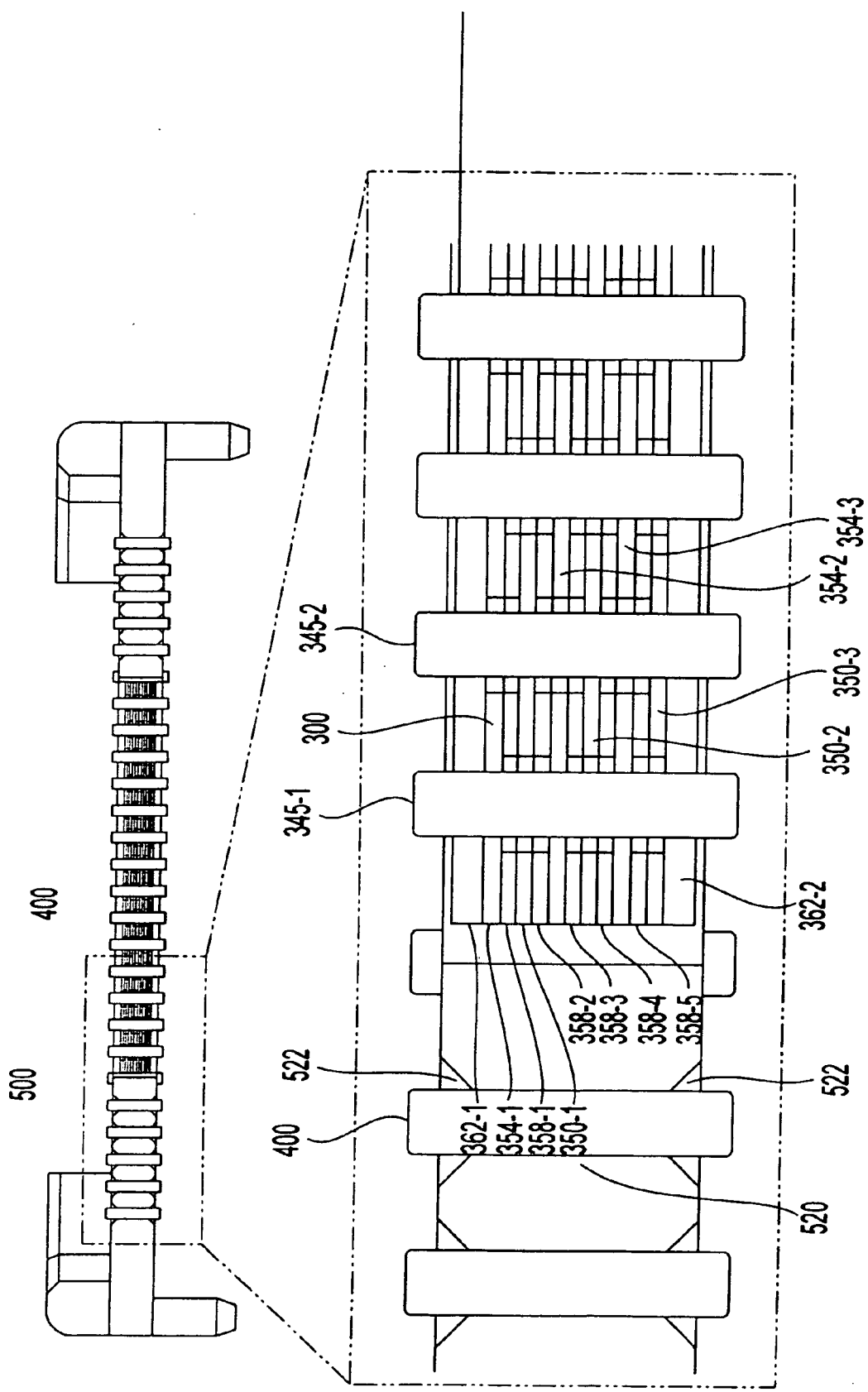
FIG. 23 illustrates a magnified cross section of the exemplary interposer showing the pin and layer structure of the exemplary capacitor module.

FIG. 23 illustrates a magnified cross section of the interposer 50 with capacitor module 300, showing the pin and layer structure of the exemplary capacitor module 300. For example, pin 345-1 is coupled to the first and second cover layers 362-1, 362-2 and electrically and connected to the first, second and third ground layers 354-1, 354-2, 354-3, but spaced from the insulator layers 358-1 through 358-5 and the power layers 350-1 through 350-3. Pin 340-2, on the other hand, is coupled to the first and second cover layers 362-1, 362-2 and electrically and connected to the first, second, and third power layers 350-1, 350-2, 350-3 and is spaced from the insulator layers 358-1 through 358-5 and the ground layers 354-1 through 354-3. Thus, pin 345-1 is a ground pin and pin 340-2 is a power pin. As noted above, the first and second cover layers 362 are preferably insulating, such as ceramic, a polymer, or other insulating material.

Figure 25:
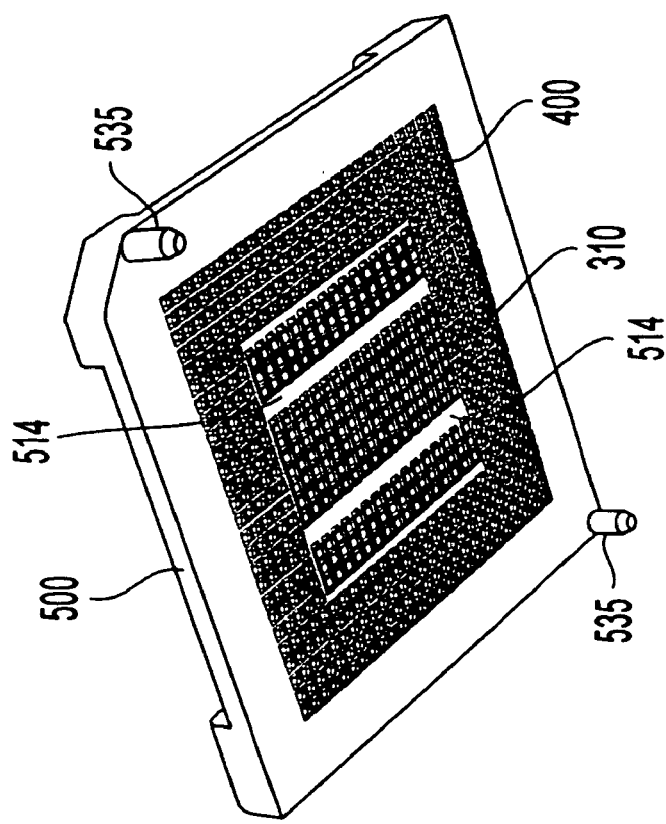
FIGS. 24 and 25 illustrate further exemplary embodiments of the interposer in accordance with an embodiment of the present invention.
Figure 24:
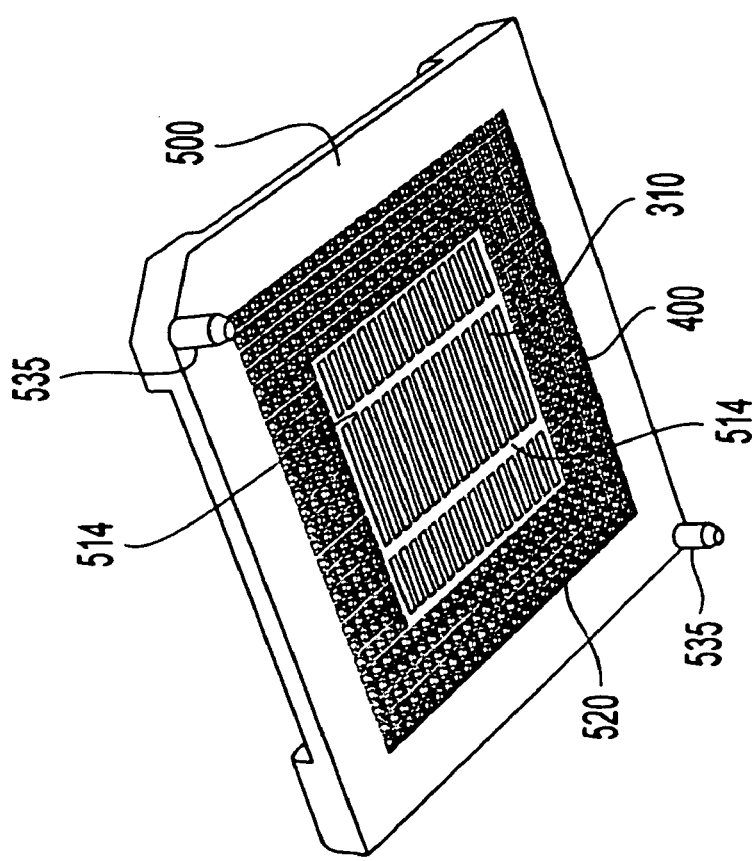

FIGS. 24 and 25 illustrate further exemplary embodiments of the interposer 50. In accordance with FIGS. 24 and 25, two mounting pegs 535 may be provided. One or both of the pegs 535 may be molded into different unique positions and/or have different diameters and/or shapes to provide multiple polarization and keying options. For example, a peg 535 may be located in "left" position as shown in FIG. 24 or a "right" position as shown in FIG. 25. The position of the pegs 535 may code to the particular chip(s) 100 mounted to the interposer 50. For example, one chip 100 may code to the left position of the mounting peg 535 and another, different chip may code to the right position of peg 535. Further, the pegs 535 may include retention features, such as hooks, shoulders, nubs, etc., to assist retention to a PCB or other substrate.

Figure 26:
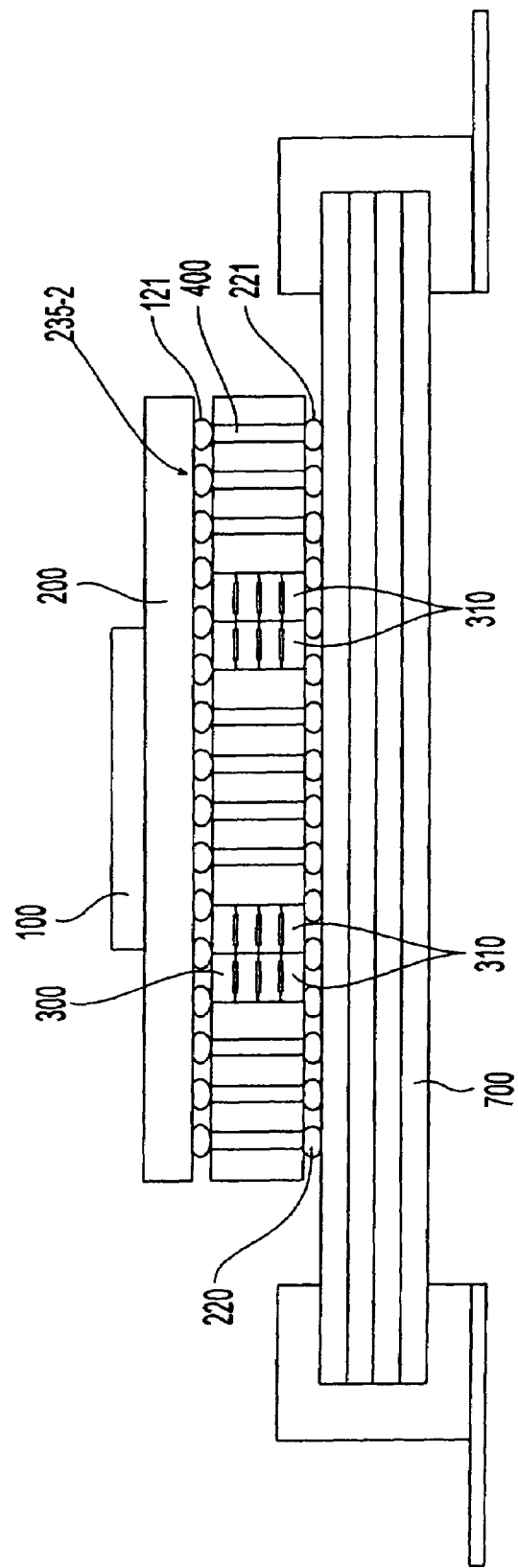
FIG. 26 illustrates a further exemplary embodiment of a device arrangement in accordance with an embodiment of the present invention.

FIG. 26 illustrates a further exemplary embodiment of an interposer 50. In accordance with FIG. 26, a set of pins 400 are located between two sets of capacitor blades 310. Bumps 121 (such as solder bumps) may be used to connect between the pins 400 and conductive paths 312 of the capacitor blades on the one hand and the landing pads 235-2 of the substrate 200 on the other hand. In addition, bumps 221 may be used to connect between the pins 400 and conductive paths 312 of the capacitor blades on the one hand and the landing pads of the PCB 700 on the other hand. Of course, another conductive medium or a direct connection may be used instead of bumps 121, 221. In this example, each set of blades 310 may extend across the entire length of the pin field 400 (i.e., in a direction into the drawing page). However, this is not necessary. One or more of the blades 310 may extend only partially across the length of the pin field 400, for example, a length similar to that shown in FIG. 3, so that the pins 400 surround such blades 310. Alternatively, ends of one or more the blades 310 may be provided at or just inside of the periphery of the interposer, so that the pins 400 are between capacitor blades 310. Such an arrangement permits the power and/or ground voltage supplies to connect through the capacitor blades near the periphery of the interposer.

While this exemplary embodiment is illustrated with capacitor blades 310, it should be understood that the capacitor blades 310 may be replaced by two capacitor modules 300. The exemplary embodiments of the capacitor block or module 300 described above may be integrated or incorporated into the interposer 50.

Figure 27:
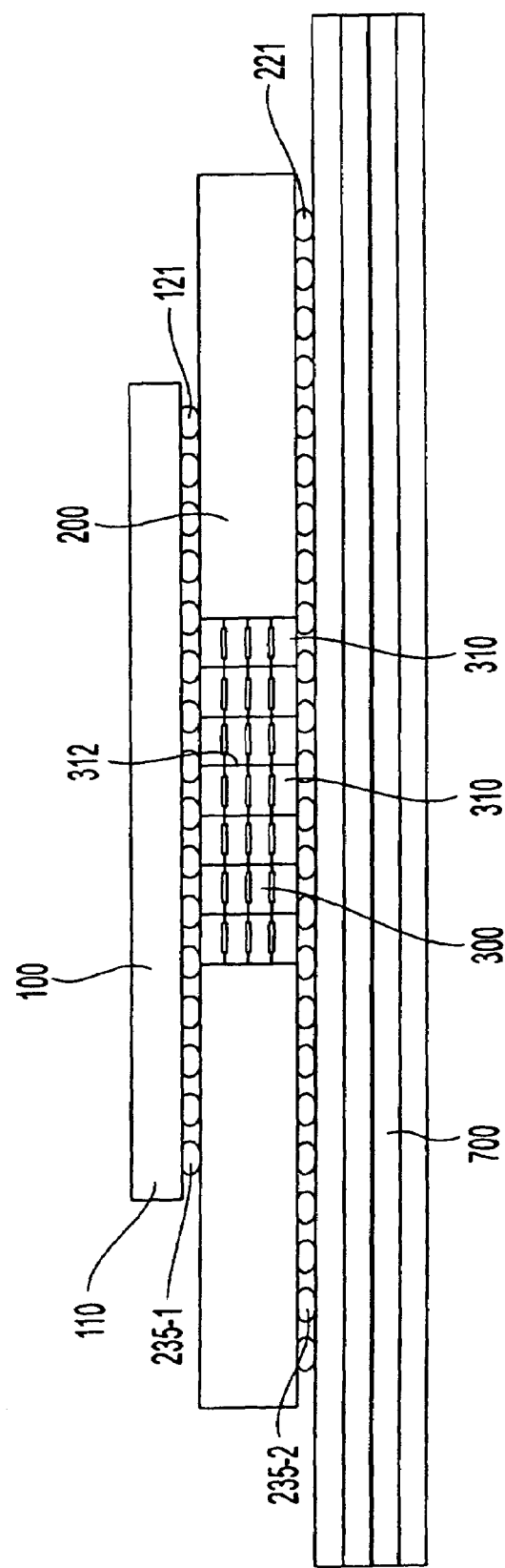
FIG. 27 illustrates a further exemplary embodiment of a device arrangement in accordance with an embodiment of the present invention.

FIG. 27 illustrates a further exemplary embodiment in which the capacitor block or module 300 is provided in the substrate 200 rather than the interposer 50. While the embodiment will be described using the capacitor blades 310 as an example, it should be appreciated that the capacitor module 300 may be used in addition or instead of the capacitor blades 310. As shown in FIG. 27, conductive bumps 121, for example solder bumps, may connect features 110 on the chip 100 both to features 235-1 on the substrate and to the conductive paths 312 of the capacitor blades 310. In addition, bumps 221 may connect features 235-2 on the substrate 200 and on the conductive paths 312 of the capacitor blades 310 to features on the PCB 700. The features 110, 235-1, 235-2 may be landing pads or other features. Moreover, another conductive medium (e.g., conductive adhesive, anisotropic conductive film, a bumpless technology), or a direct connection, may be used instead of the bumps 121, 221. According to this embodiment, the interposer may be omitted if desired. Alternatively, the substrate 200 and the capacitor blades 310 may be connected to an interposer.

Figure 28:
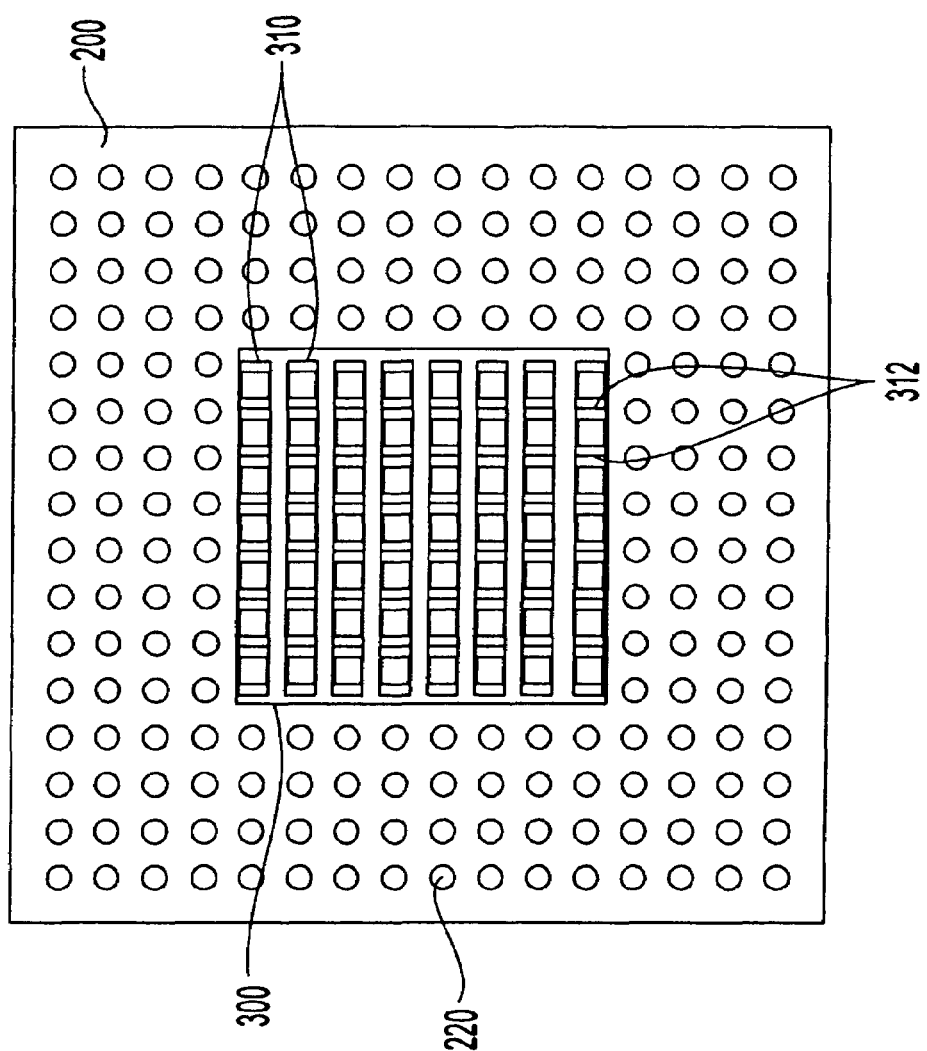
FIG. 28 illustrates the exemplary embodiment of FIG. 27 as view from above with the chip removed.

FIG. 28 illustrates the exemplary embodiment of the substrate 200 shown in FIG. 27 from below. As shown, multiple capacitor blades 310 are aligned in the substrate 200. The blades 310 may be secured to the substrate 200 using one or more of several techniques, such as alignment ribs, clips, a tray, tabs, ultrasonic welding, and/or adhesives.

Figure 29:
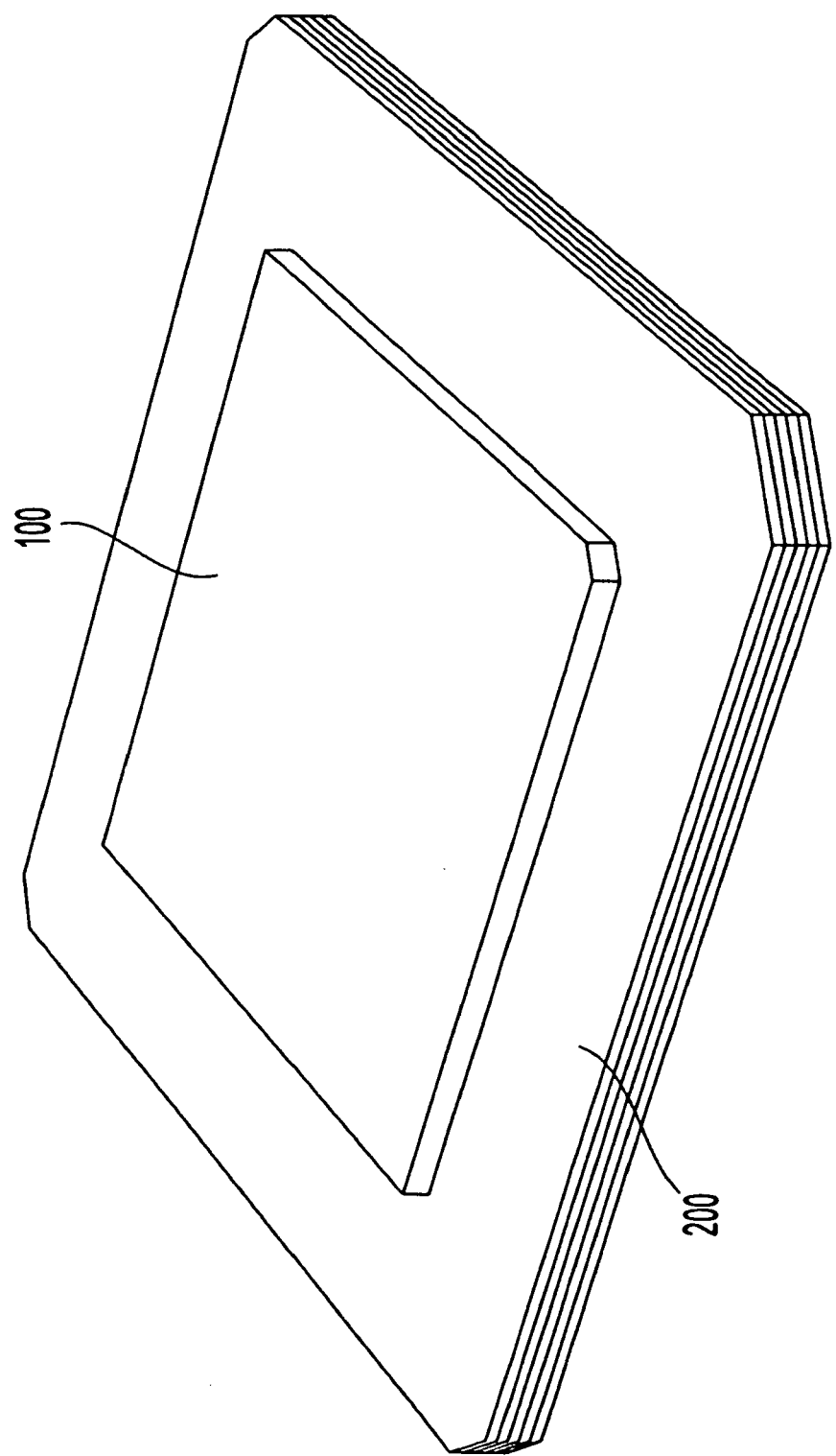
FIG. 29 illustrates a further exemplary embodiment of a substrate with a chip or die mounted thereto.
Figure 30:
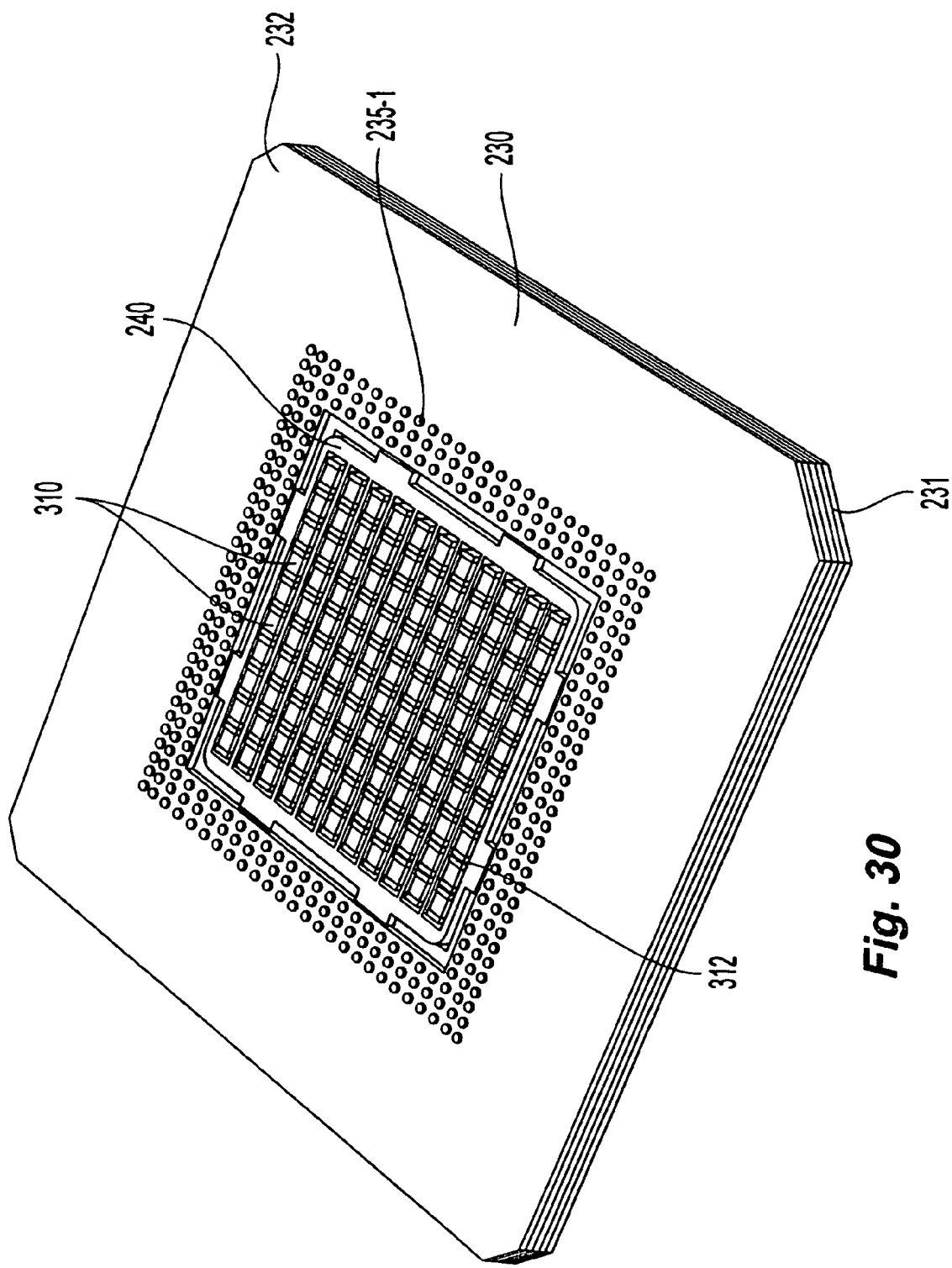
FIG. 30 illustrates an exemplary embodiment of the substrate shown in FIG. 29 with the chip removed.
Figure 31:
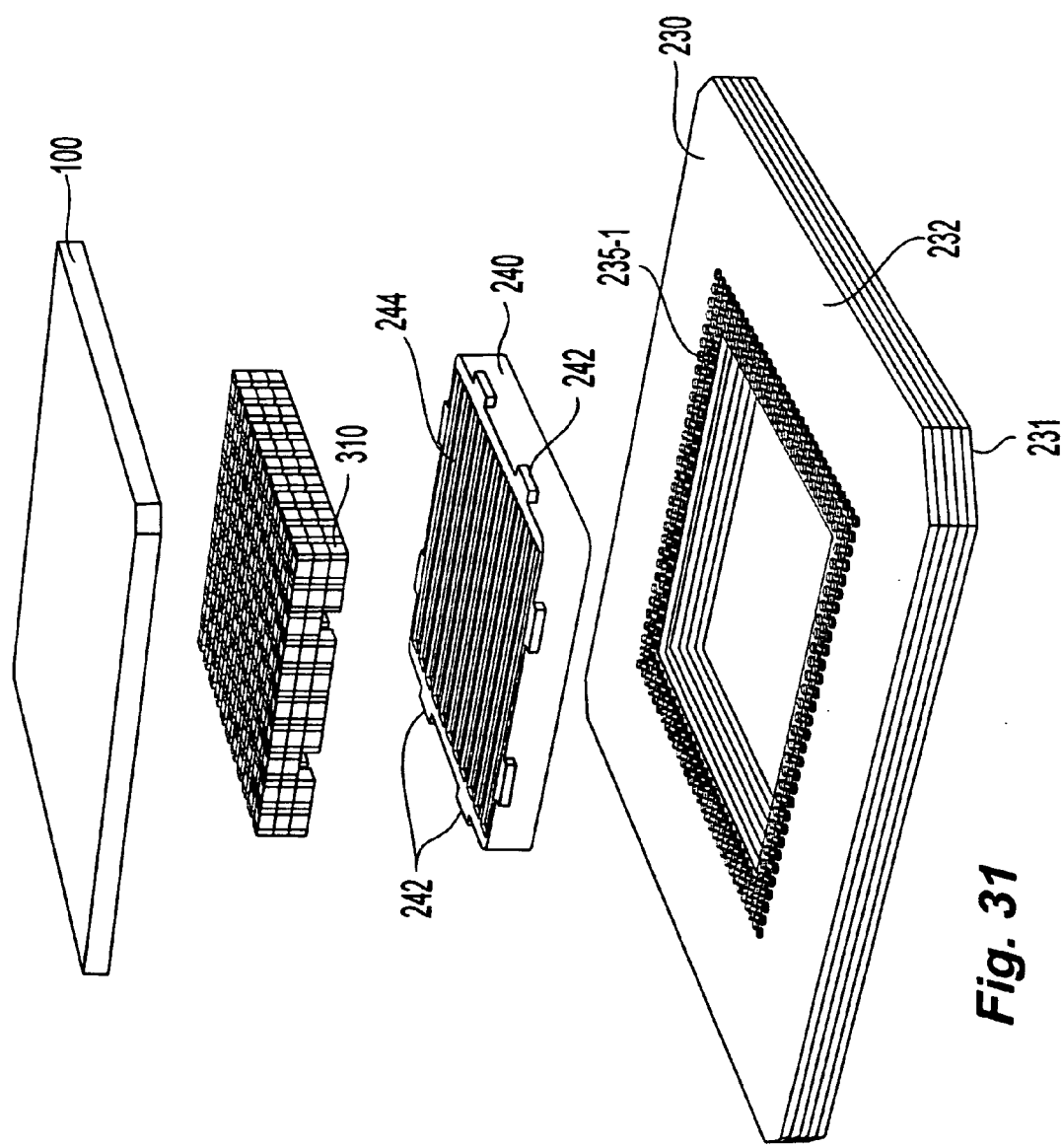
FIGS. 31 and 32 illustrate exploded views of the substrate of FIG. 30 with a chip.
Figure 32:
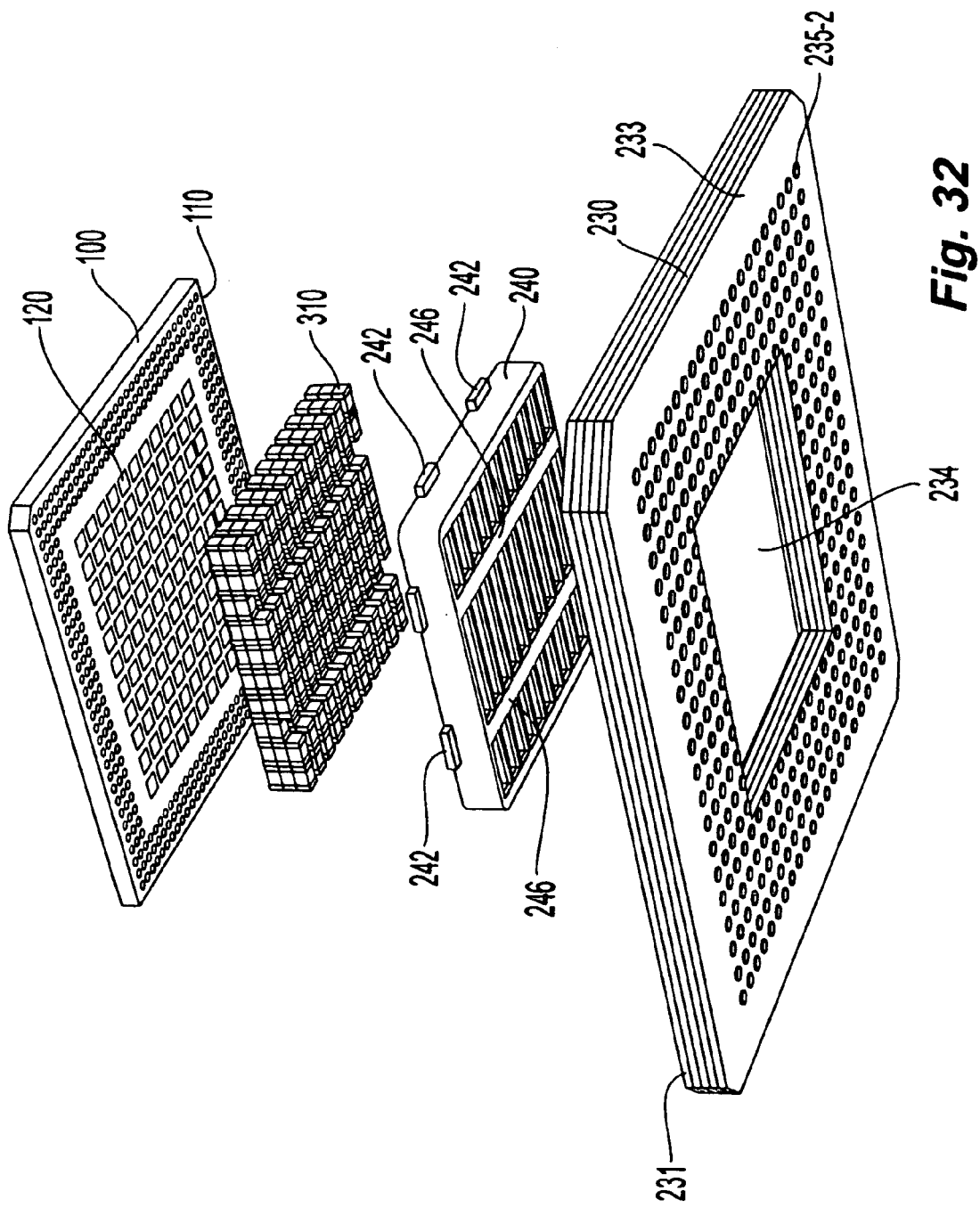
Figure 33:
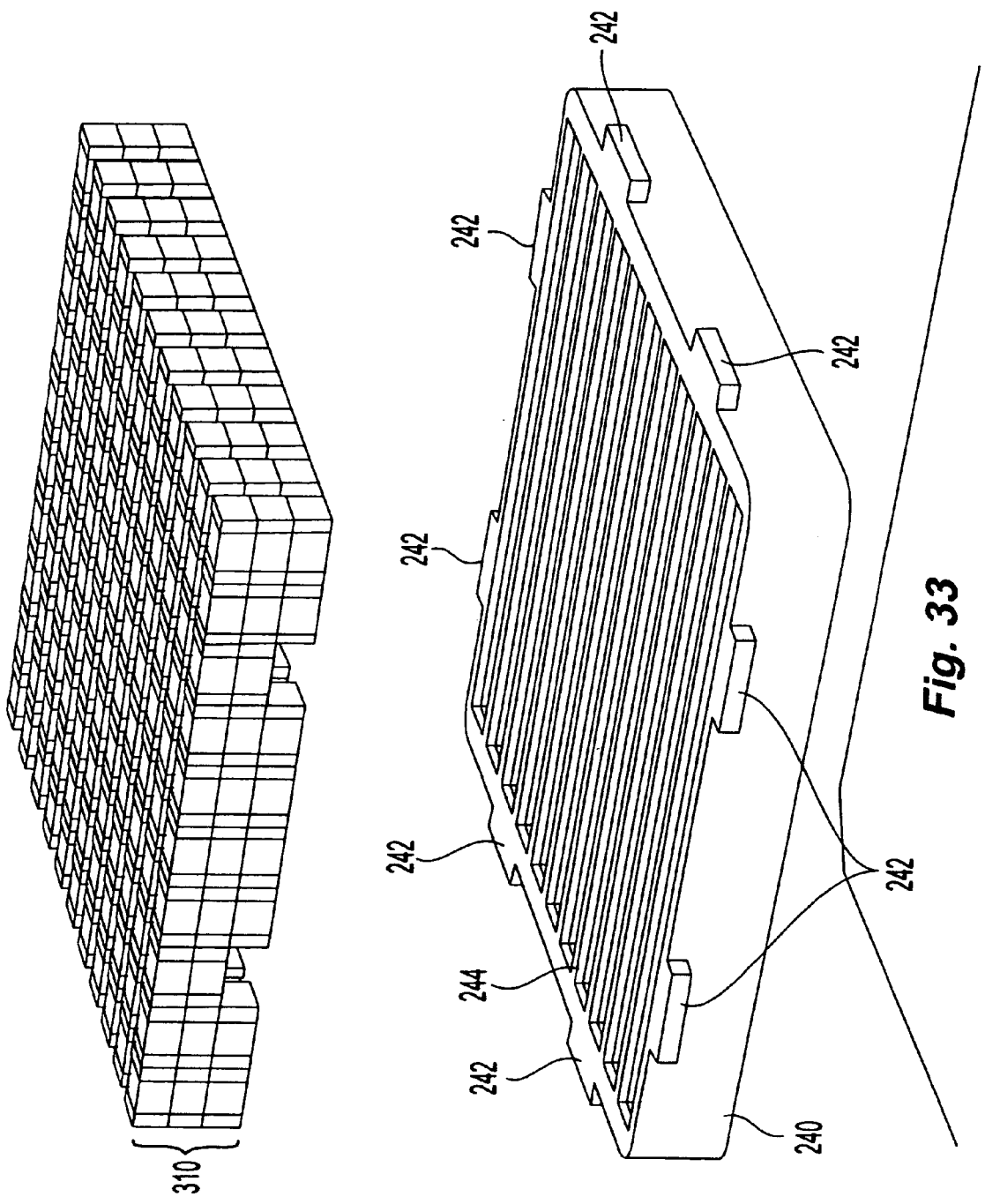
FIG. 33 illustrates a close-up of an exemplary capacitor blade tray and capacitor blades.
Figure 34:
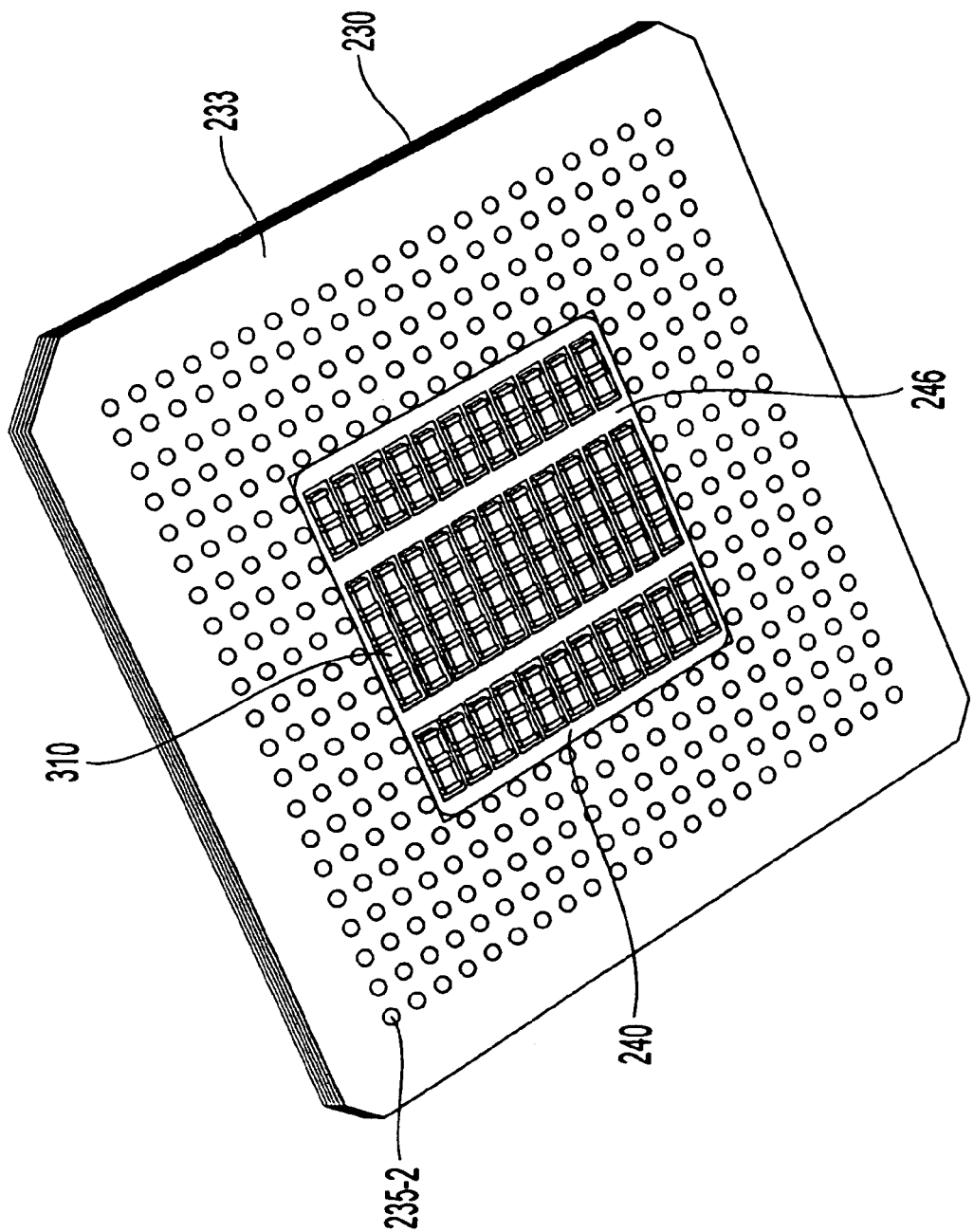
FIGS. 34 and 35 illustrate views of the exemplary substrate from the bottom.
Figure 35:
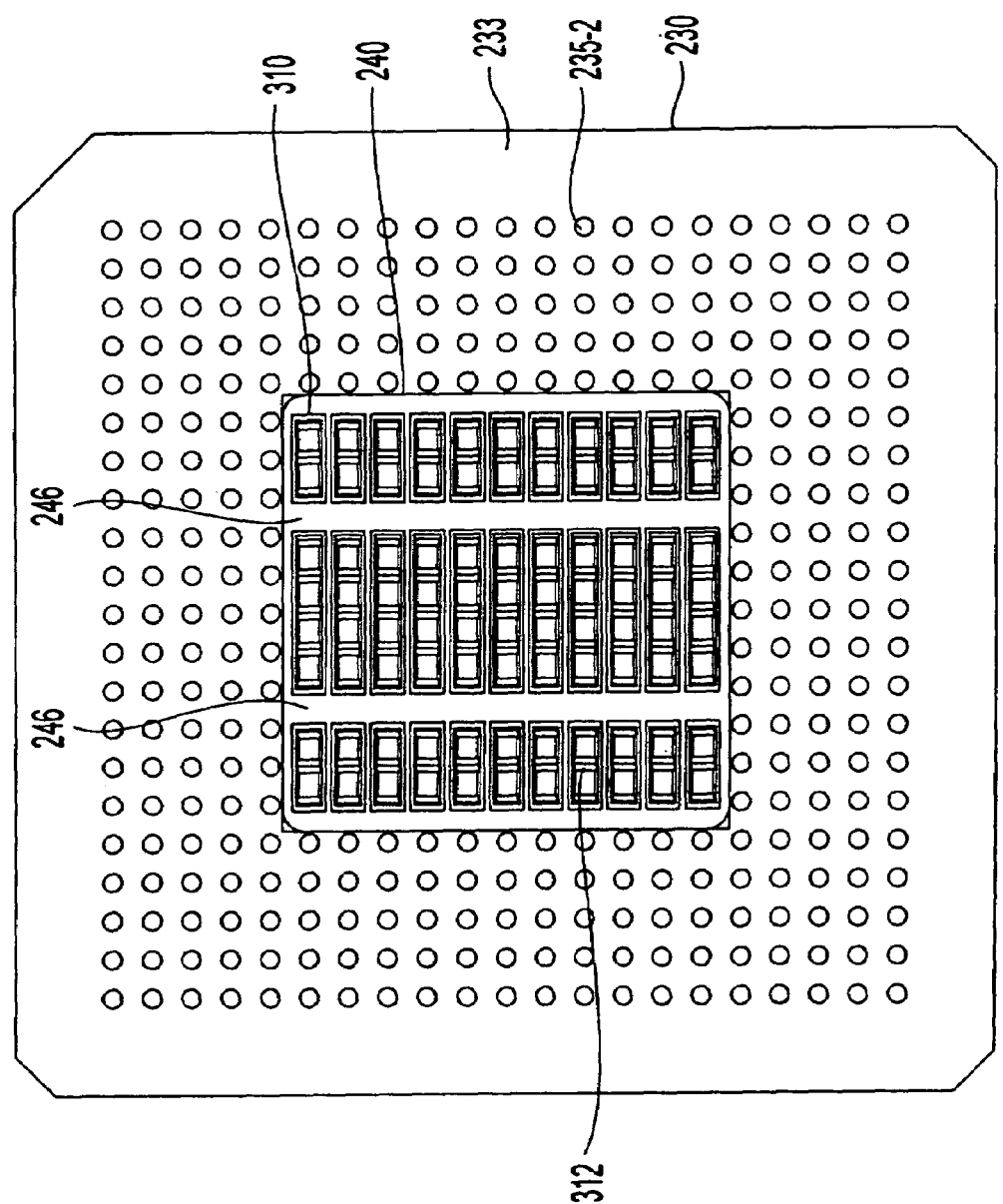
Figure 36:
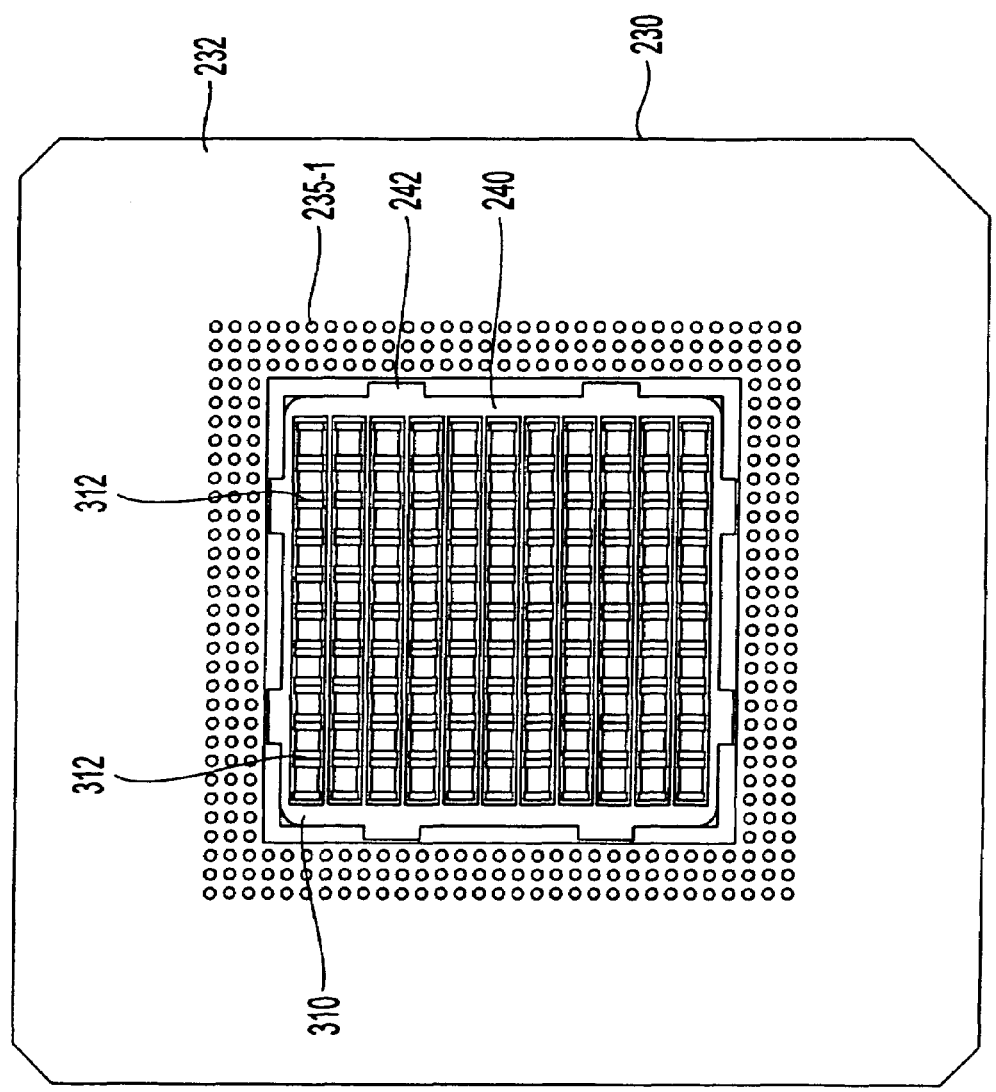
FIG. 36 illustrates the exemplary substrate from the top.
Figure 37:
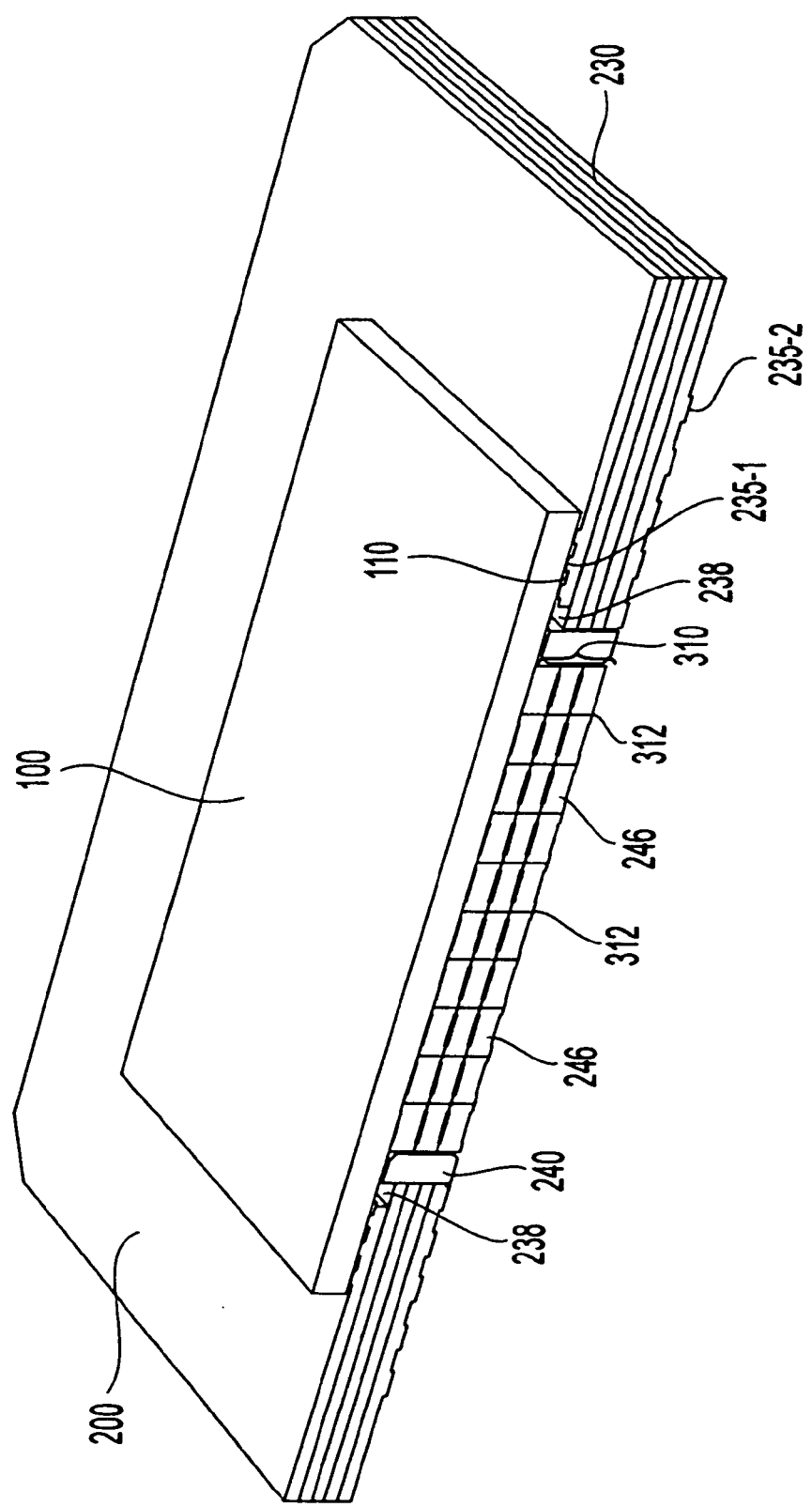
FIGS. 37–39 illustrate cross sections of the substrate with a chip mounted thereto.
Figure 38:
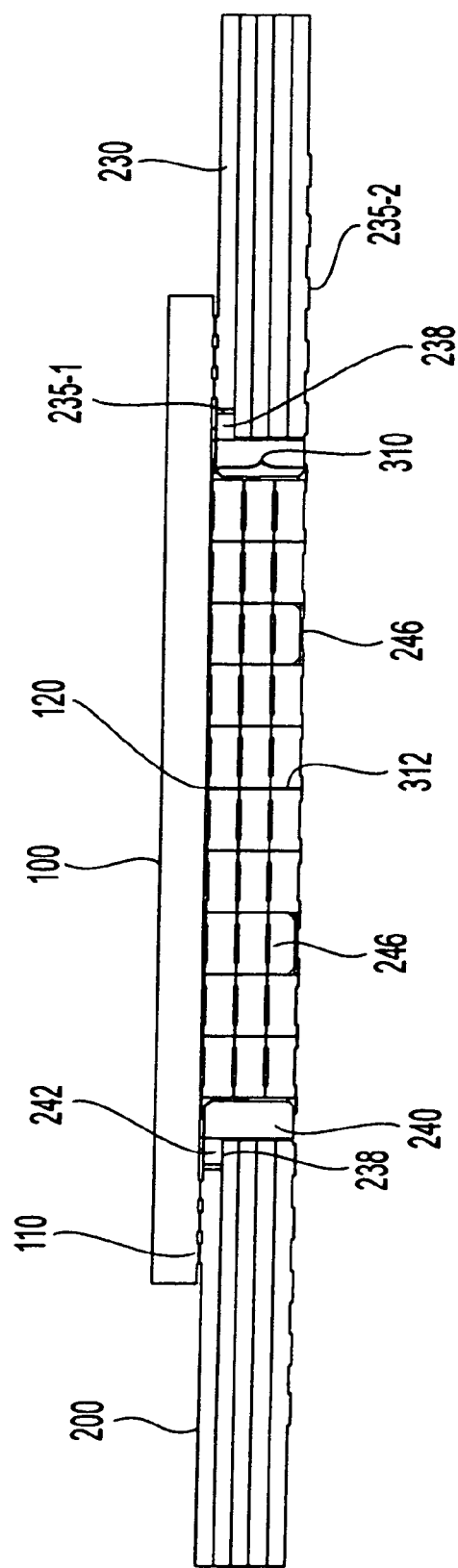
Figure 39:
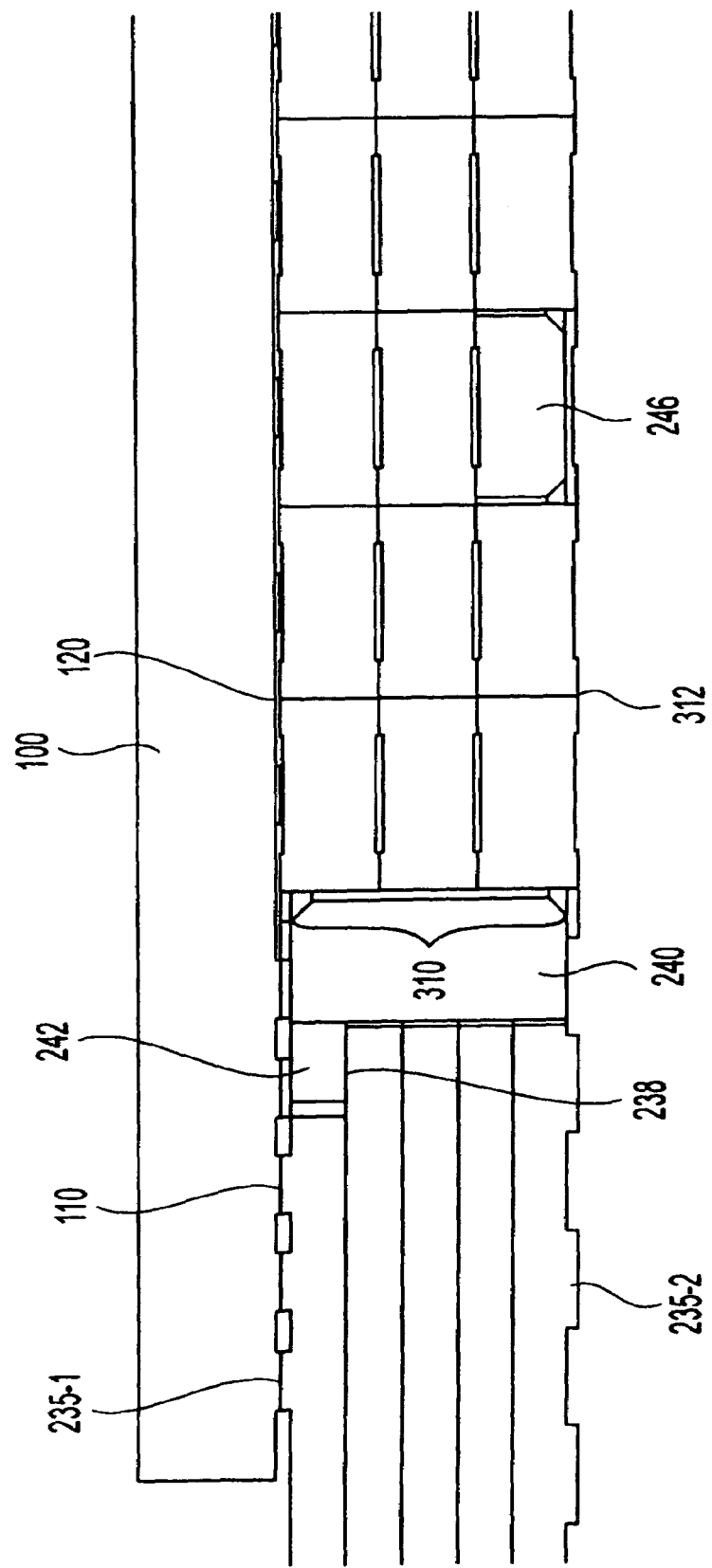

FIG. 29 illustrates a further exemplary embodiment of a substrate 200 with a chip or die 100 mounted thereto. FIG. 30 illustrates the substrate 200 shown in FIG. 29 with the chip 100 removed. FIGS. 31 and 32 illustrate exploded views of the substrate 200 and chip 100. FIG. 33 illustrates a close-up of a capacitor blade tray 240 and capacitor blades 310 in accordance with the exemplary embodiment shown in FIG. 30. FIGS. 34 and 35 illustrate views of the exemplary substrate 200 from the bottom. FIG. 36 illustrates the exemplary substrate 200 from the top. FIGS. 37–39 illustrate cross sections of the substrate 200 with a chip 100 mounted thereto.

As shown in FIG. 30, an insulating body 230, landings or pads 235-1, a capacitor blade tray 240, and capacitors blades 310 are provided. The insulating body 230 may be made from one or more layers 231 of dielectric or insulative material, however it is also possible to make the body from one piece of insulative material. As noted above, conductive paths or traces may run through the insulating body 230. Landings 235-1 are provided on a first side 232 of the insulating body. The landings 235-1 are arranged and adapted to connect to corresponding landings or pads 110 on the die 100, either directly or indirectly via an electrically-conductive medium, such as solder balls. As described in greater detail below, the capacitor blade tray 240 holds one or more capacitor blades 310, such as those described above. The blades 310 include conductive paths 312 that form virtual pins sized and spaced for connection to the chip 100, either directly or indirectly, as described above. In the example shown in FIG. 30, the conductive paths 312 have a pitch that is about twice the pitch of the landings 235-1. It should be appreciated that the pitch of the conductive paths 312 may be selected based on several factors and could be the same as the pitch of the landings 235-1 or a different pitch.

FIGS. 31 and 32 provide exploded views of the substrate 200 and chip 100 from different perspectives. The tray 240 fits within a hole 234 provided through the insulative body 230. The tray 240 may include extensions 242 that interface with the sides of the insulating body 230 at or in the hole 234 to position and/or retain the tray 240. Of course, other or additional mechanisms may be provided to position or retain the tray 240. For example, mechanical techniques, such as clips, hooks, snaps, stakes, interference fits, etc., may be used, and/or adhesives, and/or welding or brazing. The tray 240 includes slots 244 for receiving capacitor blades 310. In addition, the tray 240 may include alignment ribs 246 similar to the ribs 514 described above. The tray 240 may be fixed to the insulative body 230 or may be removable therefrom, for example, to permit repair, reconfiguration, or for substitution of the tray 240 and/or the insulative body 230.

As shown in FIG. 32, chip 100 includes landings or pads 110. As described above, landings 235-1 of body 230 are adapted to connect (directly or indirectly) to pads 110 of the chip 100. The insulating body includes a second side 233 having landings or pads 235-2. Conductive paths within insulating body 230 connect landings 235-1 on the first side 232 of insulating body to landings 235-2 on the second side 233. Landings 235-2 are adapted to connect (directly or indirectly) to landings or pads on a circuit board (not shown). Accordingly, signals may be coupled between the chip 100 and the circuit board via the substrate 200.

In addition, the chip 100 includes landings or pads 120 that couple (directly or indirectly using conductive bumps or balls, etc.) to conductive paths 312 of the capacitor blades. An opposite end of conductive paths 312 couple (directly or indirectly) to landings or pads on the circuit board. Accordingly, signals (including power and/or ground) may be coupled to and/or from the circuit board and the chip 100.

FIG. 33 provides an exploded view of tray 240 and capacitor blades 310. As shown, the tray 240 may include a series of slots 244 for receiving the capacitor blades 310. FIGS. 34 and 35 illustrates the second side 233 of the insulating body 230. The landings 235-2 are shown as well as the capacitor blades 310 and alignment ribs 246. As shown, the pitch of the landings 235-2 may be the same as the pitch of the conductive paths 312 provided by the capacitor blades 310. As above, it is possible for the pitch of the conductive paths 312 to differ from the pitch of the landings 235-2. FIG. 36 illustrates the substrate 200 from above, showing the capacitor blades 310, landings 235-1, tray 240, and insulative body 230. The number of landings 235-1 on the top surface of the substrate 200 may equal the number of landings 235-2 on the bottom surface of the substrate. However, this is not required for some applications and the numbers of landings 235-1 and 235-2 may differ. For example, as shown in FIGS. 35 and 36, the substrate may have fewer landings 235-1 at the upper surface than landings 235-2 at the bottom surface. In this regard, some landings 235-1 may be routed to multiple landings 235-2.

FIGS. 37-39 illustrate cross sections of the substrate 200 and die 100. These views illustrate the connection between the landings 110 and 235-1 and between landings 120 and conductive paths 312. As shown in these Figs., the insulating body 230 may include an edge 238 that receives the extensions 242 of the tray 240, thereby seating the tray 242 in the insulating body 230.

Figure 40:
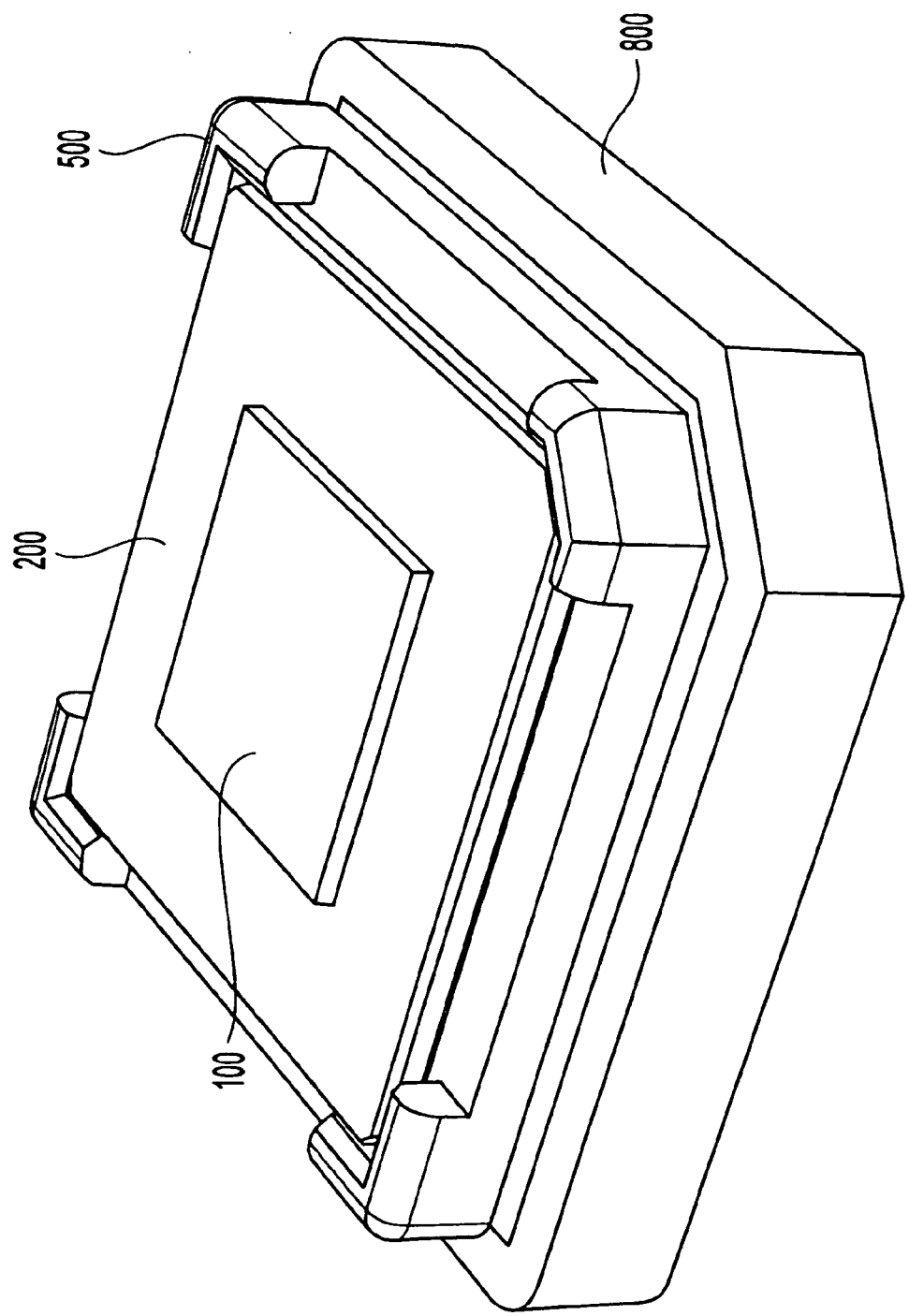
FIG. 40 illustrates a further exemplary embodiment of a pluggable device arrangement.
Figure 41:
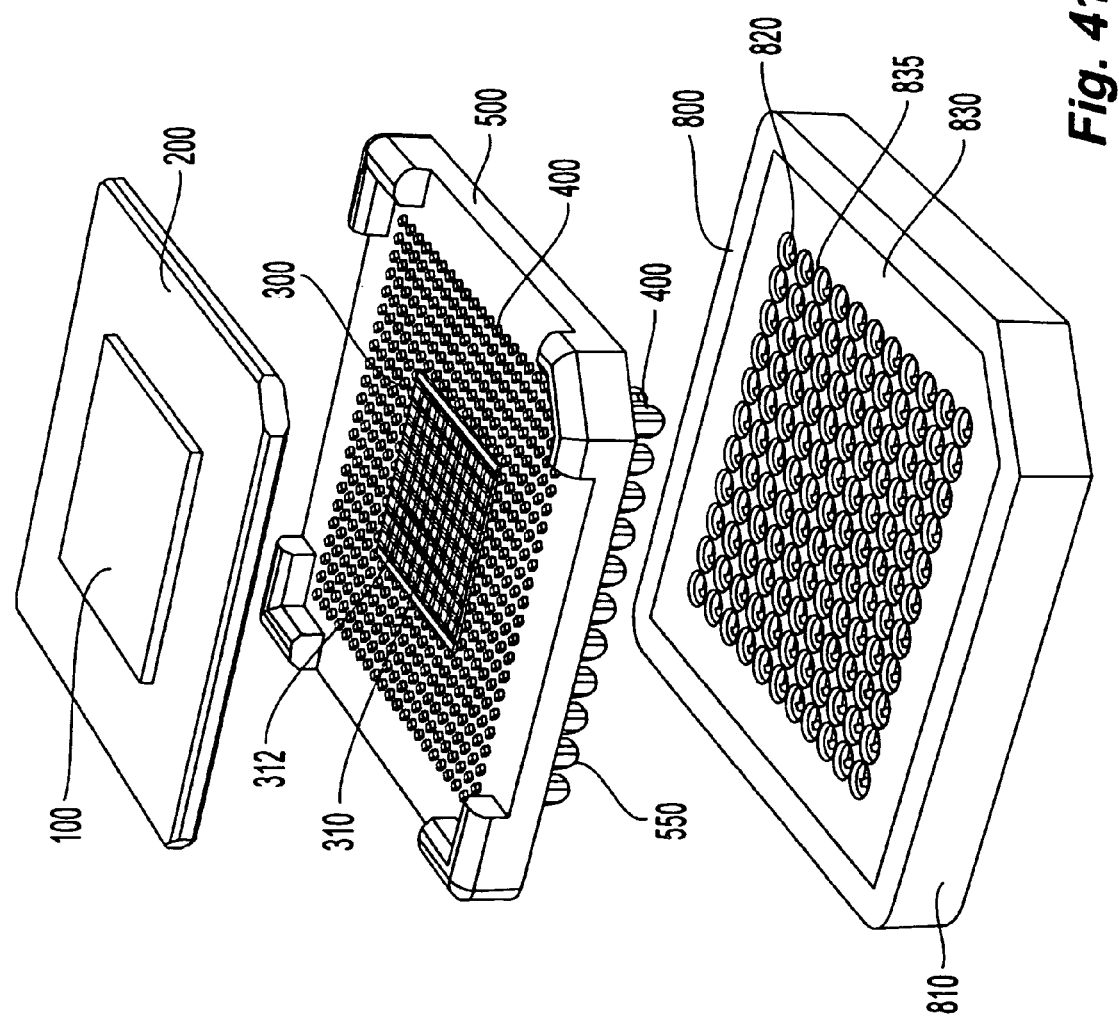
FIGS. 41 and 42 illustrate exploded views of the exemplary device arrangement of FIG. 40.
Figure 42:
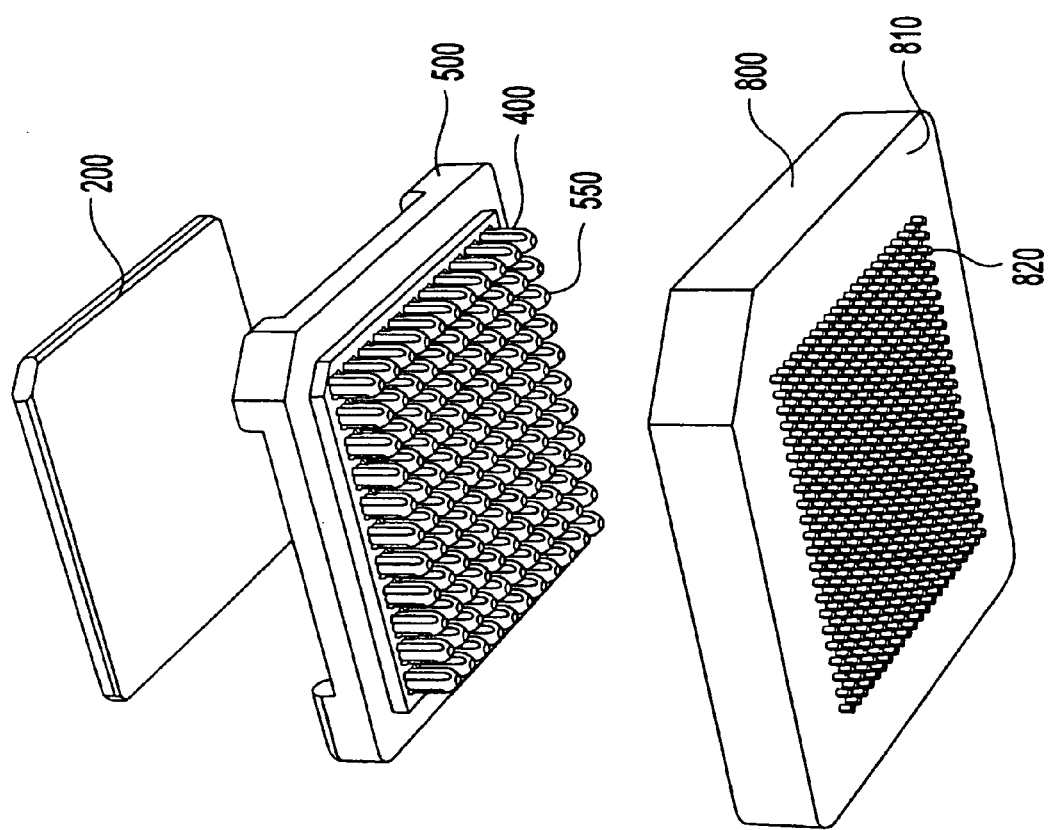

FIG. 40 illustrates a further exemplary embodiment of a device arrangement in accordance with an aspect of the present invention. As shown in FIG. 40–42, the device arrangement includes an IC chip or die 100, a substrate 200, capacitor block 300, pins 400, interposer main body 500, and socket 800. Features of the IC chip 100, substrate 200, capacitor block 300, and main body 500 may be similar to those described above in connection with other embodiments and therefore may not be described in detail again below.

Die 100 mounts to substrate 200, with substrate 200 in turn mounting to interposer main body 500. As above, landings or pads on the bottom surface of die 100 electrically connect to landing or pads on the top surface of substrate 200. The pads on the top surface of substrate 200 connect to pads on the bottom surface thereof. The pads on the bottom surface of substrate 200 connect to the tops of the virtual pins of the capacitor block 300 and to the pins 400 of interposer main body 500. The interposer main body 500 mounts to socket 800. As will be discussed in greater detail below, the pins 400 connect to corresponding pins 820 of the socket 800 to form an electrical connection therebetween. The socket pins 820 may connect to a PCB or other substrate. Accordingly, electrical connection may be made from the die to/from the PCB or other substrate via the substrate 200, capacitor block 300, pins 400, and socket 800.

As shown in FIGS. 41 and 42, the bottom surface of main body 500 may include an array of buttresses 550. The buttresses 550 may be made of the same material as the main body, such as an insulative polymer (e.g., liquid crystal polymer) and may extend from the bottom surface of the main body 500. The buttresses 550 may be integrally molded as part of the main body 500, or may be formed separately and connected after the main body 500 is formed. It should be appreciated that the buttresses 550 are not required and may be omitted in some embodiments.

Each of the pins 400 extend through the interposer main body 500 and along the length of a buttress 550. Clusters or groups of pins 400, for example, four pins 400 in the illustrated example, are spaced around the circumferences of buttresses 550. More particularly, the circumferences of the buttresses 550 may include cut-outs or indentations which receive the pins 400, yet expose at least a side surface of the pins 400 to permit electrical connection. In the embodiment illustrated, the buttresses 550 have rounded outer surfaces that, together with pins 400, provide a shape generally like a circular cylinder with flat surfaces corresponding to the exposed sides of the pins 400. The tips of the buttresses 550 may be tapered, for example rounded, conic, or pyramidal, to facilitate connection to the socket 800, as described below. Other shapes of the buttress and its tip are possible as well. Similarly, the tip of the pins 400 extending along the buttress 500 may be tapered. Moreover, as noted above, the buttresses 550 are not required, in which case the pins 400 would extend from the bottom surface of the main body 500.

As shown in FIG. 41 for example, pins 400 may be exposed at the top surface of main body 500 for connecting (directly or indirectly, as discussed above) to the landing pads on the bottom surface of substrate 200. In addition, pins 400 provided beneath the capacitor block 300 may connect, directly or indirectly, to the conductive paths 312 of the capacitor blades 310, thereby forming an electrical connection from the top of the main body 500 (i.e., the top of the conductive paths 312) to the lower surface of the main body (i.e., the pins 400 beneath the capacitor block 300). While capacitor blades 310 are shown, it should be appreciated that the capacitor block 300 could be embodied as a capacitor module, for example, as illustrated in FIGS. 13–23.

Socket 800 includes a body 810, pins 820, and a cover plate 830 having holes 835. The main body 810 may be formed of an insulative material, such as a polymer, for example, a liquid crystal polymer. Pins 820 are held in the main body 810, as discussed further below. Cover plate 830 may be provided to cover the pins 820. The cover plate 830 includes holes 835 to receive the pins 400 and buttresses 550, if provided, of the interposer main body 500.

Figure 43:
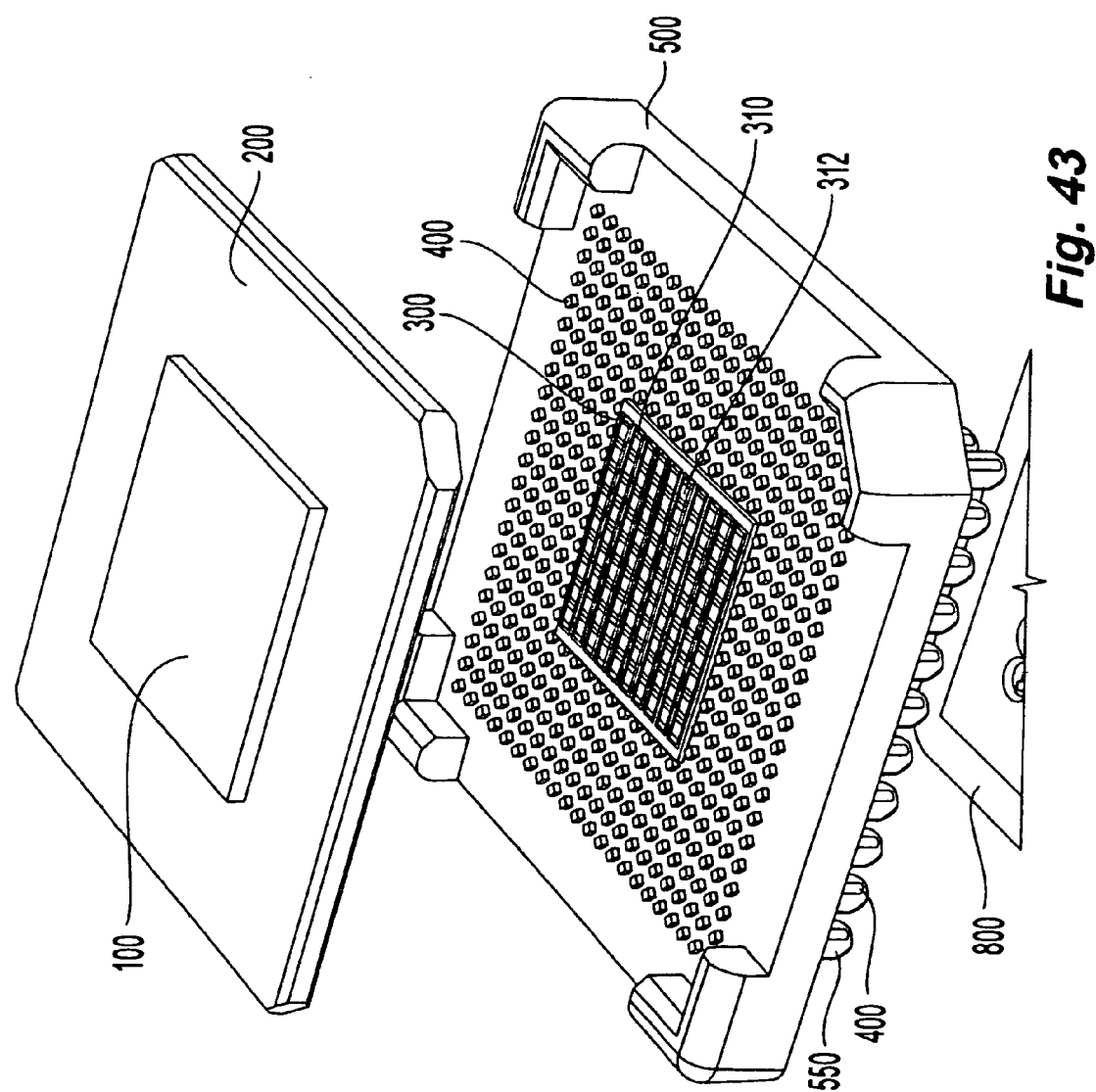
FIG. 43 illustrates a close-up view of the die, substrate, and interposer of the exemplary device arrangement of FIG. 40.

FIG. 43 illustrates the upper surfaces of the main body 500 with pins 400 and capacitor block 300 that couple to the substrate 200 and IC die 100. As shown, the ends of pins 400 may extend from the upper surface of the main body 500. The pitch of the pins 400 may be the same as the pitch of the conductive paths 312 of the capacitor blades 310. However, as above, this may be useful in some applications, but is not required. Similar to the pins 400, the capacitor blades 310 may also extend from the upper surface of body 500.

Figure 44:
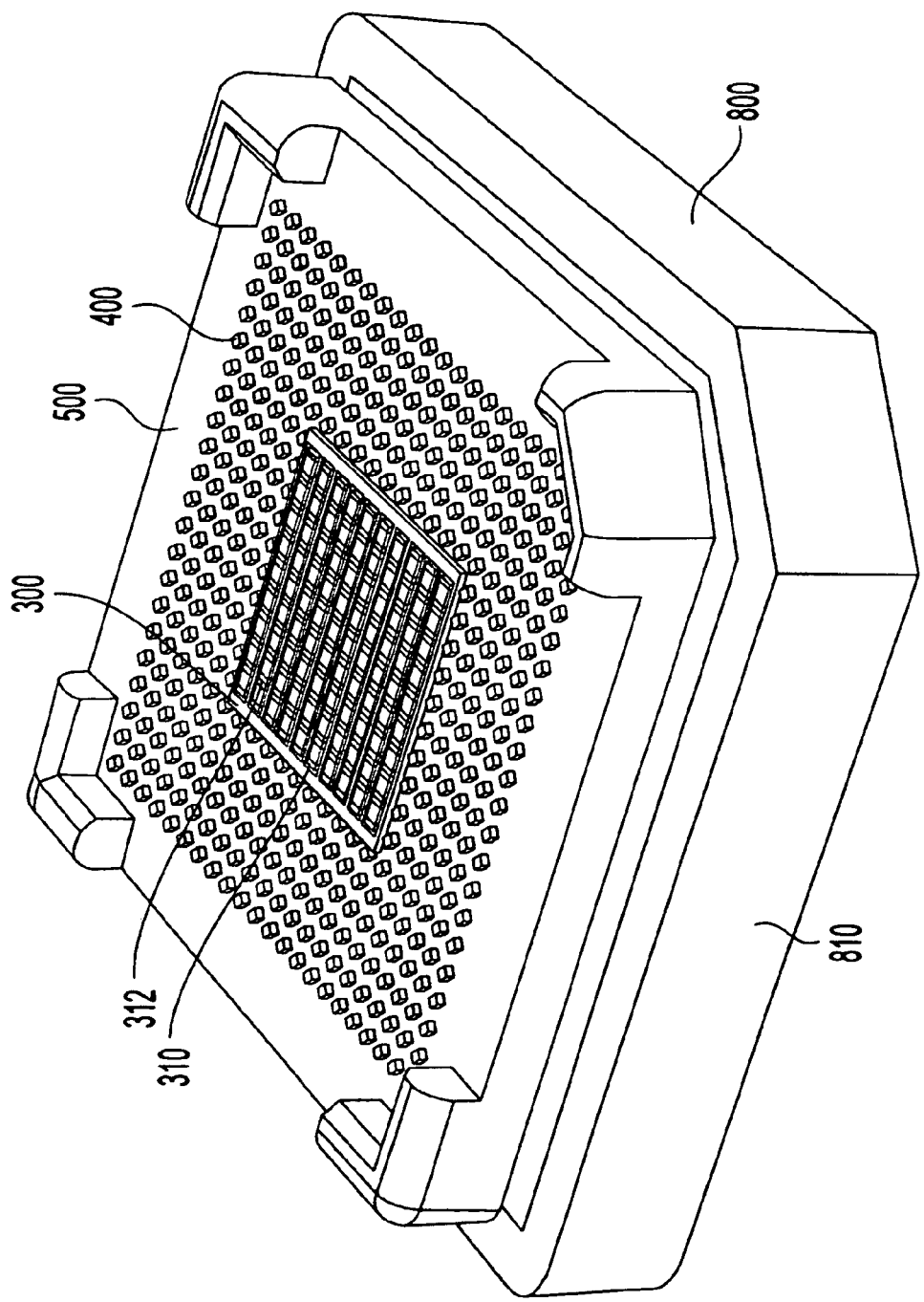
FIG. 44 illustrates a view of the interposer and socket of the exemplary device arrangement of FIG. 40.

FIG. 44 illustrates the interposer main body 500 coupled to the socket 800. As described above, the pins 400 and buttresses 550 of the main body 500 may extend through the holes 835 in the cover plate 830 of socket 800. While not shown in FIG. 44, the pins 400 engage corresponding pins 820 of the socket to form an electrical connection.

Figure 45:
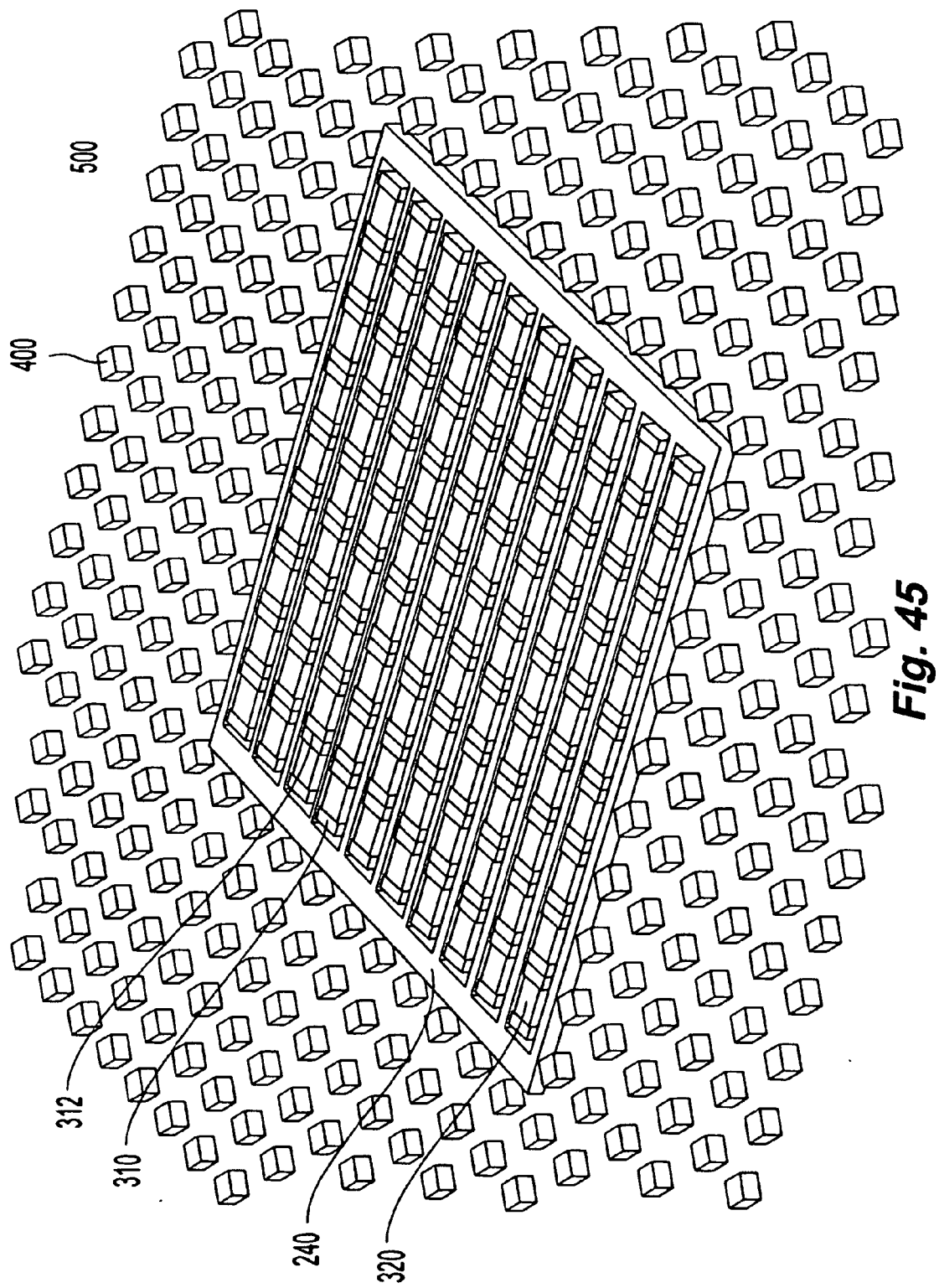
FIG. 45 illustrates a close-up view of the top of the interposer of the exemplary device arrangement of FIG. 40.

FIG. 45 provides a close-up view of the upper surface of main body 500, showing the array of pins 400 and the capacitor block 300. The capacitor block 300 includes multiple capacitor blades 310 made up of multiple individual capacitors 320 as described above. The capacitor blades 310 may be disposed in a capacitor blade tray 240 seated in the main body 500.

Figure 46:
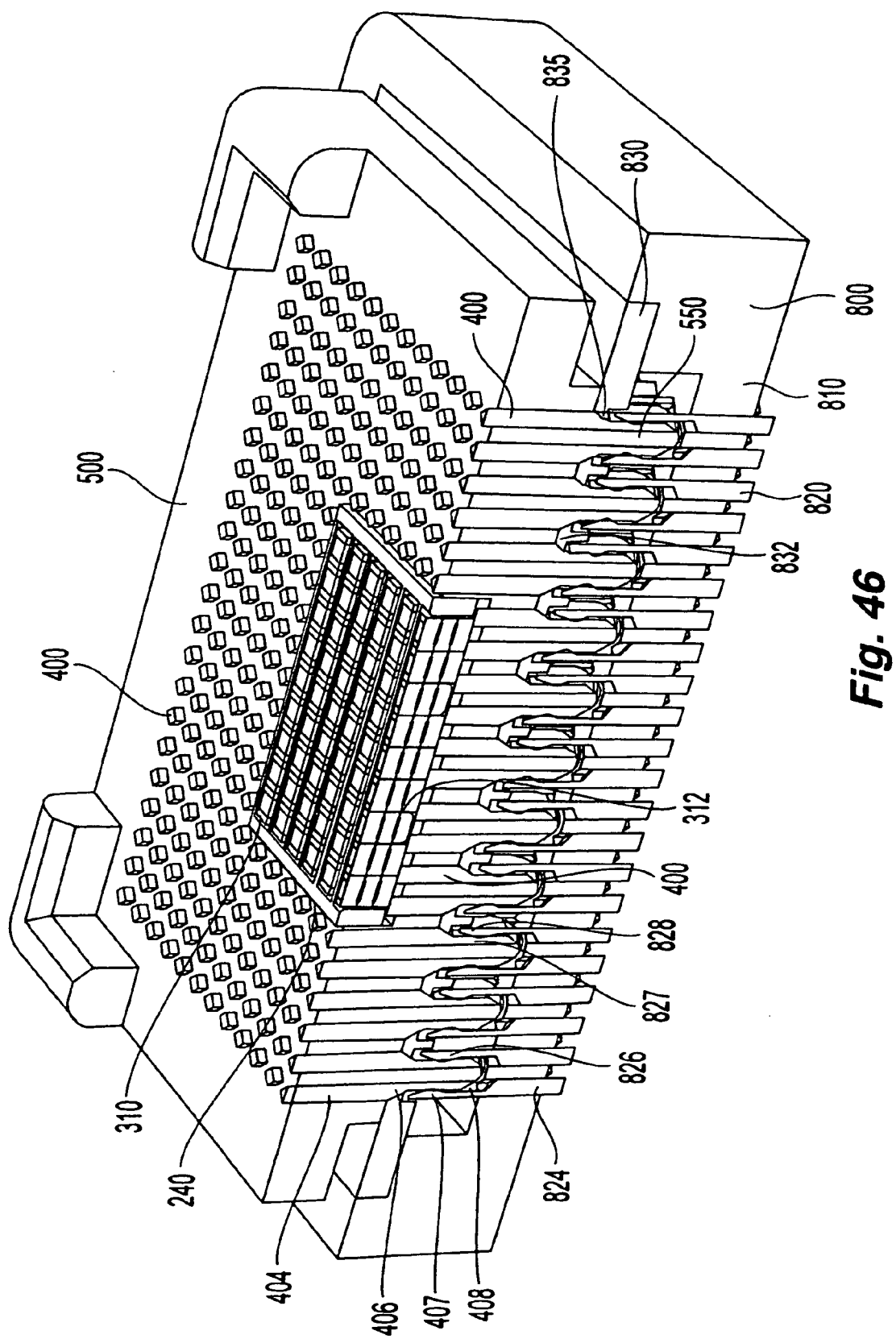
FIG. 46 illustrates a cross sectional view of the interposer and socket of the exemplary device arrangement of FIG. 40.
Figure 47:
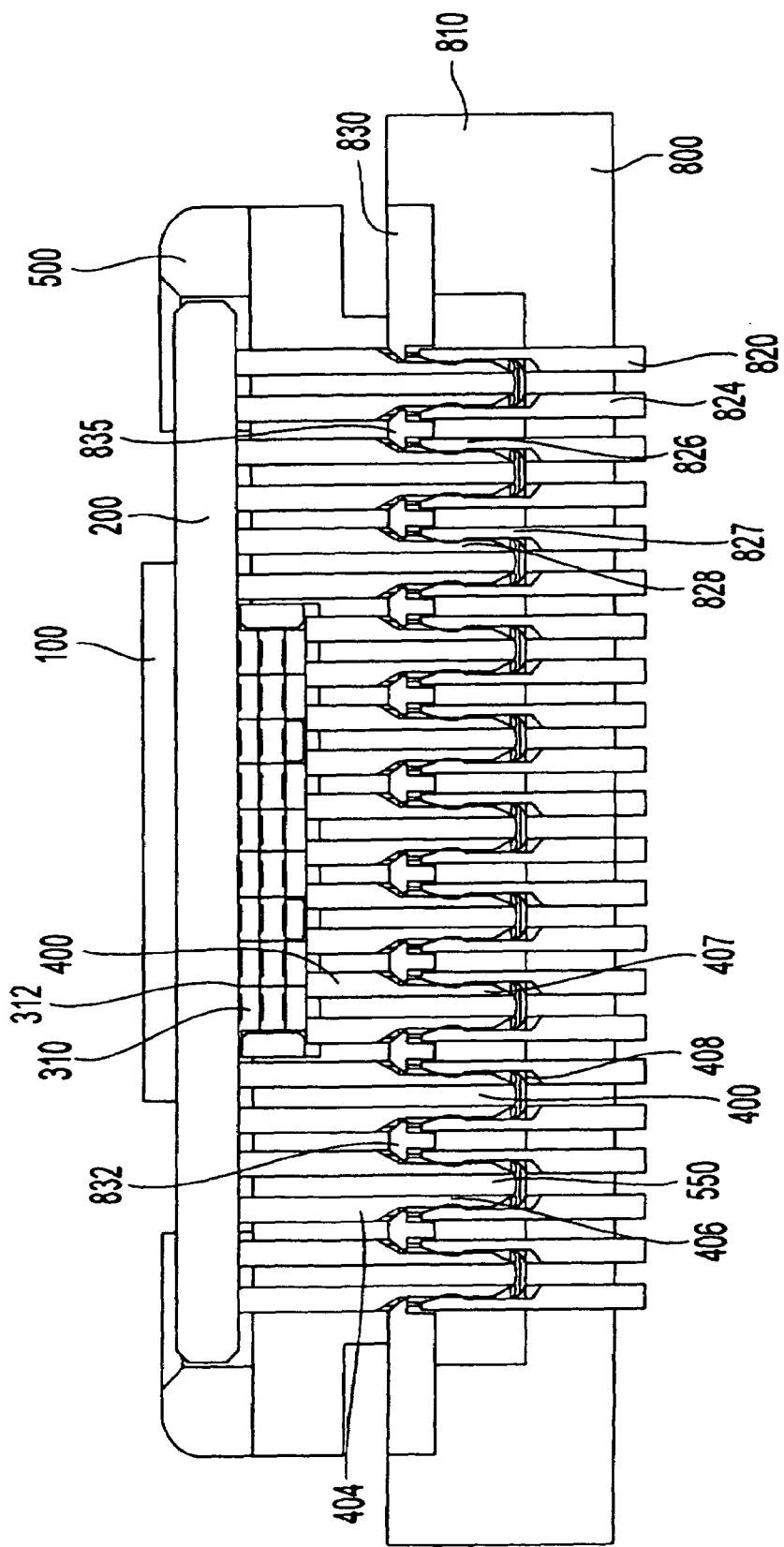
FIG. 47 illustrates a cross section of the die, substrate, interposer and socket of the exemplary device arrangement of FIG. 40.
Figure 48:
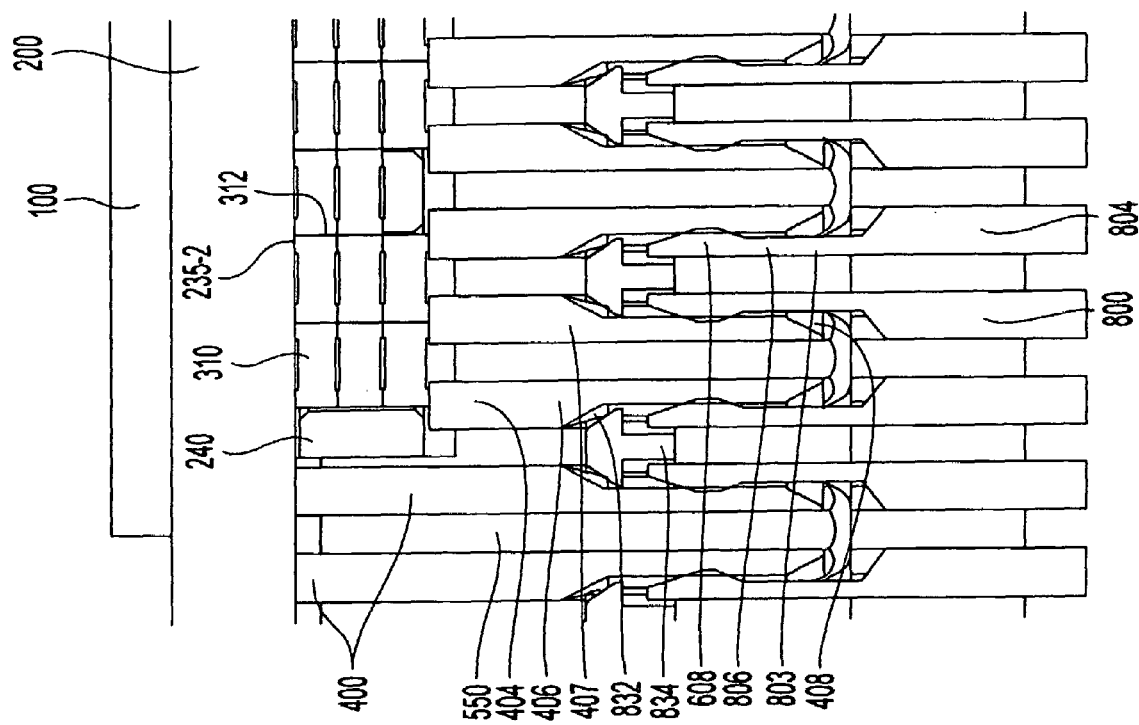
FIG. 48 illustrates a close-up view of the cross section of FIG. 47.

FIG. 46 illustrates a cross section of the interposer main body 500 and the socket 800 during connection. FIGS. 47 and 48 also provide cross sectional views during connection. As shown in these Figs., pins 400 and the conductive paths 312 of capacitor block 300 may be exposed at the top surface of main body 500 for coupling (directly or indirectly, as discussed above) to the landing pads on the bottom surface of substrate 200. In addition, pins 400 provided beneath the capacitor block 300 may connect, directly or indirectly, to the bottom of conductive paths 312 of the capacitor blades 310, thereby forming an electrical connection.

The opposite ends of pins 400 extend from the bottom surface of the interposer main body 500 along the sides of buttresses 550. As shown, the pins 400 may include a stabilization portion 404 and a contact portion 406. The stabilization portion 404 may held within holes of the main body 500, for example, using a frictional fit and/or adhesives. The stabilization portion 404 may be thicker than the contact portion 406 to provide, among other things, stable engagement with the main body 500. The contact portion 406 may be narrower that the stabilization portion 404. The contact portion 406 includes a flat surface 407 for contact to the pins 820 of the socket and a tapered lead-in portion 408. The tapered lead-in portion 408 is designed to initially engage a pin 820 and to flex the pin 820 as it slides along the tapered portion 408.

Similarly, the pins 820 of the socket 800 include a stabilization portion 824 and a contact portion 826. As above, the stabilization portion 824 may be held within holes in the main body 820 using a frictional fit and/or adhesive. As shown, the stabilization portion 824 may be thicker than the contact portion 826. The contact portion 826 may be angled relative to the stabilization portion 824 when not flexed. The contact portion 826 may include a flexible beam portion 827 and a lead-in portion 828 that may be wedge-shaped. The flexible beam portion 827 is designed to flex upon engagement with the pins 400, making the lead 800 straighter. The flexure produces a normal force between the pin 820 and the pin 400 to provide a good electrical connection. In addition, the flexure enables the pin 820 to wipe the surface of pin 400, again facilitating good electrical connection. Lead-in portion 828 engages lead-in portion 408 to facilitate sliding contact of the portions 826 and 406 and to initiate flexing the pin 820.

FIGS. 46–48 additionally show the cross section of the cover plate 830. As shown, the edges of the holes 835 may be angled inward to facilitate alignment of the buttresses 550 and leads 400 during insertion. In addition, the undersurface of the cover plate 830 may include extensions 832 that may serve to separate adjacent clusters of pins 820. The extensions 832 may form a grid-like or honeycomb-like pattern on the bottom surface of the cover plate 830. Of course, the pattern formed by the extensions 832 may be circular, hexagonal, rectangular, or other shape.

When the interposer 500 mates with socket 800, pins 400 and buttresses 550 extend through holes 835 through the cover plate 830 of the socket 800. In the illustrated embodiment, each buttress 550 and cluster of pins 400 extends through one of the holes 835. However, it is possible for multiple buttresses 550 and clusters of pins 400 to pass through a hole 835. The pins 400 engage pins 820 of the socket 800 establishing electrical connection.

Figure 49:
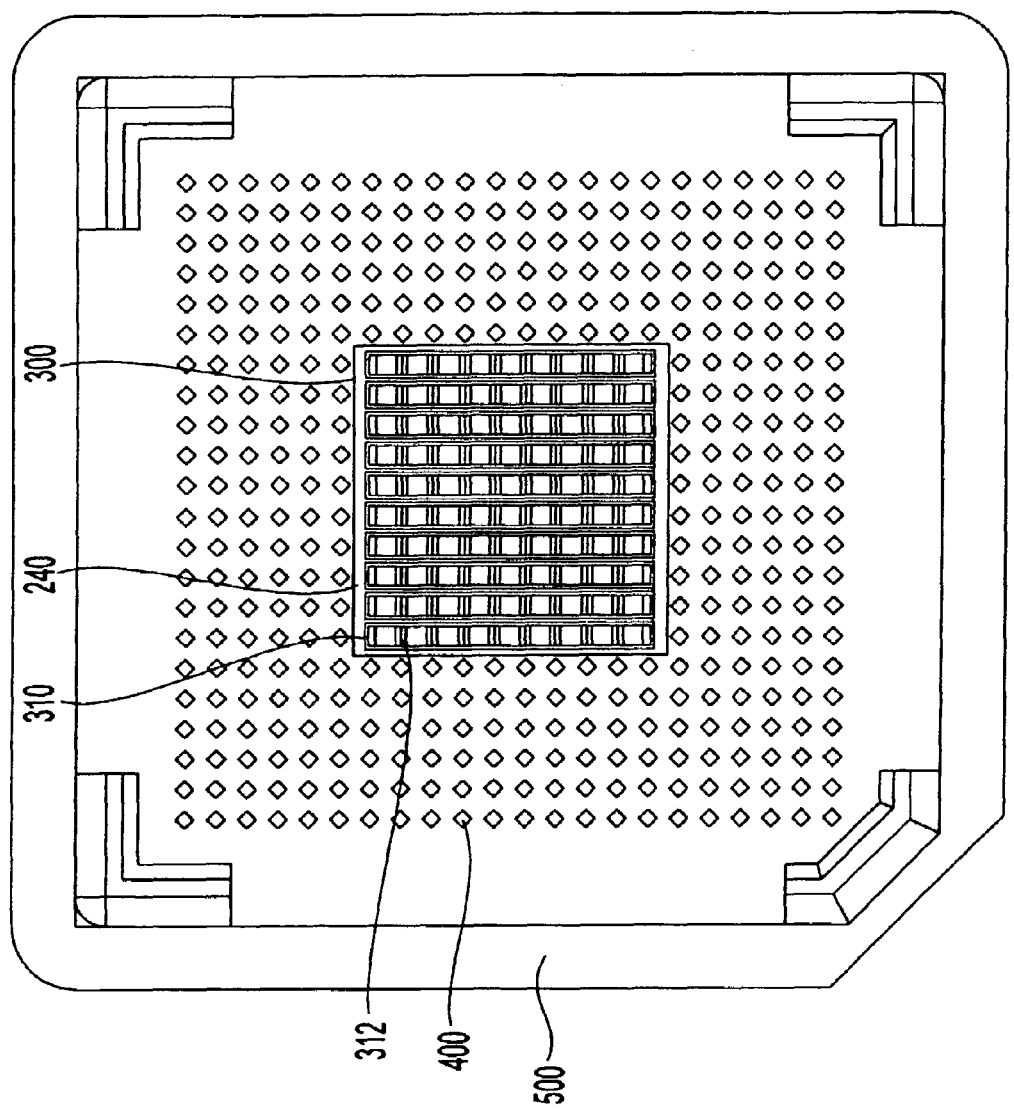
FIG. 49 illustrates a view of the top of the interposer of the exemplary device arrangement of FIG. 40.
Figure 50:
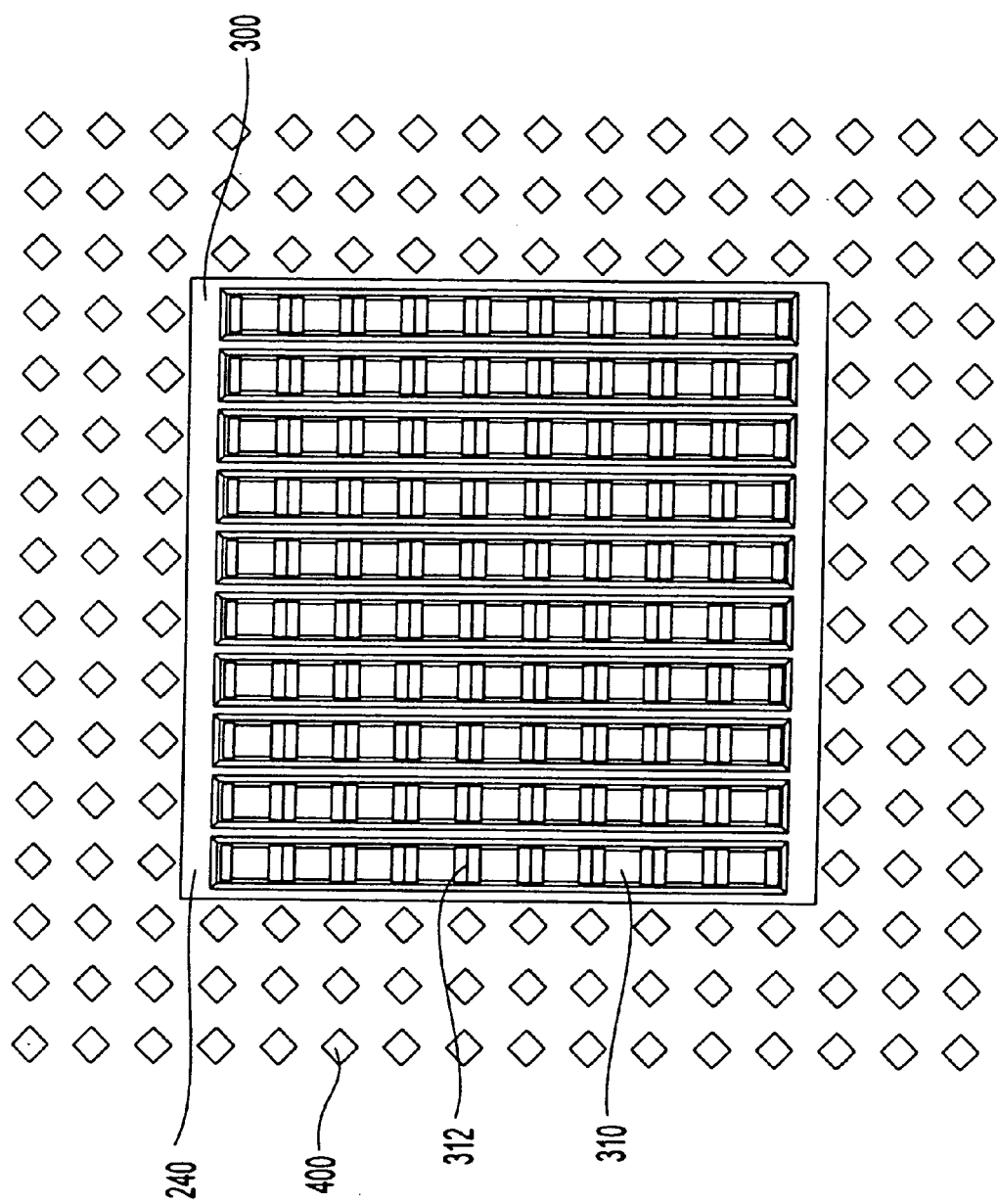
FIG. 50 illustrates a close-up view of FIG. 49 showing the capacitor blade arrangement.
Figure 51:
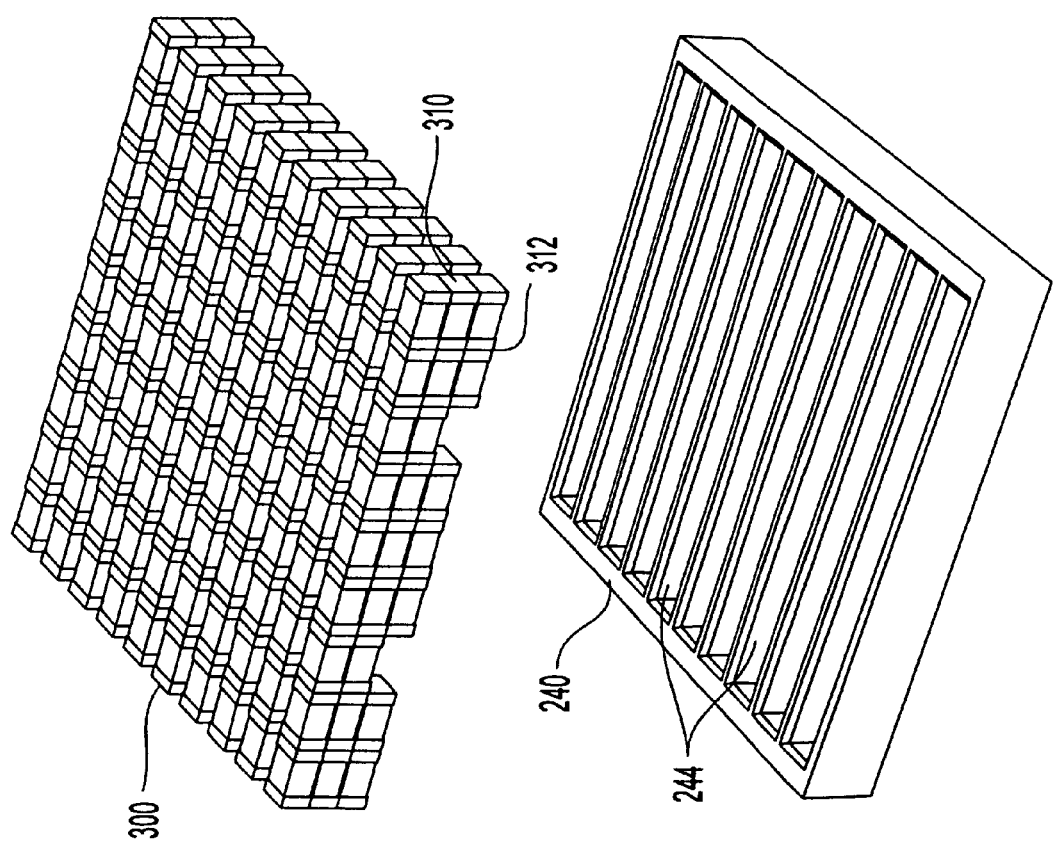
FIGS. 51 and 52 illustrates exploded views of the capacitor blade arrangement of the exemplary device arrangement of FIG. 40.
Figure 52:
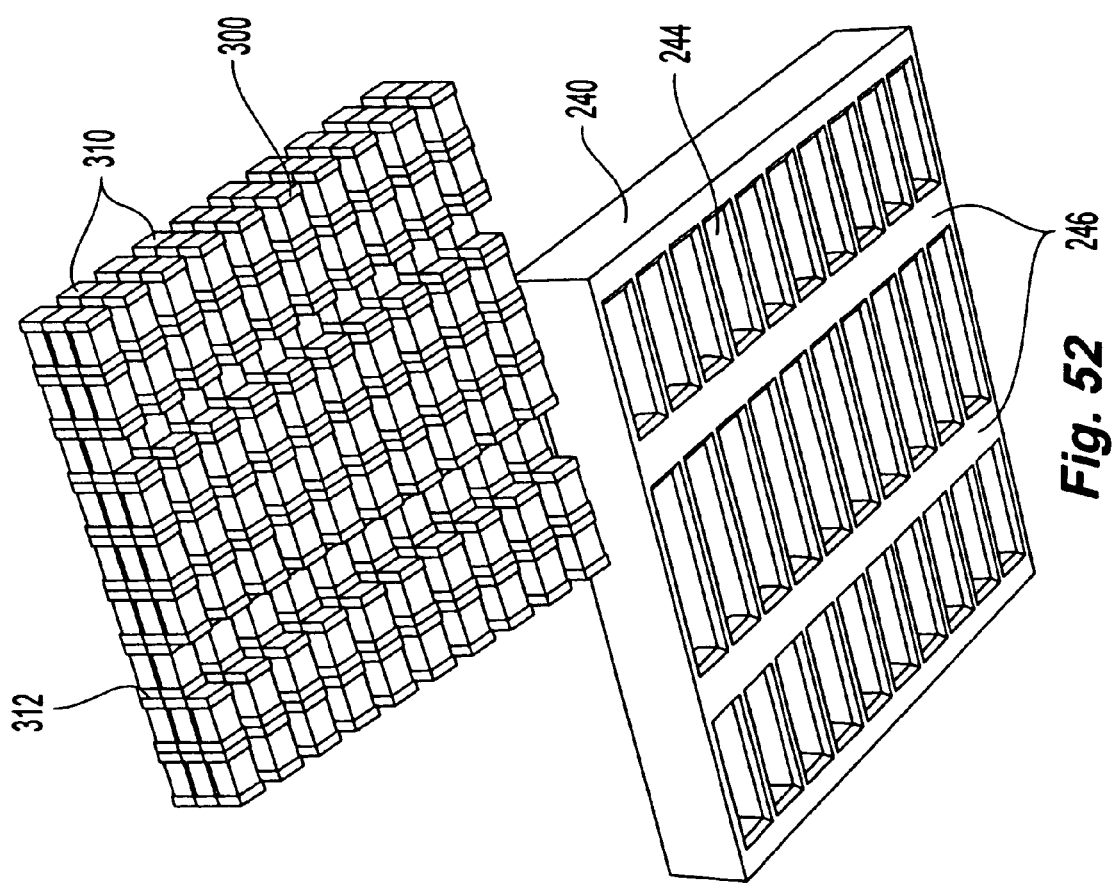

FIG. 49 shows the upper surface of the interposer main body 500 with capacitor block 300 and pins 400. FIG. 50 shows a close-up view of the capacitor block 300. As shown, the capacitor blades 310 are arranged parallel to each other in a blade tray 240. The blade tray 240 is seated in the main body 500. FIGS. 51 and 52 provide exploded views of the capacitor blades 310 and the blade tray 240. The tray 240 may be made from an insulative material. As shown, the blade tray 240 includes rows of slots 244 for receiving individual blades 310. As best shown in FIG. 52, the bottom of the tray 240 may include alignment ribs 246 for engaging the alignment notches 314 of the blades 310.

Figure 53:
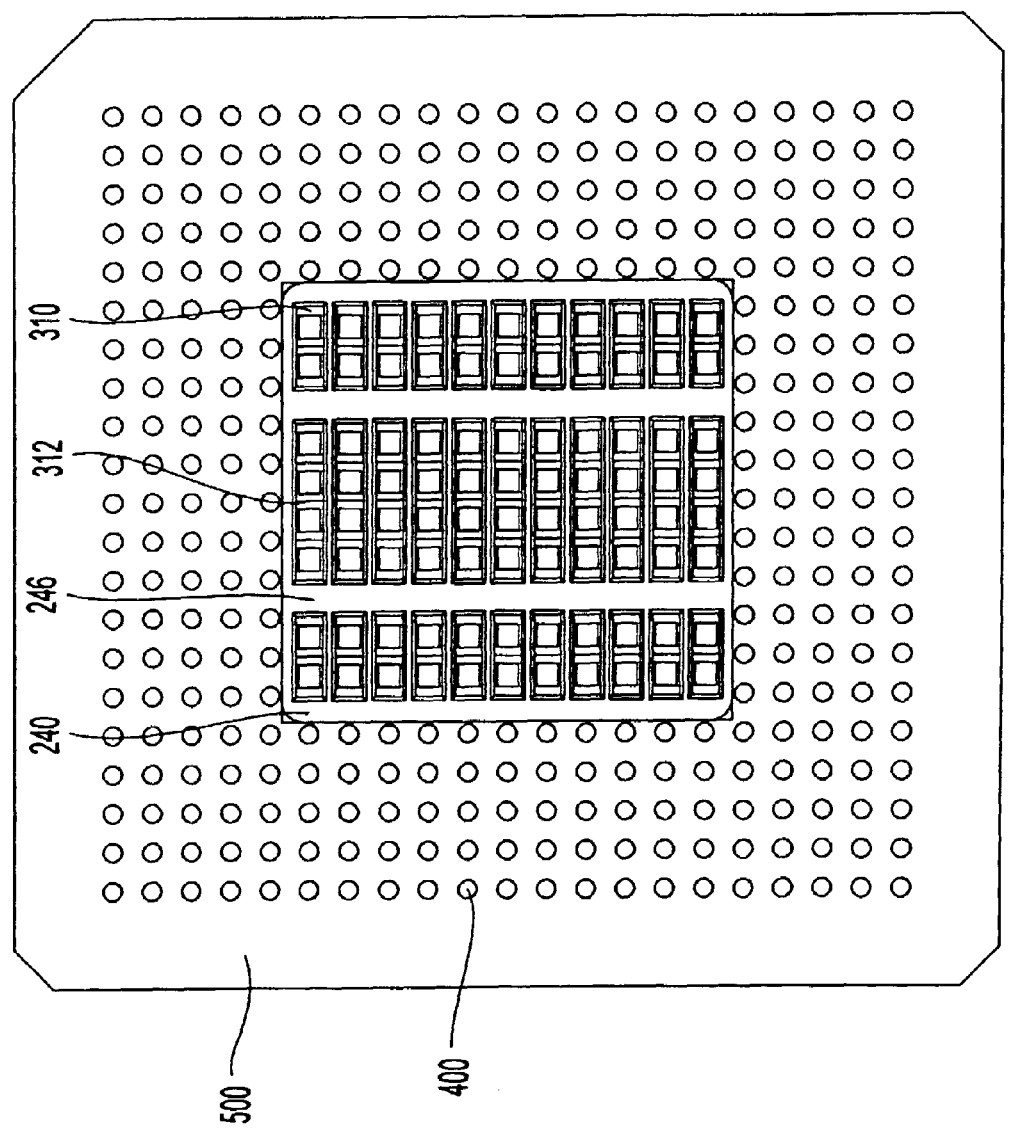
FIG. 53 illustrates a cross section of the interposer of the exemplary device arrangement of FIG. 40.

FIG. 53 shows a cross section view taken through the interposer main body 500 at the bottom of the capacitor block 300. In accordance with FIG. 53, the conductive paths 312 of the capacitor blades 310 are exposed and available for connection to leads 400 (not shown) extending through the main body 500 beneath the capacitor block 300.

Figure 54:
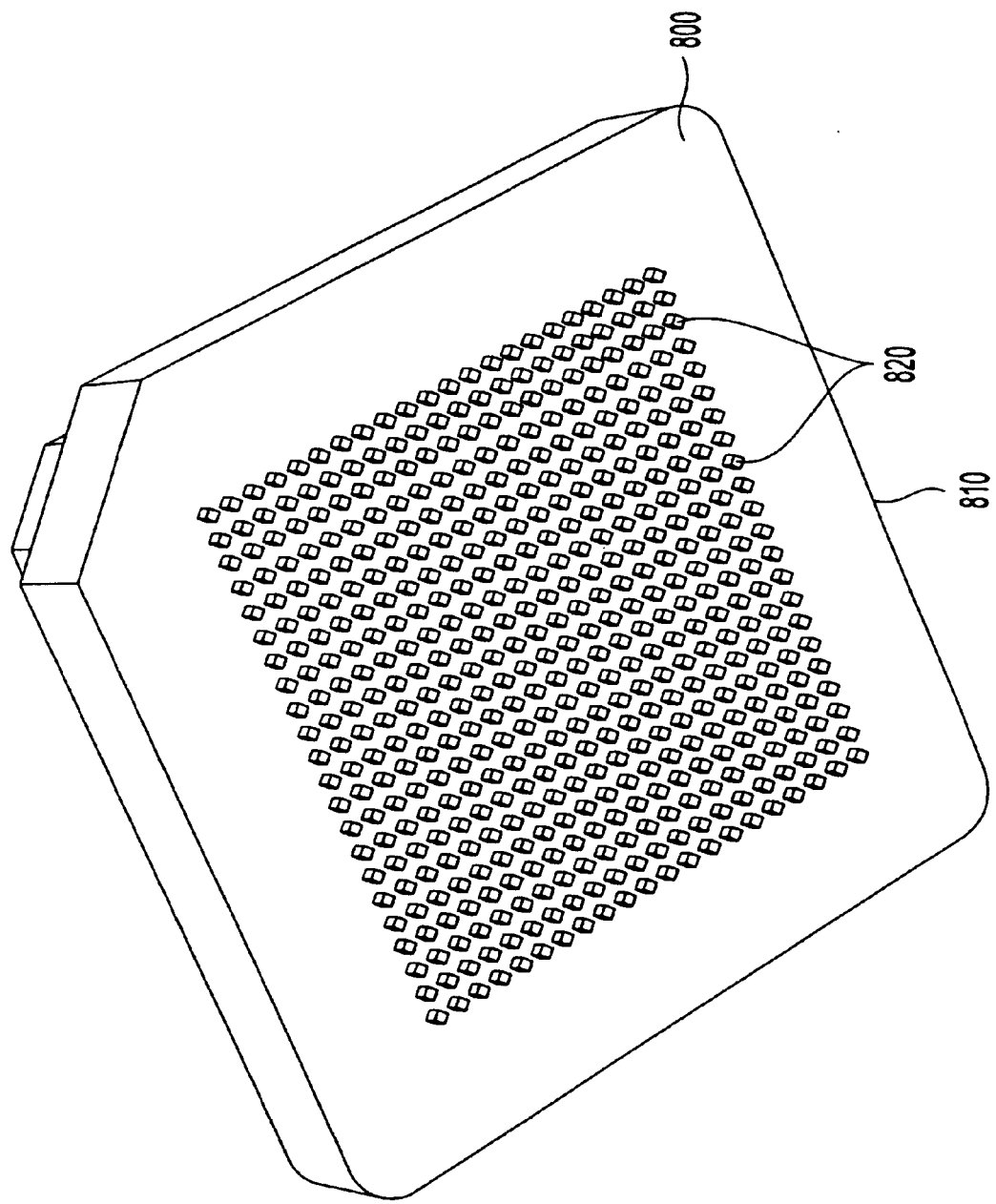
FIG. 54 illustrates a bottom view of the socket of the exemplary device arrangement of FIG. 40.

FIG. 54 illustrates the bottom of the socket 800. The leads 820 may extend from the bottom surface of the main body 810 in an array pattern. The leads 820 may connect to a substrate, such as a PCB, for example. The bottom of main body 810 may be provided with pegs, as described above, for example, to aid in mounting, alignment, and/or positioning.

As noted above, the capacitor blades 310 may be replaced by a capacitor module, such as shown in FIGS. 13–23. In such case, the pins 340, 345 of the capacitor module may interface (directly or indirectly) with the pins 400 to permit electrical connection between the substrate or chip and the socket 800.

Figure 55:
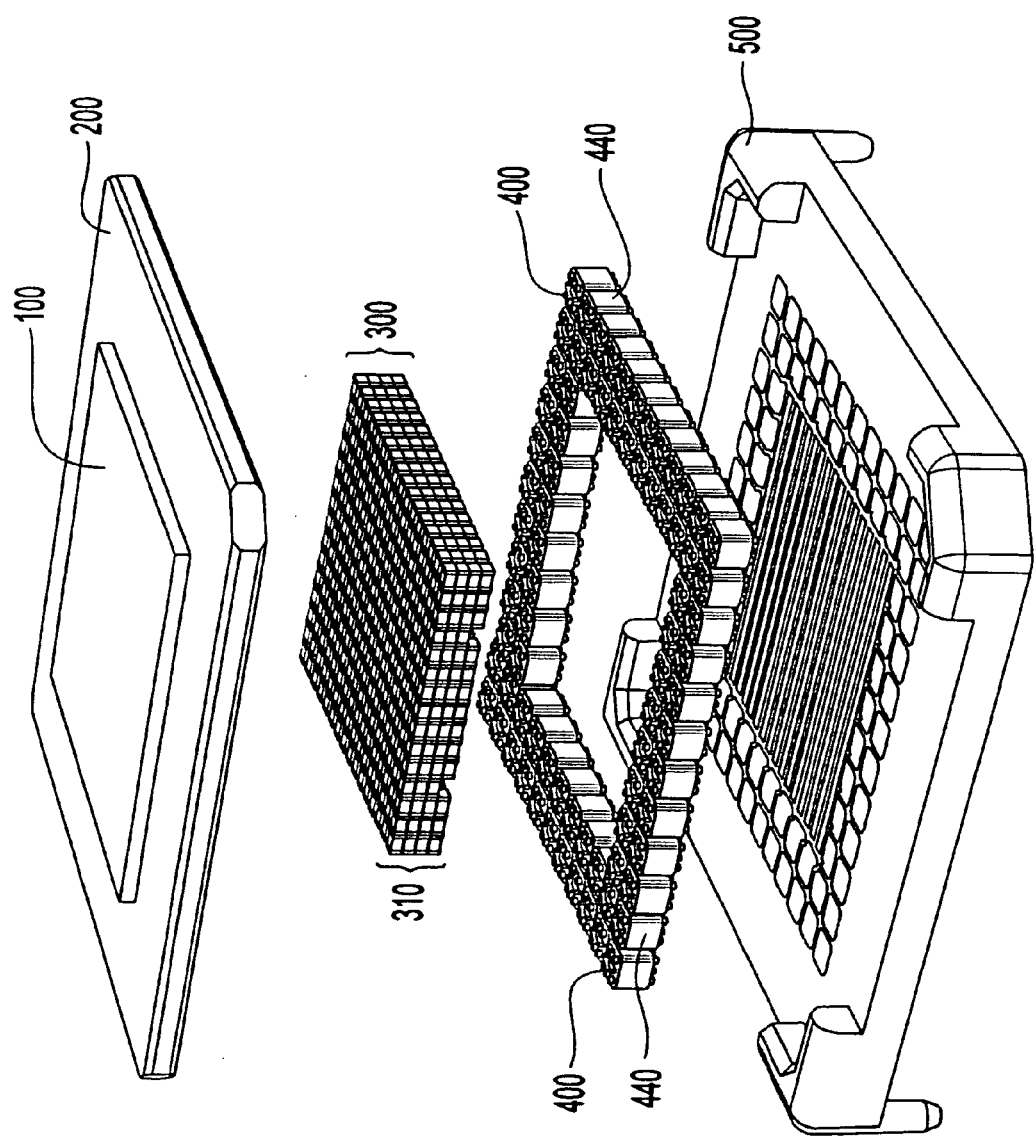
FIG. 55 illustrates an exploded view of an exemplary device arrangement in accordance with a further embodiment of the invention.

FIG. 55 illustrates an exploded view of an exemplary device arrangement in accordance with a further embodiment of the invention. Similar to the embodiment of FIG. 3, the device arrangement includes a chip 100, a substrate 200, a capacitor block 300, pins 400, and an interposer main body 500. Pins 400 are provided in pin modules 440, as described in greater detail below. The chip 100, substrate 200, capacitor block 300, and interposer main body 500 are similar to those described above. It should be noted that, while capacitor block 300 is shown to have multiple capacitor blades 310, a capacitor module, such as that shown in FIG. 13, may be provided instead.

Figure 56:
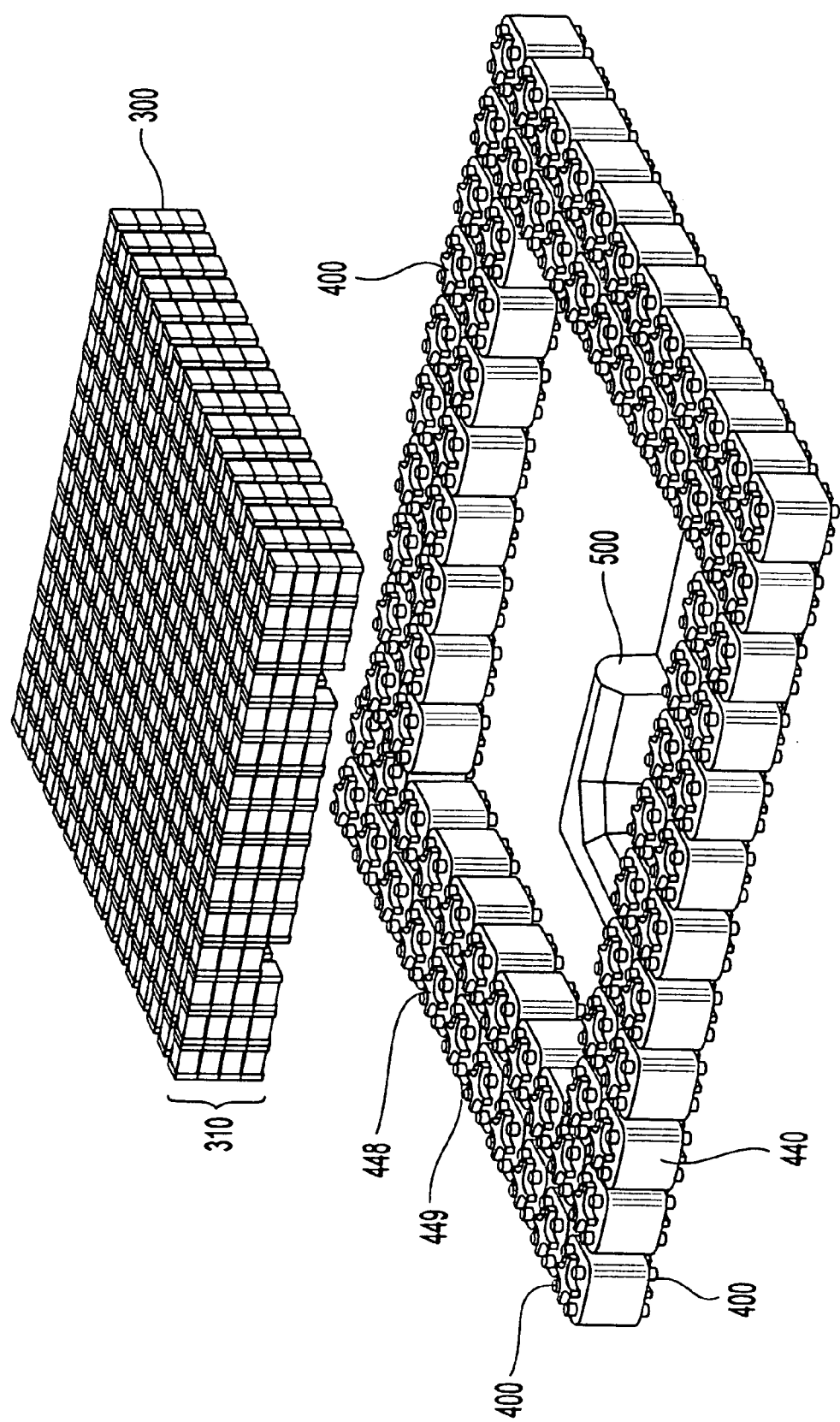
FIG. 56 illustrates an close-up exploded view of the exemplary pin and capacitor blade arrangement in accordance with FIG. 55.
Figure 57:
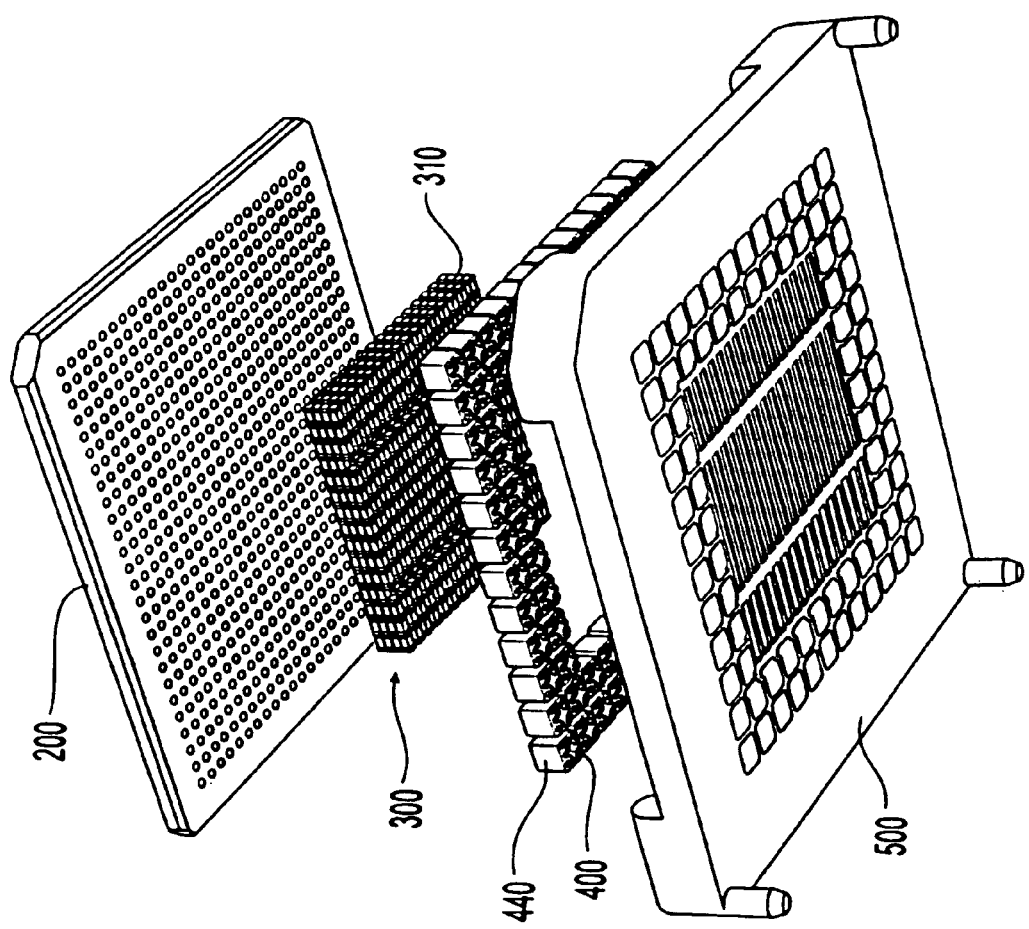
FIG. 57 illustrates a further exploded view of the exemplary device arrangement of FIG. 55.
Figure 58:
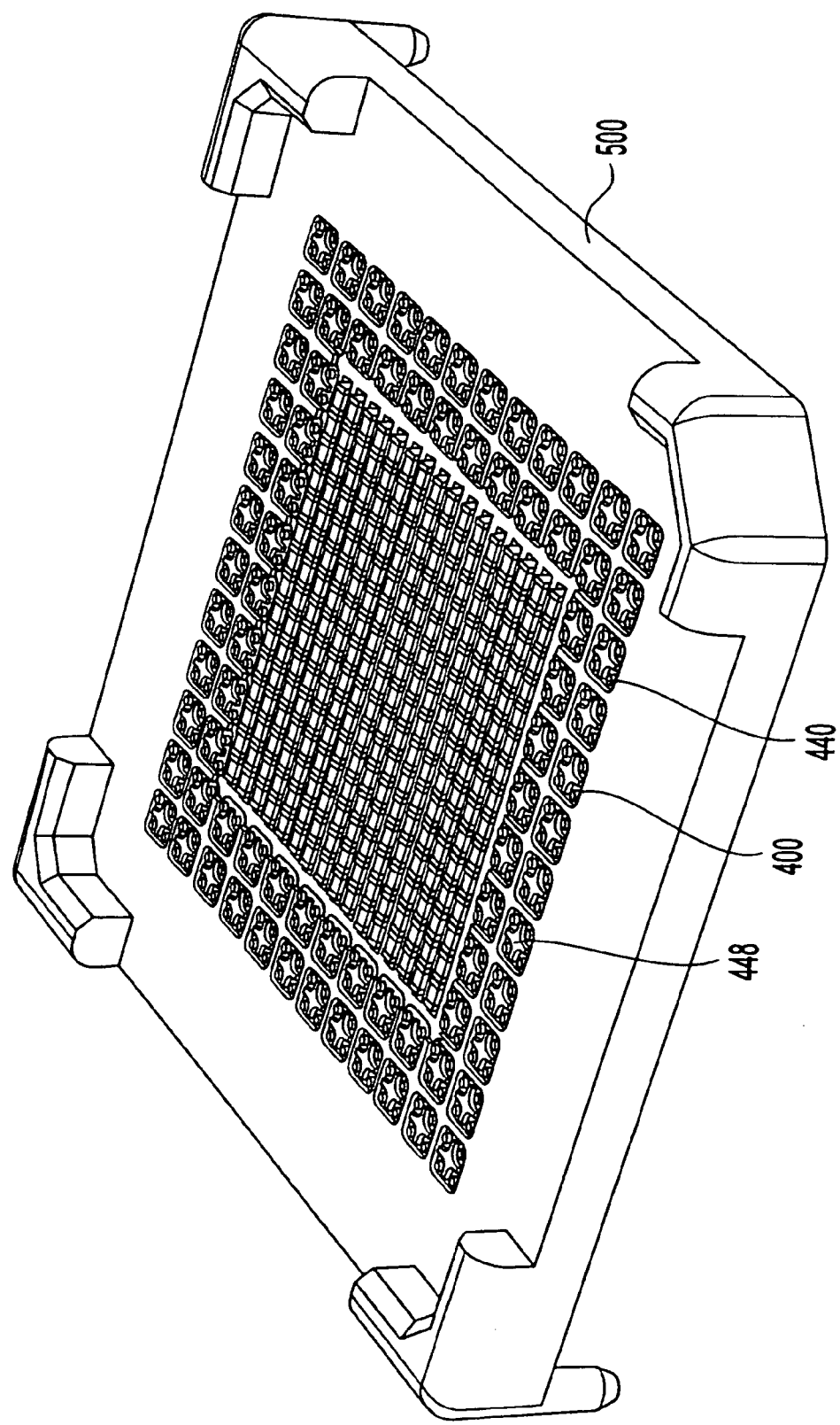
FIG. 58 illustrates an exemplary interposer arrangement consistent with FIG. 55.
Figure 59:
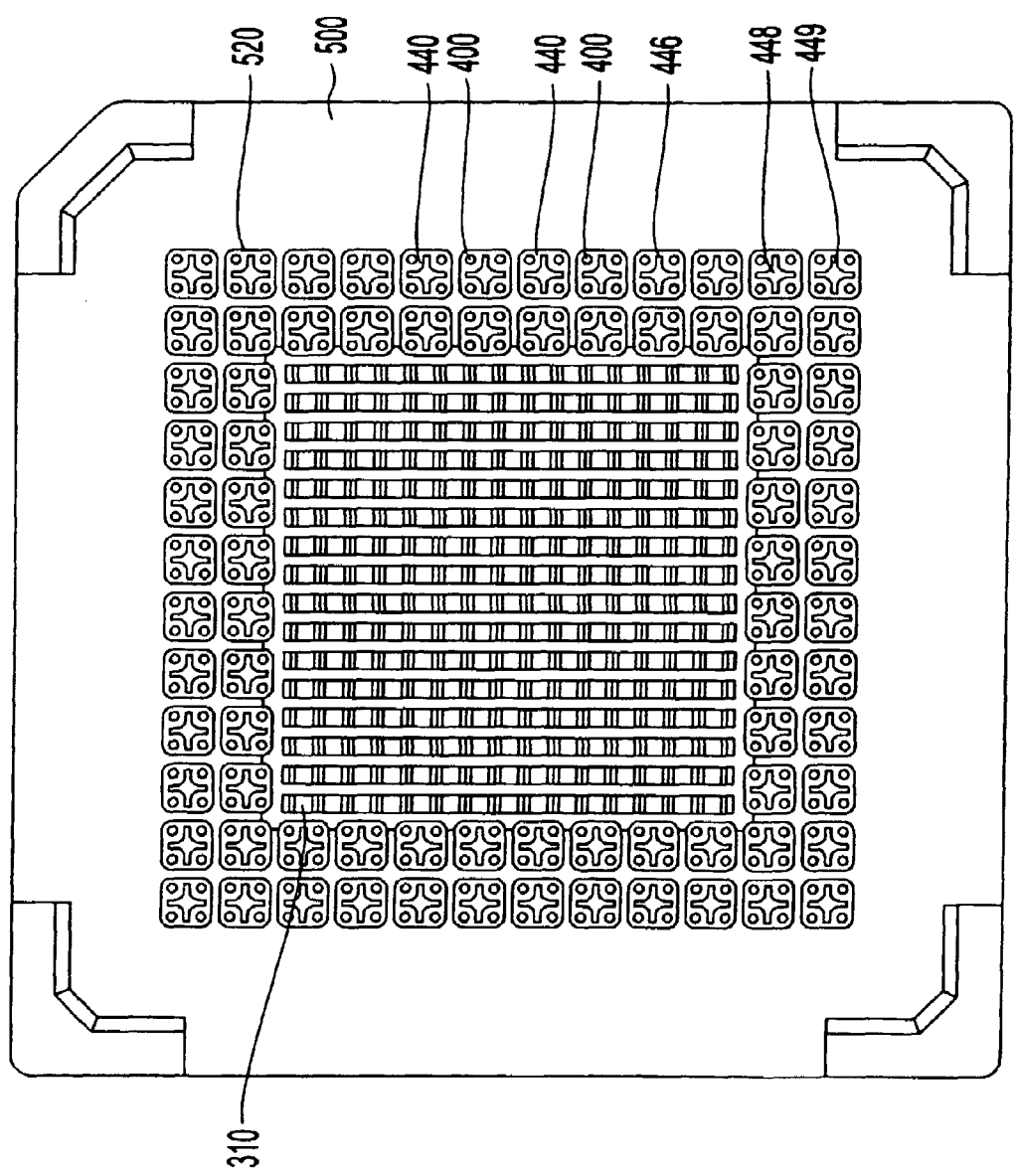
FIG. 59 illustrates the interposer arrangement of FIG. 58 from above.
Figure 60:
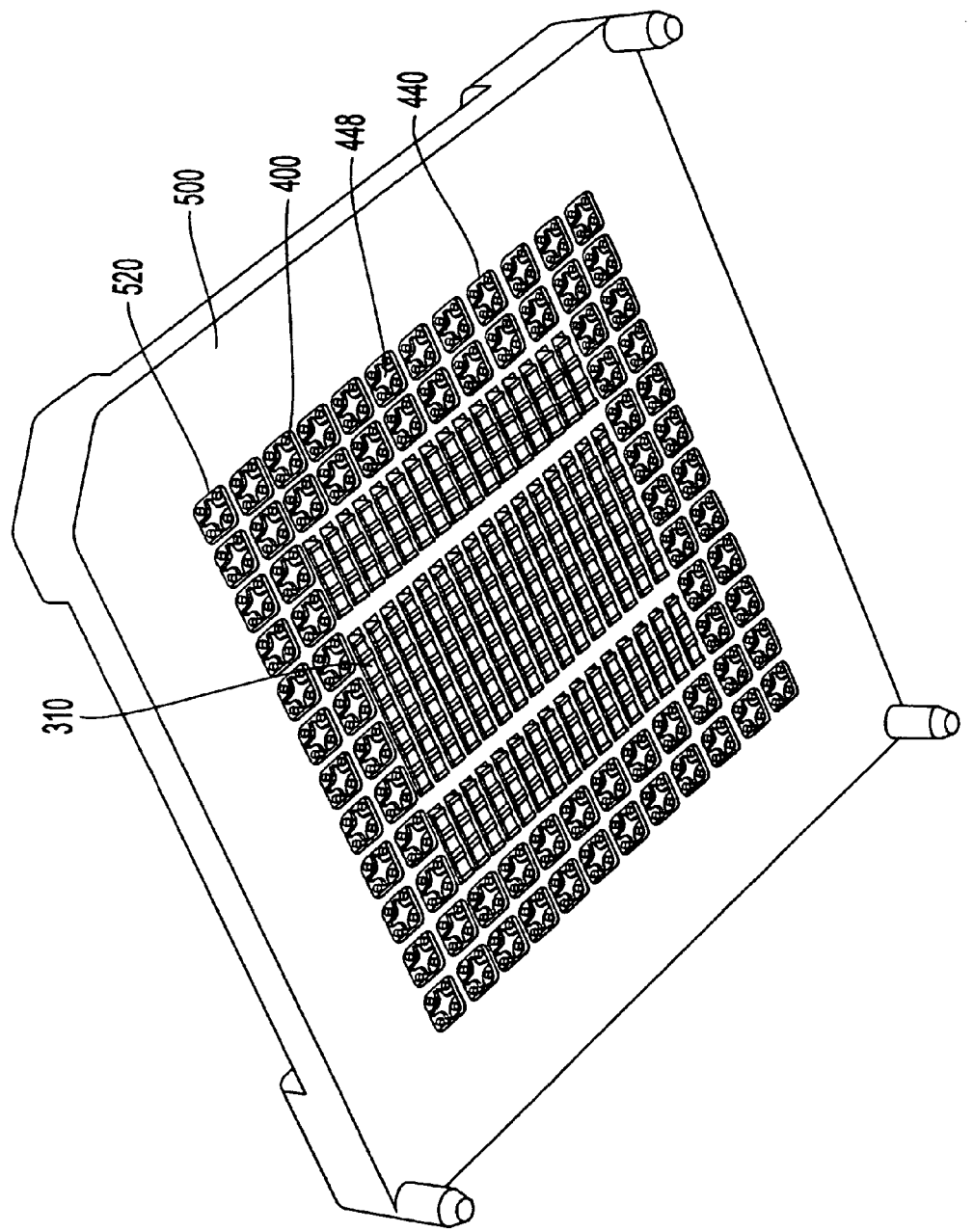
FIGS. 60 and 61 illustrate the interposer arrangement of FIG. 58 from below.
Figure 61:
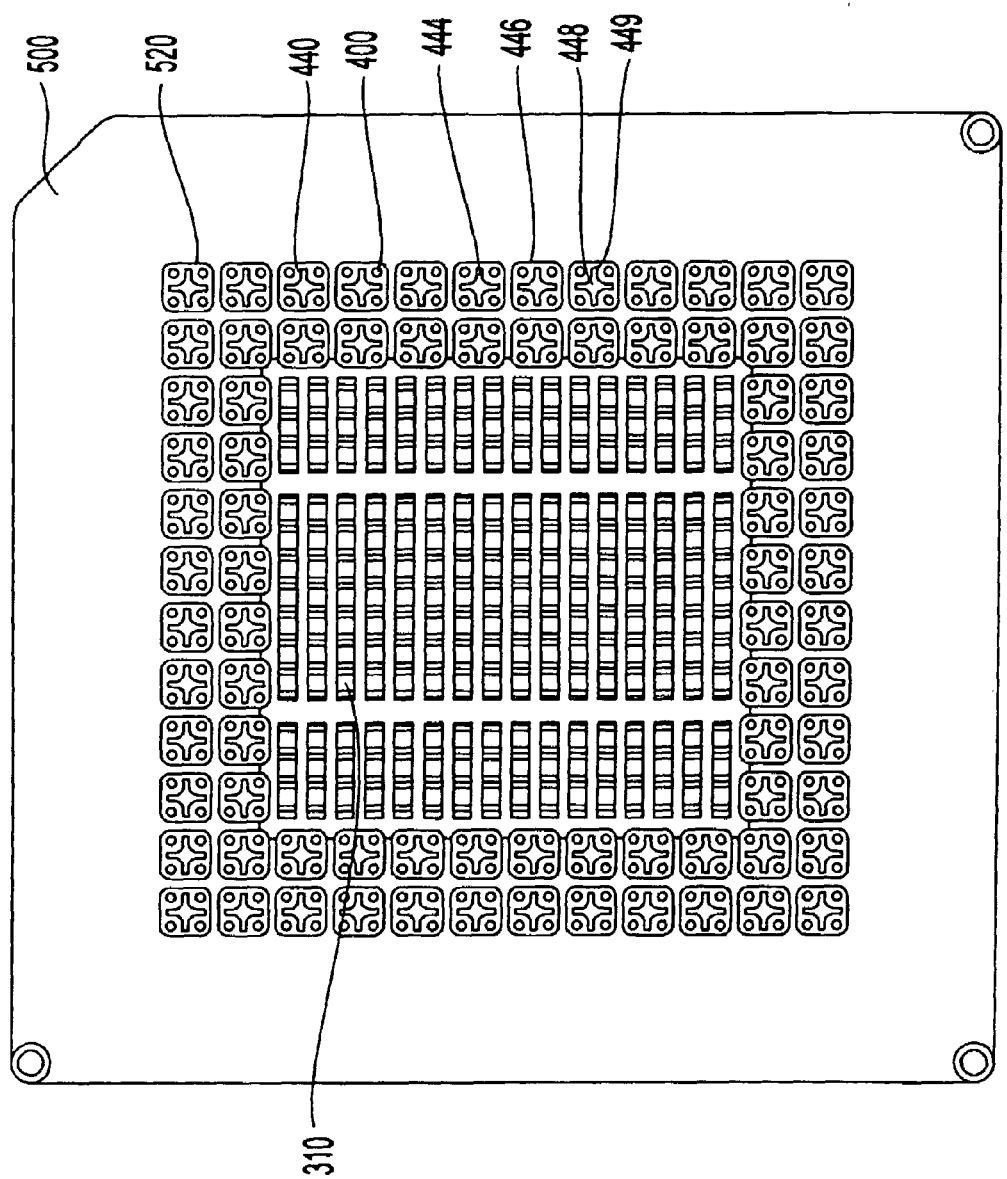
Figure 62:
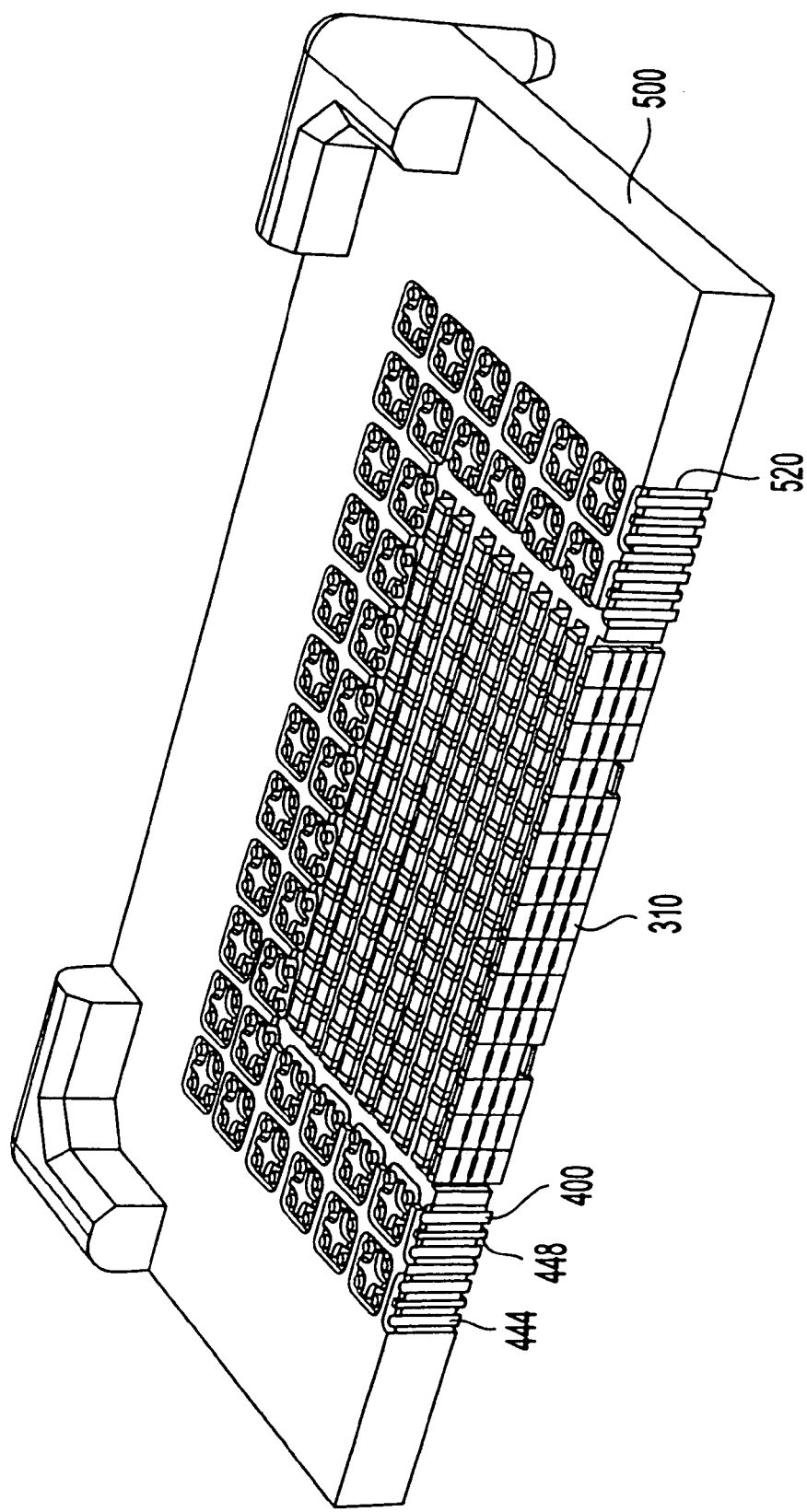
FIGS. 62, 63, and 64 illustrate cross sectional view of the interposer arrangement of FIG. 58.
Figure 63:
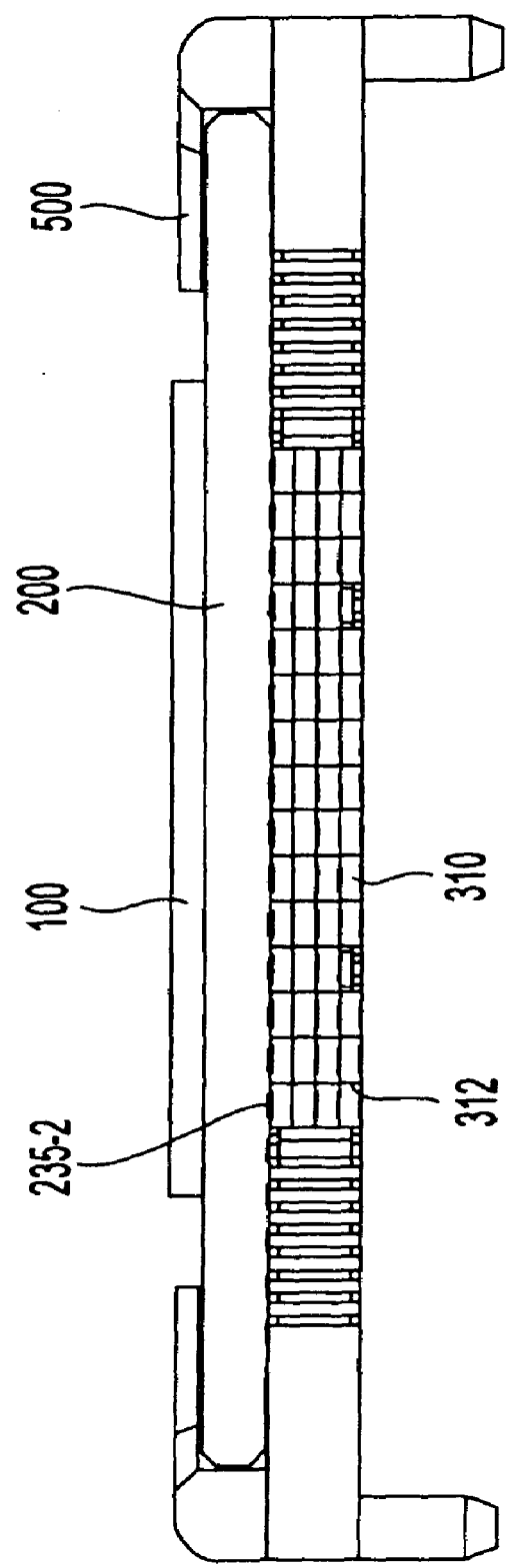
Figure 64:
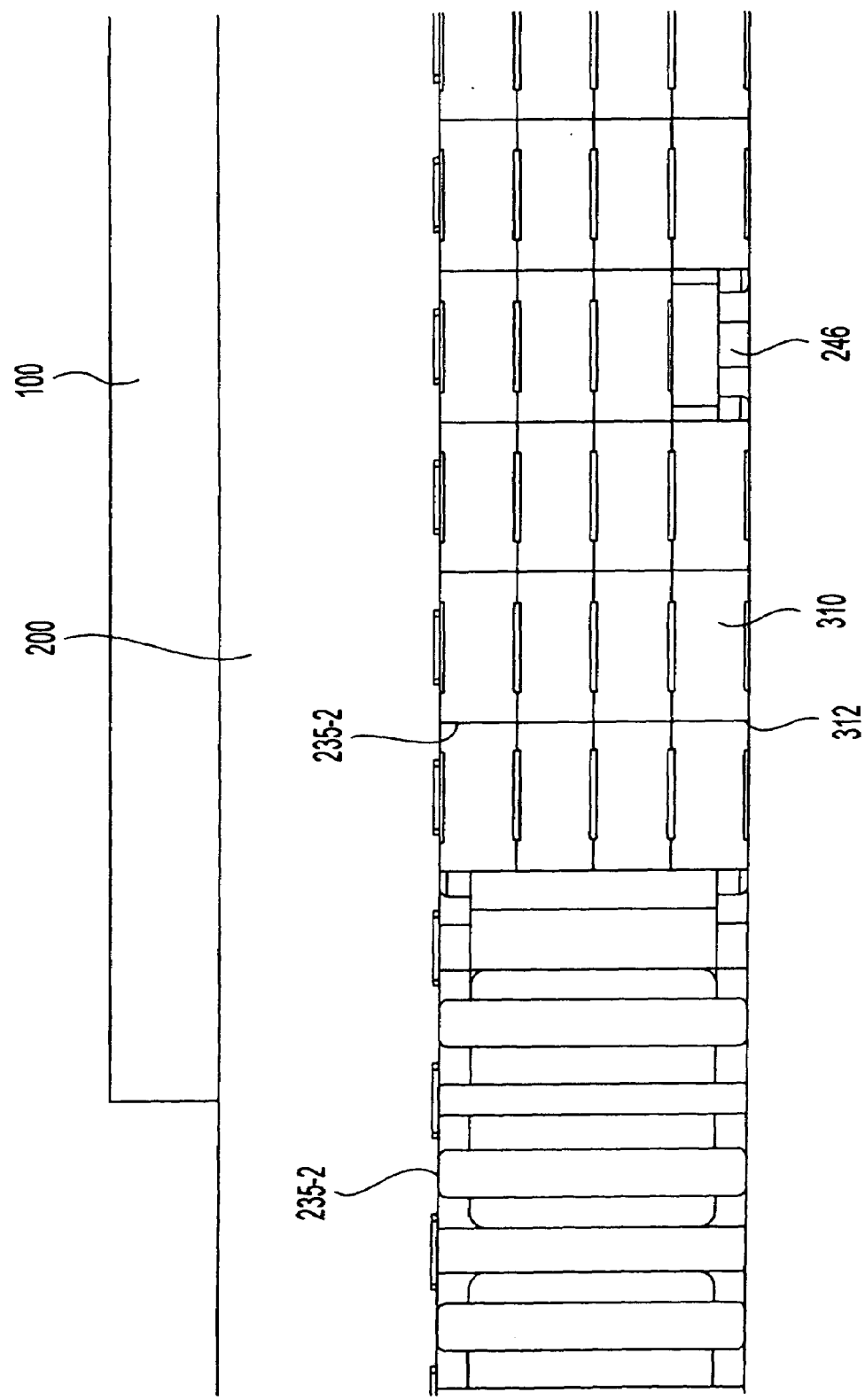
Figure 65:
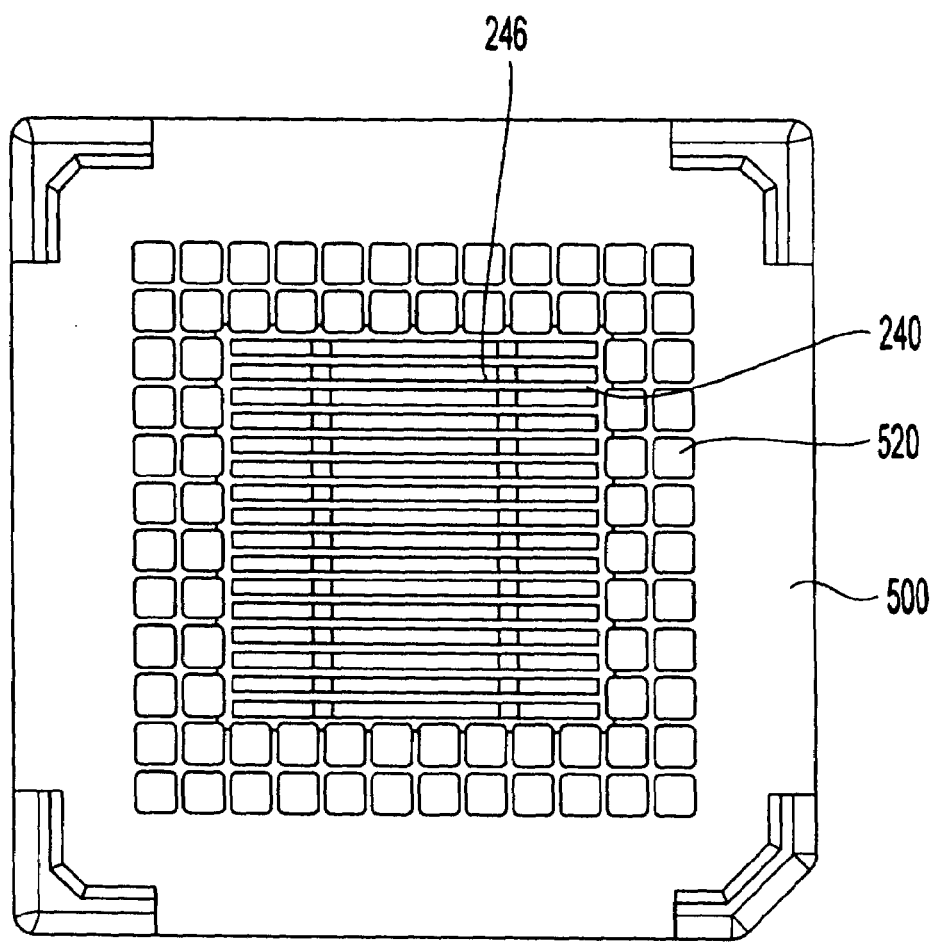
FIG. 65 illustrates a top view of the main body 500.
Figure 66:
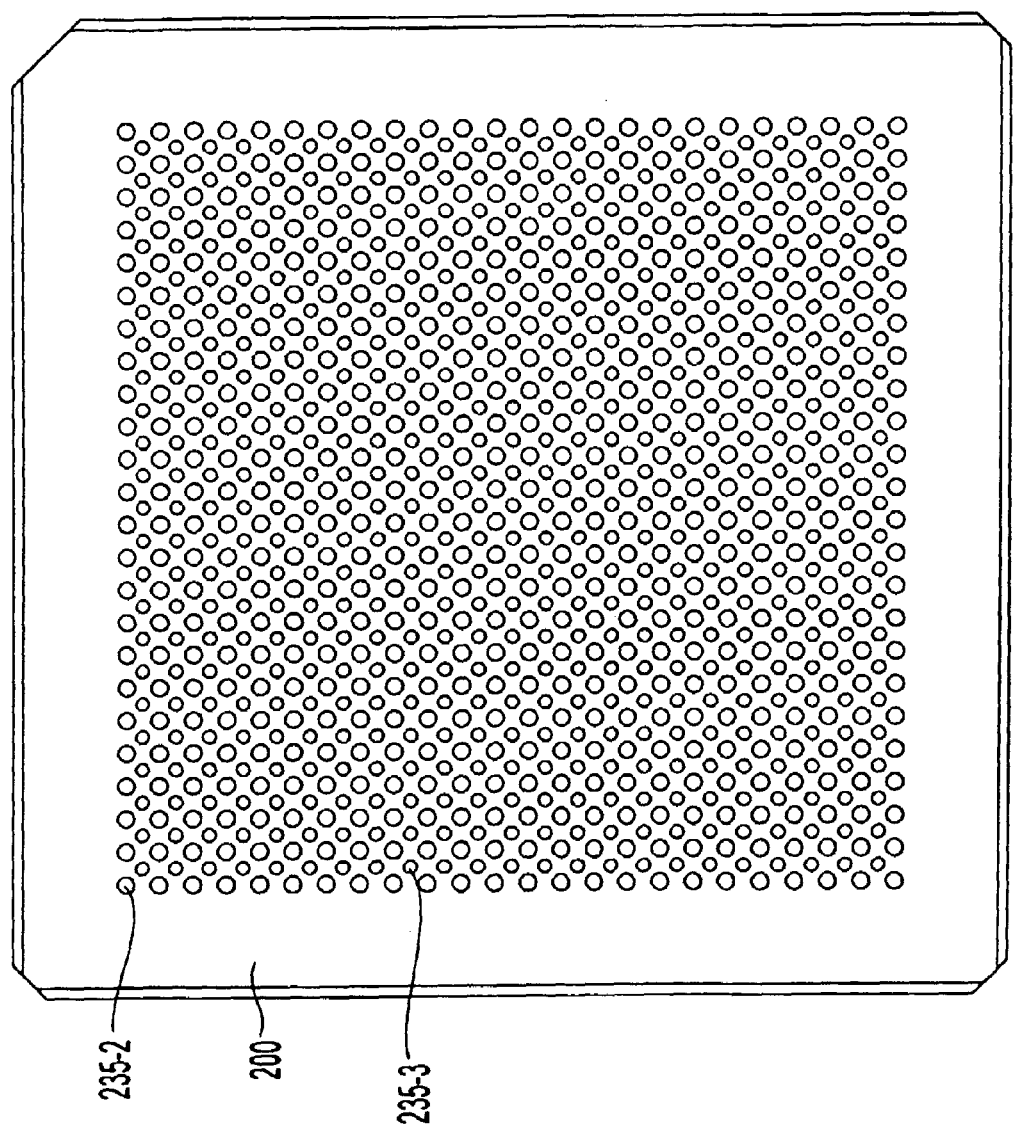
FIG. 66 illustrates an exemplary embodiment of the lower surface of a substrate 200 consistent with FIG. 55.

FIG. 56 illustrates an close-up view of the exemplary pin and capacitor blade arrangement in accordance with FIG. 55. FIG. 57 illustrates a further exploded view of the exemplary device arrangement of FIG. 55. FIG. 58 illustrates an exemplary interposer arrangement consistent with FIG. 55. FIG. 59 illustrates the interposer arrangement of FIG. 58 from above. FIGS. 60 and 61 illustrate the interposer arrangement of FIG. 58 from below. FIGS. 62, 63, and 64 illustrate cross sectional view of the interposer arrangement of FIG. 58. FIG. 65 illustrates a top view of the main body 500. FIG. 66 illustrates the lower surface of the substrate 200, which includes landing pads 235-2, 235-3 for connection to pins 400 and to the conductive paths 312 of the capacitor blades 310. While FIG. 66 shows that the landing pads 235-2, 235-3 may be differently sized, these pads may be the same size.

Figure 67:
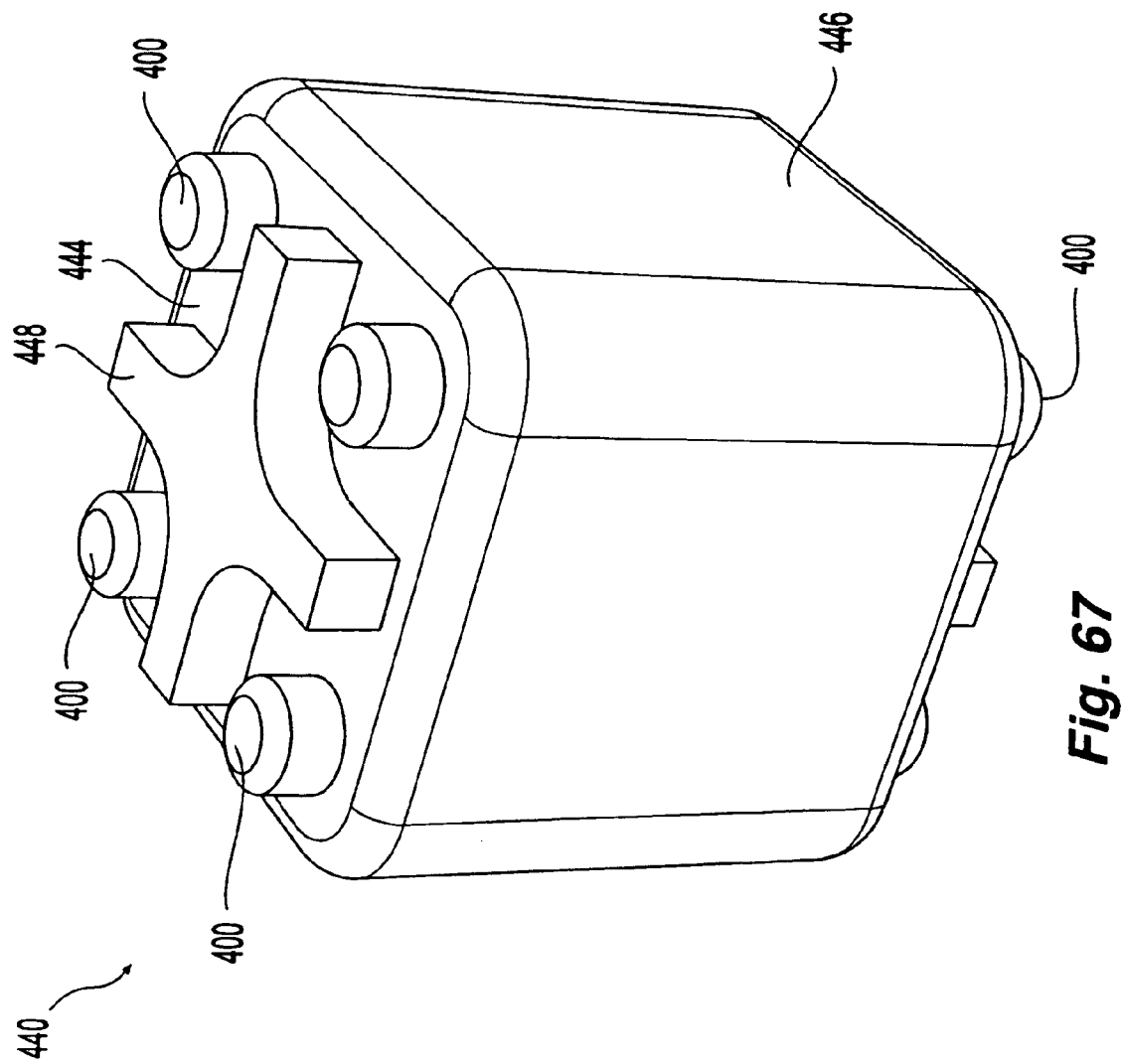
FIG. 67 illustrates an exemplary pin module consistent with the exemplary embodiment of FIG. 55.
Figure 68:
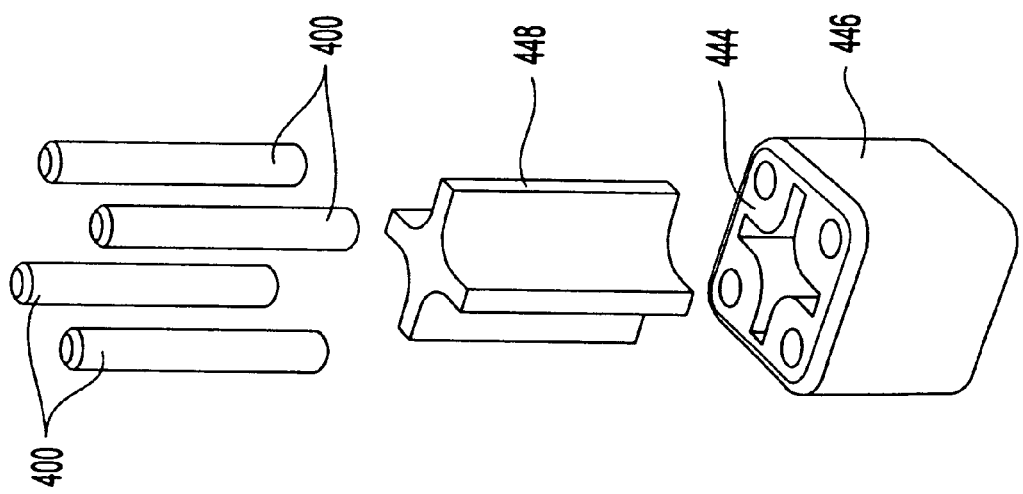
FIG. 68 illustrates an exploded view of the exemplary pin module of FIG. 67.

As shown, the pins 400 are provided as part of pin modules 440. FIG. 67 illustrates a pin module 440 and FIG. 68 illustrates an exploded view of the pin module 440 of FIG. 67. Each of the pin modules 440 may include a plurality of pins 400. In the example, four pins 400 are provided for each module 440. But it should be appreciated that another number of pins 400 may be provided per module 440, such as 2, 3, or 5 or more pins.

The pins 400 are held in an insulative material 444, such as a polymer material. For example, the insulative material 444 may be polytetrafluoroethelyne or a liquid crystal polymer. The outer side surfaces of the insulative material 444 may be plated with an electrically-conductive material 446, such as copper or gold, for example. As shown in FIG. 67, the plating 446 may extend entirely around the side surfaces of the insulative material 444. The pins 400 may extend vertically (i.e., from the perspective shown in FIG. 55 or 67) beyond the conductive plating 446. Alternatively, the plating 446 may extend the same distance as the pins 400, or even longer, to enable the plating 446 to form one or more electrical connections to an electrical potential, e.g., to ground potential. As an alternative, or in addition, to plating 446, a conductive material may be provided at hole 520 of the main body. For example, the surface that defines hole 520 may be plated with a conductive material, thereby surrounding the pin module 440 inserted into hole 520. As above, the plating may extend the same length as pins 400, or longer or shorter than pins 400, depending on the desired arrangement.

A column 448 may be provided among the pins 400, for example, separating each from another or all others. The insulative material 444 may separate the pins 400 from the column 448. The column 448 may, for example, may have a cross-shaped cross section, as shown in FIG. 56. However, the column 448 may have other cross-sectional shapes. The column 448 may be made of an insulative material, such as a polymer, or a conductive material, such as copper, nickel, aluminum, or steel. If made of an insulative material, the column 448 may be plated with a conductive material 449, such as copper. The column 448 can function as a support or structural element and/or as a shield or additional contact.

As shown in FIG. 58, for example, the pin modules 440 may be inserted into and held within holes 520 formed in the main body 500. The modules 440 may be held within the holes 520 using a mechanical mechanism, such as friction, a snap, stake, ledge, protrusion, clip and/or notch, for example, and/or using an adhesive or weld. One of the advantages of modules 440 is that they may be used with packages having different numbers of inputs/outputs.

Figure 69:
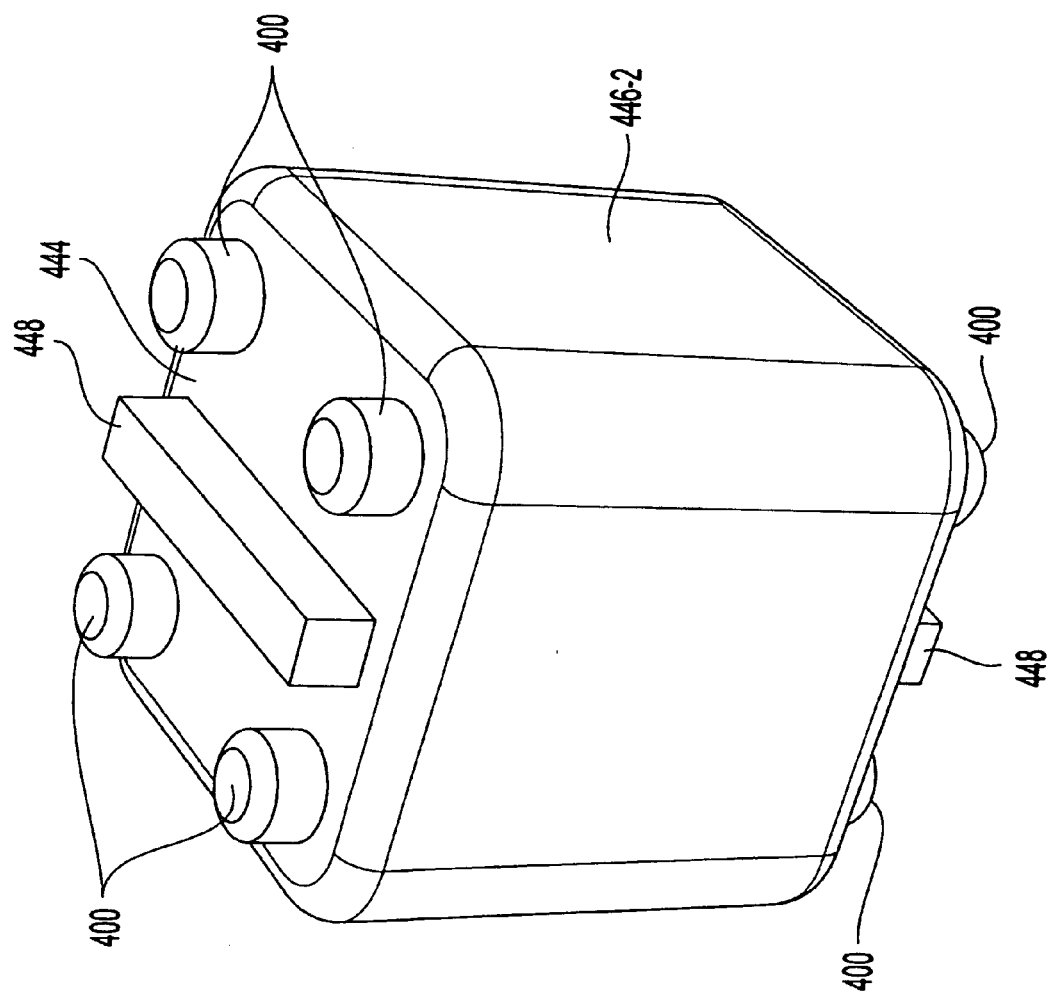
FIG. 69 illustrates a further exemplary embodiment of pin module according to the present invention.
Figure 70:
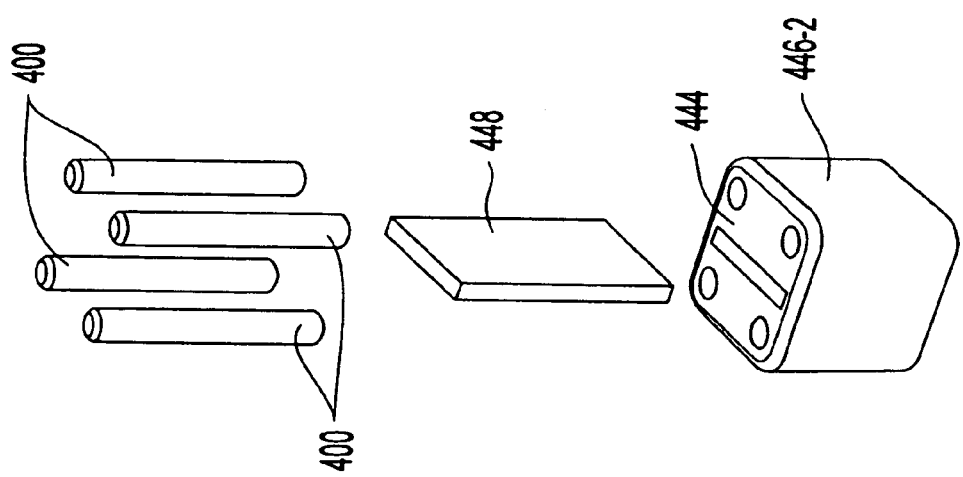
FIG. 70 illustrates an exploded view of the pin module according to FIG. 69.

FIGS. 69–70 illustrate a further exemplary embodiment of pin module 440 according to the present invention. The module 440 shown in FIG. 69–70 may be used with a device arrangement similar to that of FIGS. 55–68. In the example of FIGS. 69–70, the pin module 440 includes four pins 400, insulative material 444, and plating 446-2 similar to that of the embodiment in FIGS. 67–68. In contrast, the column 448 in FIGS. 69–70 has a rectangular cross-section. The column 448 separates two pins 400 of a module 440 from the other two pins 400 of the module. As above, the column 448 may be made from an insulative material, a conductive material, or a plated insulative material. Using a conductive material or a plated insulative material, the column 448 may shield one pair of pins 400 from the other pair of pins of the module 440. According to this arrangement, the adjacent pairs of pins 400 may be operated to carry differential signal pairs.

Figure 71:
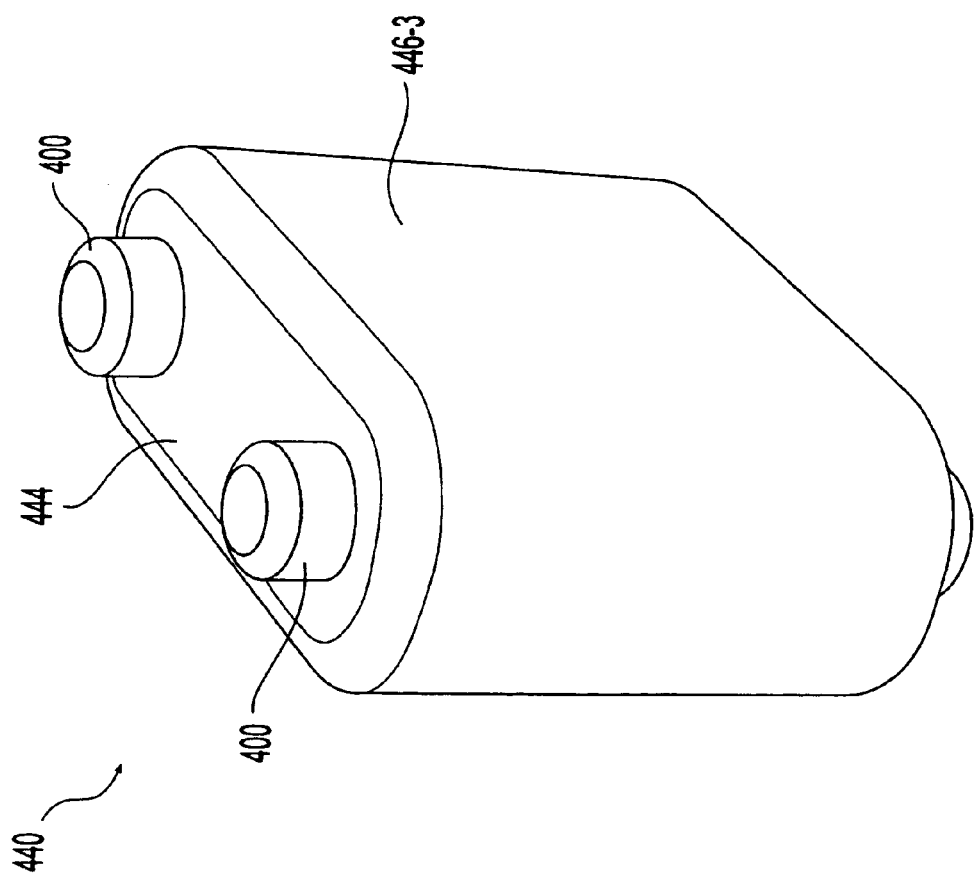
FIG. 71 illustrates a further exemplary embodiment of pin module according to the present invention.
Figure 72:
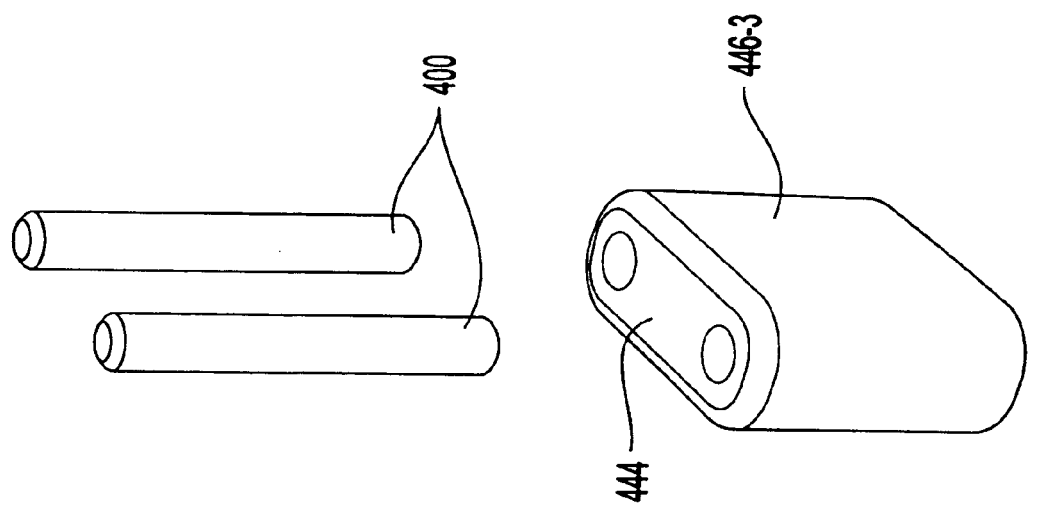
FIG. 72 illustrates an exploded view of the pin module according to FIG. 71.
Figure 73:
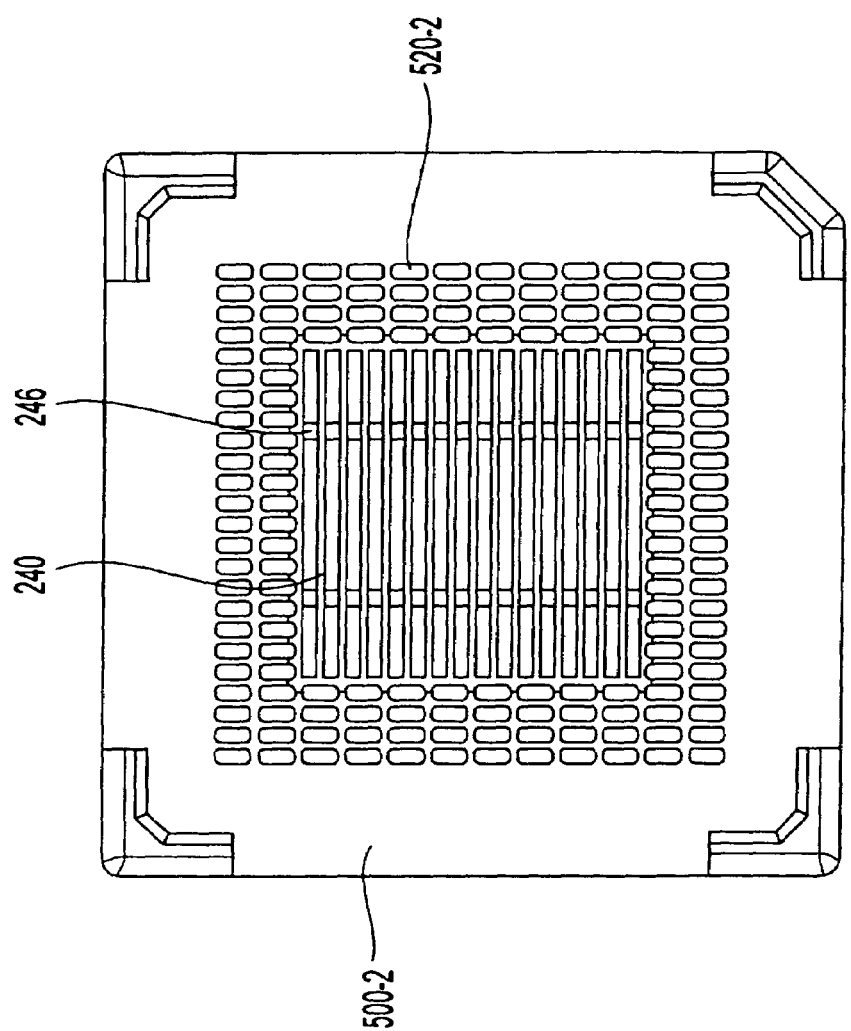
FIG. 73 illustrates an exemplary embodiment of an interposer main body consistent with the pin module of FIG. 71.
Figure 74:
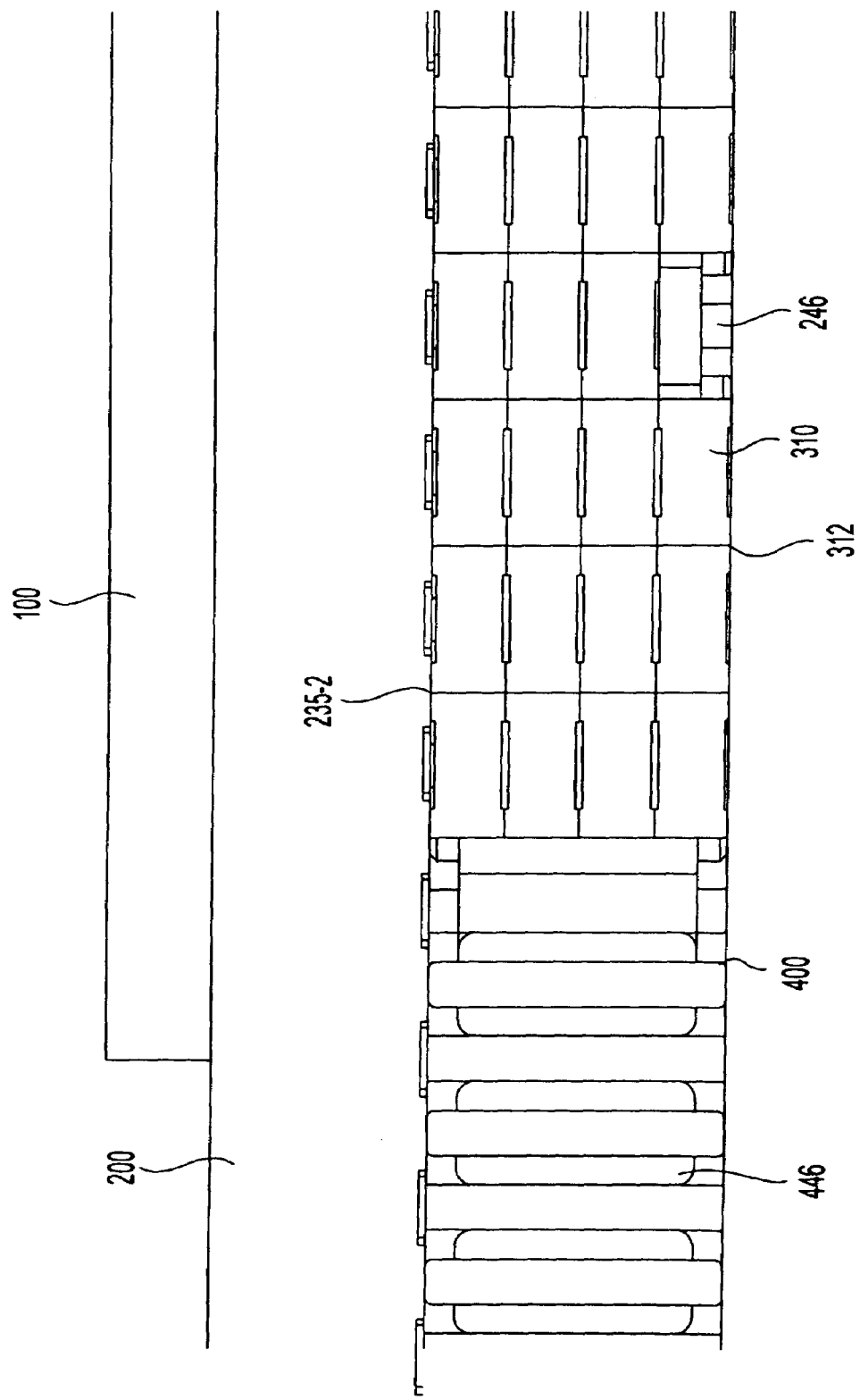
FIG. 74 illustrates an exploded cross section of the interposer main body of FIG. 73 with pin modules of FIG. 71.

FIGS. 71–74 illustrate a further embodiment similar to those of FIGS. 55–70. FIG. 71 illustrates an alternative design for a pin module 440. FIG. 72 illustrates an exploded view of the pin module 440 illustrated in FIG. 71. As shown in FIGS. 71 and 72, the pin module 440 includes two pins 400. The pins 400 are separated from each other by insulative material 444. The insulative material 444 may be, for example, a solid material, such as a polymer (e.g., a liquid crystal polymer or polytetraflouroethylene). The outer side surfaces of the insulative material 444 may be plated with a conductive material 446-3, for example, copper, as noted above. While FIG. 71 shows that the pins 400 extend vertically beyond the plating 446-3, it is possible for the plating 446-3 to extend the same distance or greater than the pins 440, as noted above. FIG. 73 illustrates an interposer main body 500-2 having holes 520-2 for receiving pin modules 440 and a capacitor tray 240 for receiving multiple capacitor blades 310. As above, in addition or instead of plating 446-3, a conductive material may be provided at holes 520-2, in the manner described above. FIG. 74 illustrates an exploded cross section of the interposer main body 500-2 with pins 400 of pin modules 440 of FIG. 71.

Figure 75:
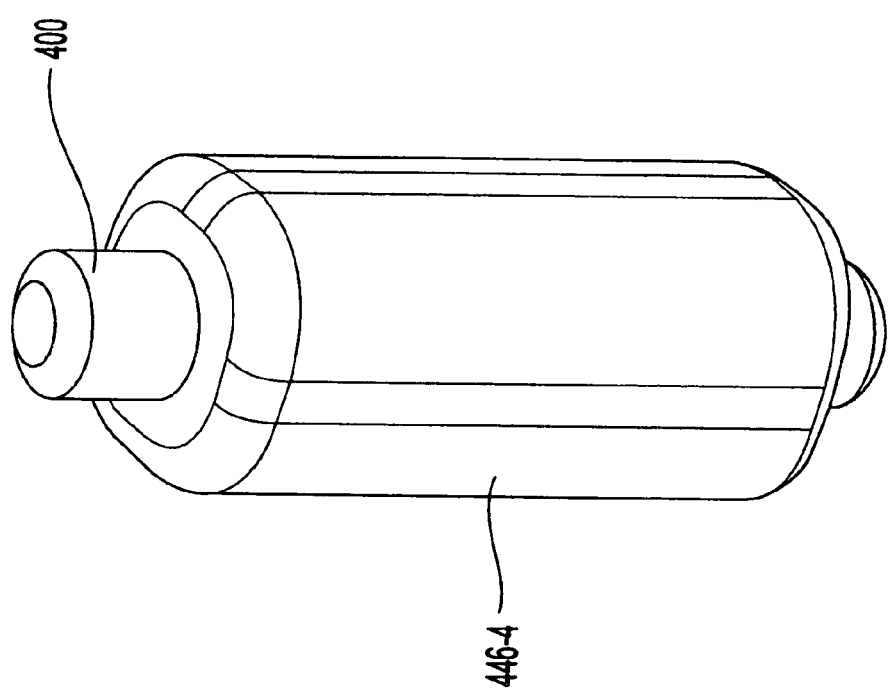
FIG. 75 illustrates a further exemplary embodiment of pin module according to the present invention.
Figure 76:
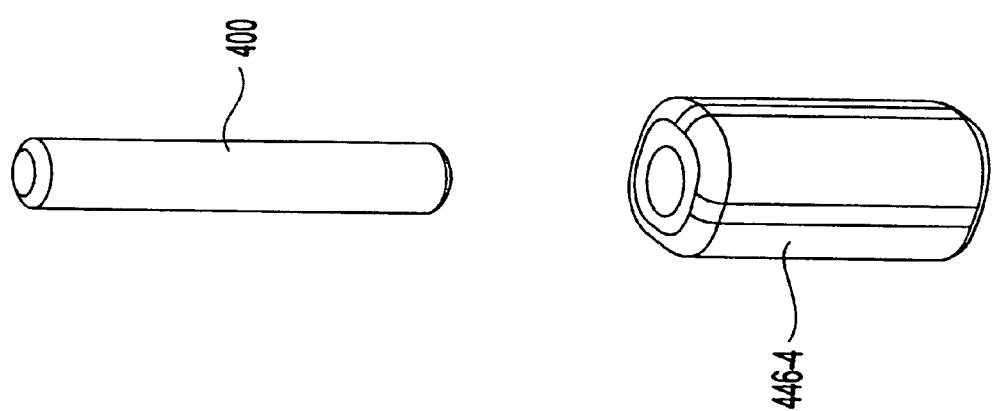
FIG. 76 illustrates an exploded view of the pin module according to FIG. 75.
Figure 77:
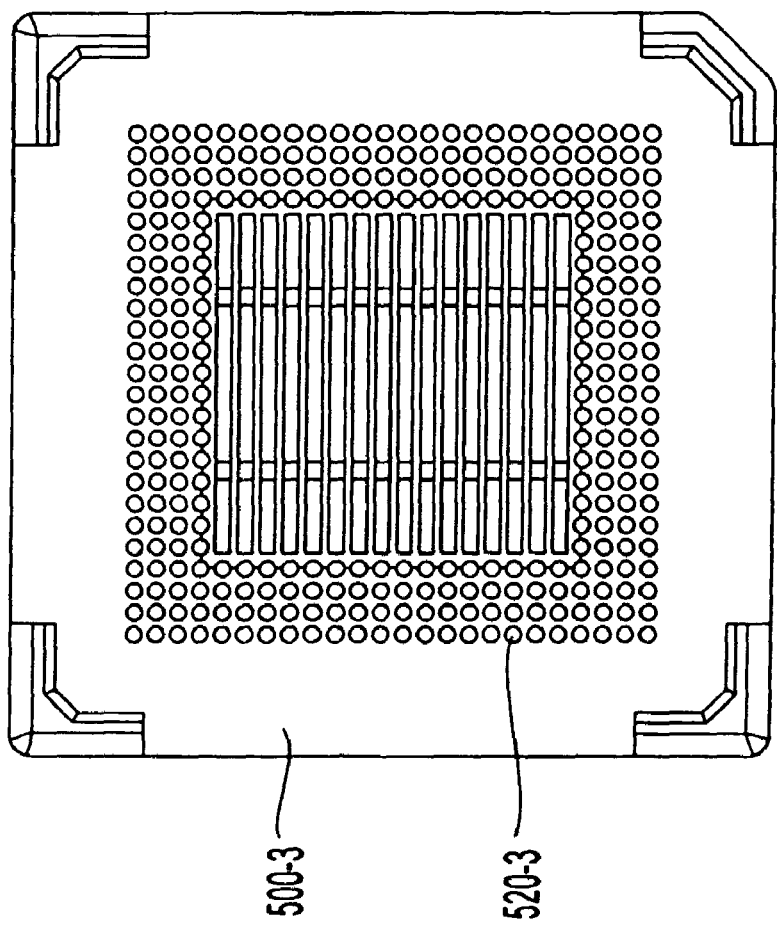
FIG. 77 illustrates an exemplary embodiment of an interposer main body consistent with the pin module of FIG. 75.
Figure 78:
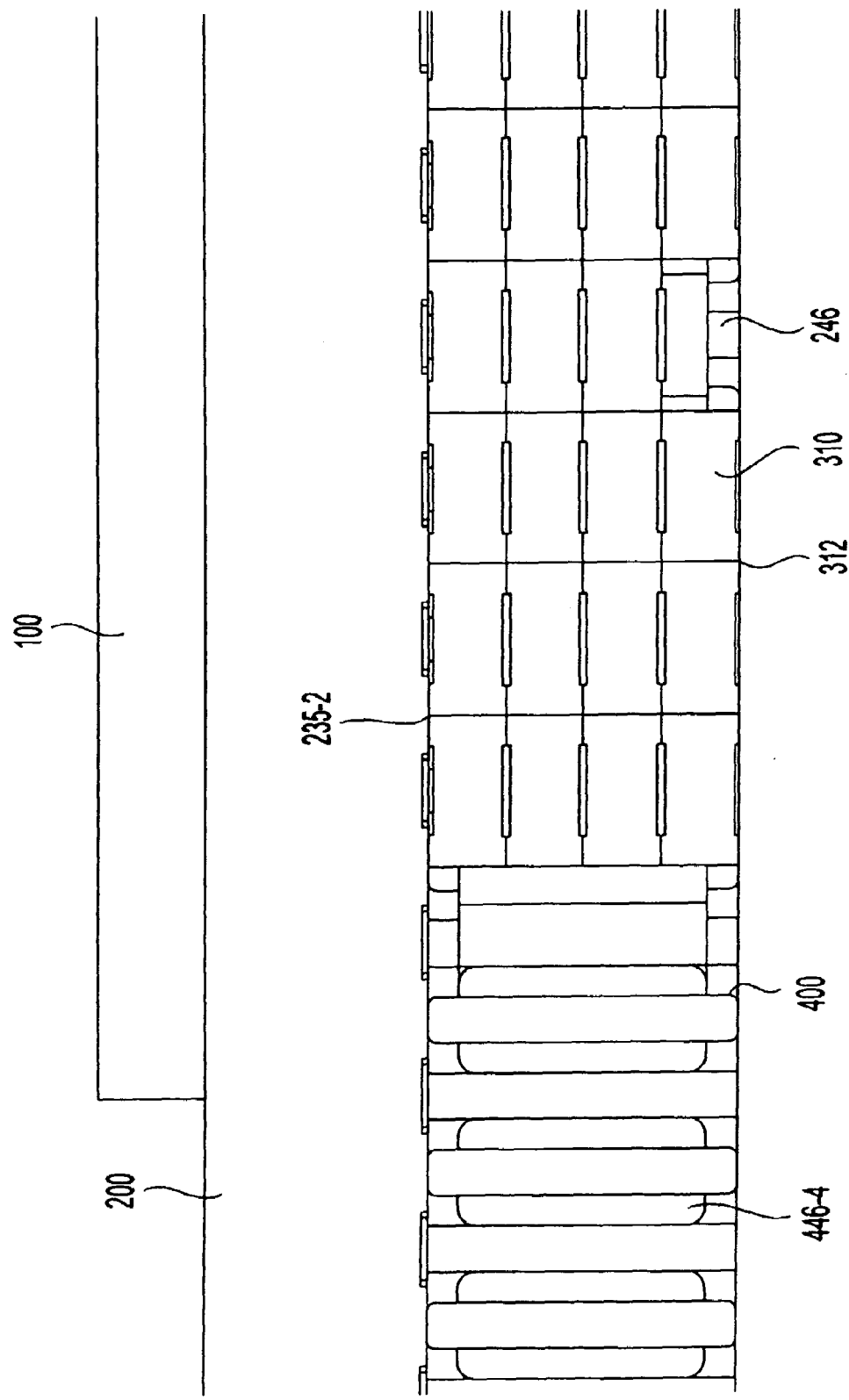
FIG. 78 illustrates an exploded cross section of the interposer main body of FIG. 77 with pin modules of FIG. 75.

FIGS. 75–77 illustrate a further embodiment similar to those of FIGS. 71–74. FIG. 75 illustrates an alternative design for a pin module 440. FIG. 76 illustrates an exploded view of the pin module 440 illustrated in FIG. 75. As shown in FIGS. 75 and 76, the pin module 440 includes a single pin 400 with an insulative material 444, such as a polymer, axially disposed around the pin 400. As above, the outer side surfaces of the insulative material 444 may be plated with a conductive material 446-4, for example, copper. Pin 400 may extend vertically beyond plating 446-4, as shown in FIG. 75, or alternatively may extend the same or less than plating 446-4. The plating 446-4 may be grounded or supplied with another potential. In effect, the pin module 440 may be similar to a co-axial arrangement. FIG. 77 illustrates an interposer main body 500-3 having holes 520-3 for receiving pin modules 440 and a capacitor tray 240 for receiving multiple capacitor blades 310. As above, in addition or instead of plating 446-4, a conductive material may be provided at holes 520-3, in the manner described above. FIG. 78 illustrates an exploded cross section of the interposer main body 500 with pins module 440 of FIG. 75.

Figure 79:
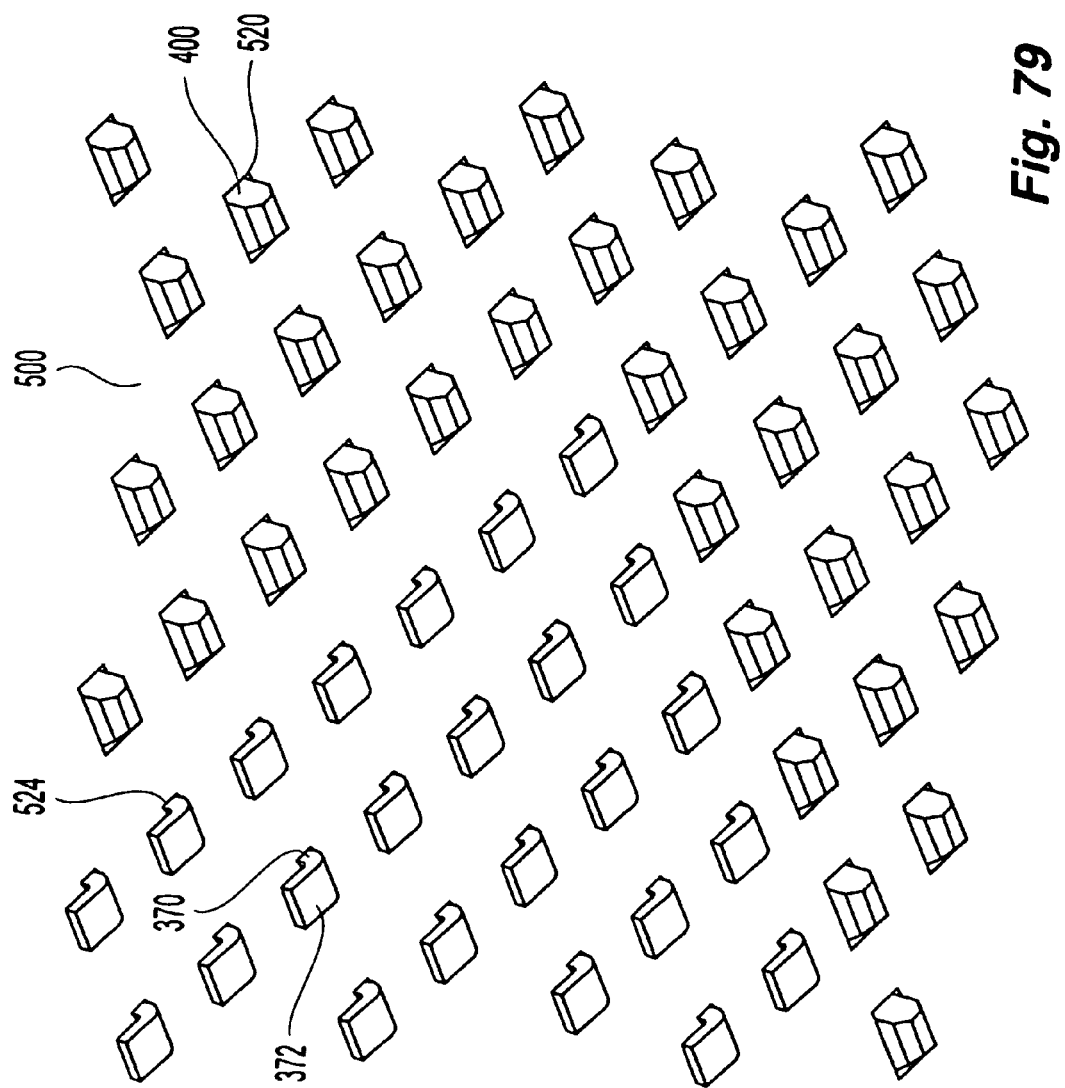
FIG. 79 illustrates the bottom pin structure of a further exemplary embodiment of the present invention.

FIG. 79 illustrates the bottom pin structure of a further exemplary embodiment of the present invention. FIG. 79 shows a close-up view of the bottom surface of main body 500, according to an exemplary embodiment of the invention. The main body 500 includes holes 520 through which pins 400 protrude. The main body further includes holes 524 through which ends 372 of capacitor pins 370 protrude. The ends 372 of capacitor pins 370 may be bent, as shown in FIG. 79, to aid in retention and/or provide a larger area for connection. Of course, the ends 372 need not be bent in other embodiments. Moreover, the pins 370 may be retained in main body 500 by other means, such as friction, an interference fits, shoulders, snaps, bumps, and/or adhesives.

Figure 80:
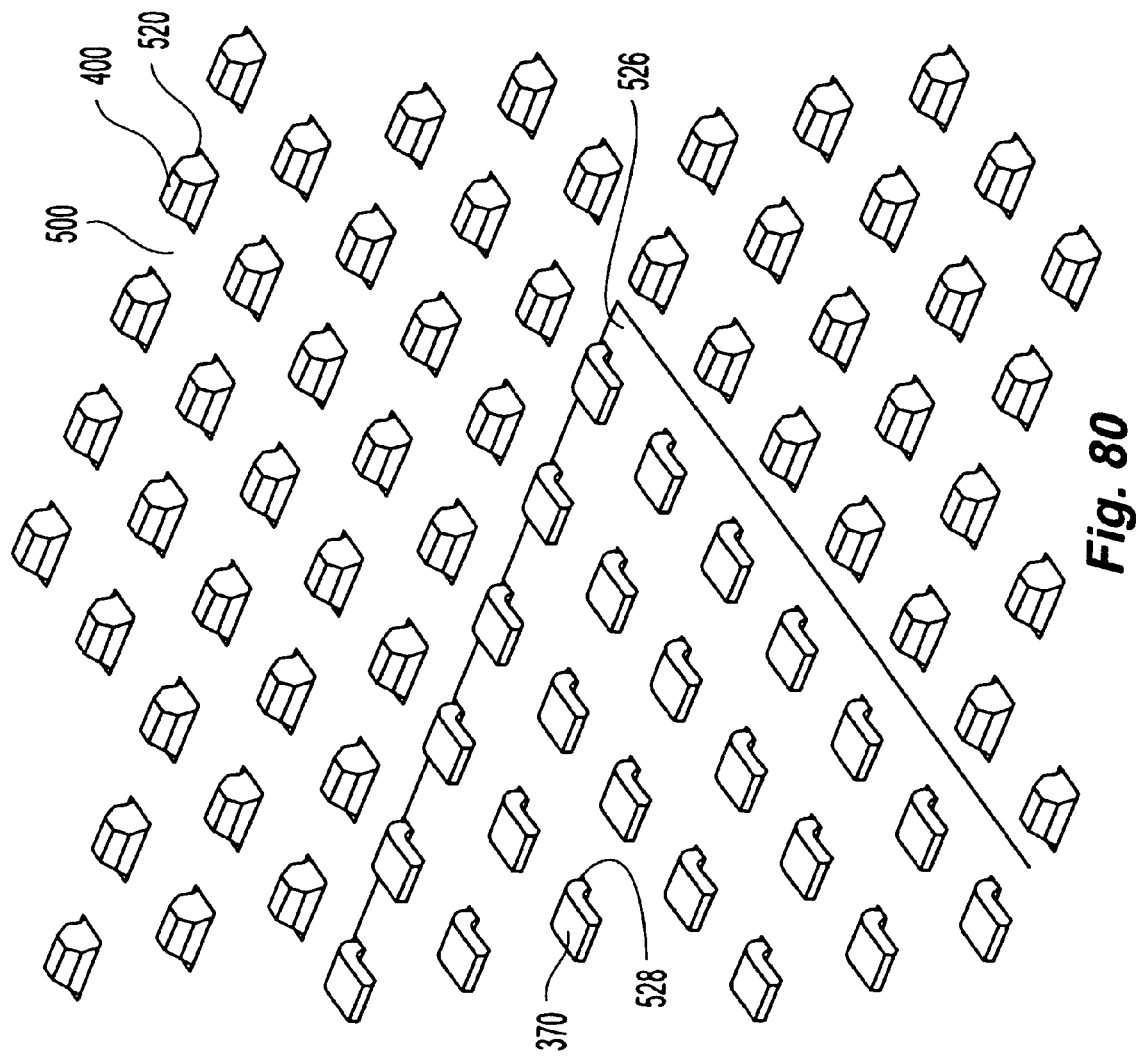
FIG. 80 illustrates the top pin structure of the embodiment of FIG. 79.

FIG. 80 illustrates the top pin structure of the embodiment of FIG. 79. As shown, the opposite ends of pins 400 protrude from holes 520 in the main body 500. The main body 500 may includes an insulative cover 526 having holes 528. The opposite ends 374 of capacitor pins 370 protrude from the holes 528. As above, the ends 374 may be bent over adjacent to or on the surface of cover 526.

Figure 81:
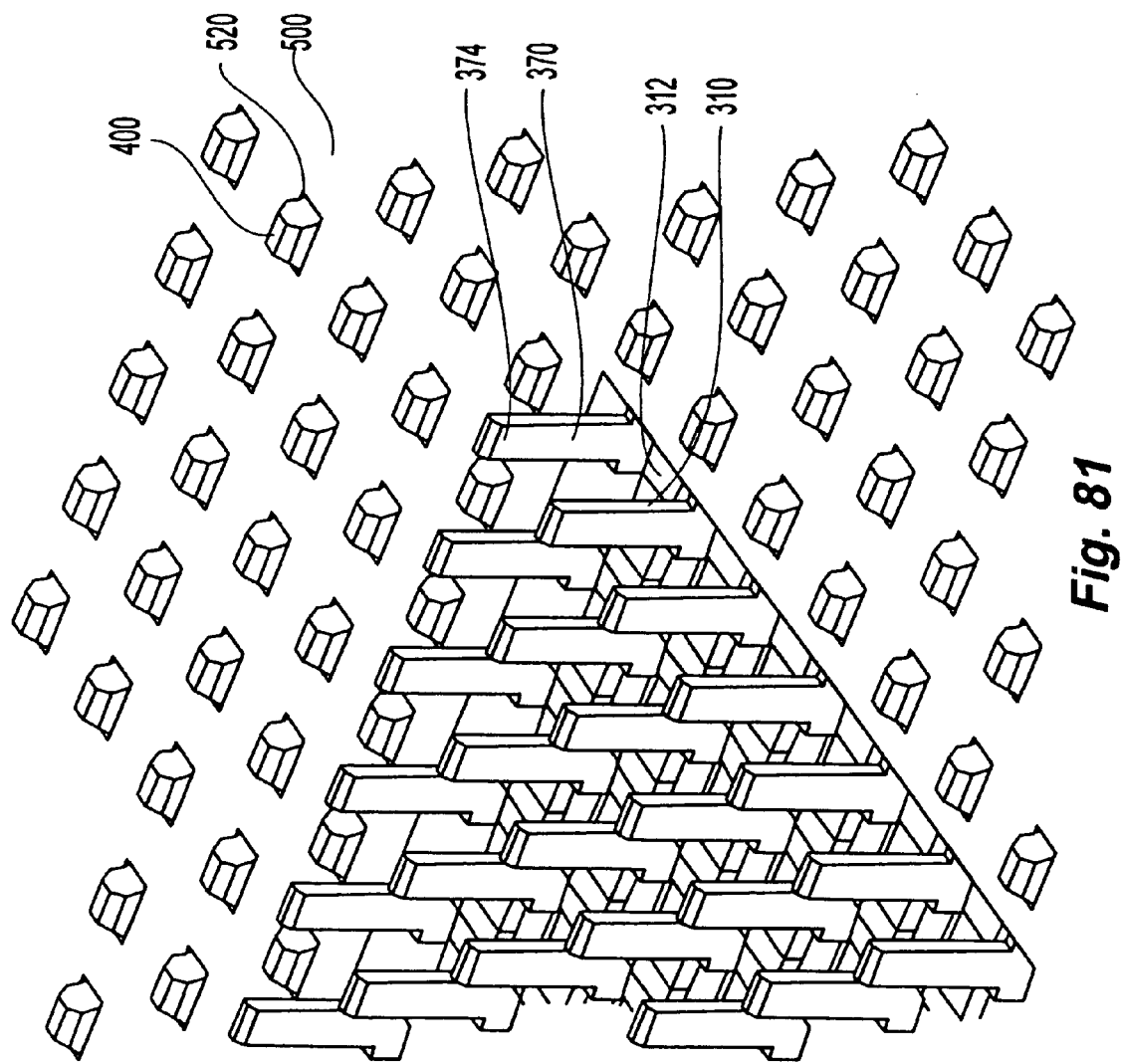
FIGS. 81 and 82 illustrate the top pin structure of the embodiment of FIG. 80 prior to finishing according to an exemplary embodiment of the present invention.
Figure 82:
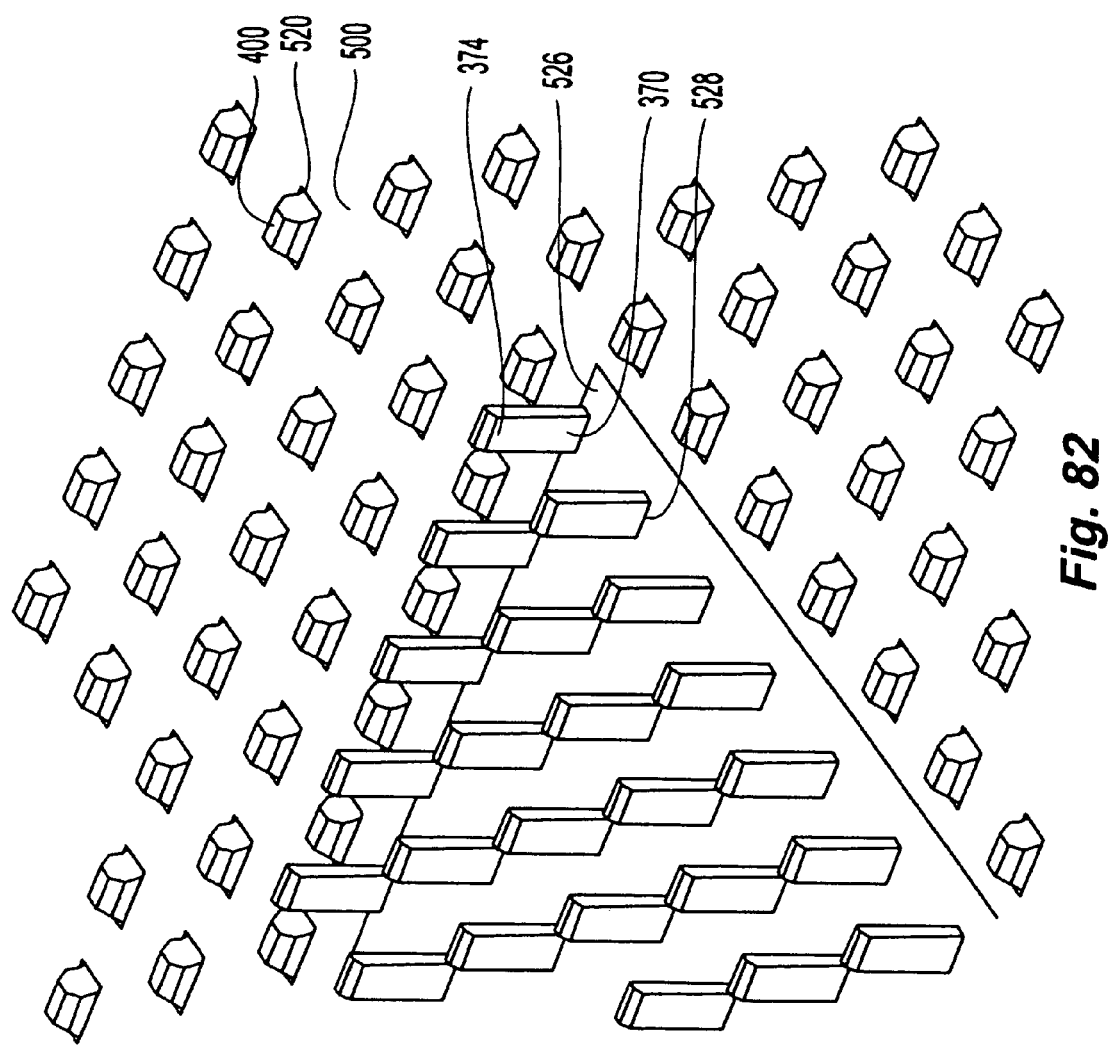

FIGS. 81 and 82 illustrate the top pin structure of the embodiment of FIG. 80 prior to finishing, according to an exemplary embodiment of the present invention. In particular, FIG. 81 illustrates the main body 500 with the cover plate 526 removed and prior to bending the ends 374 of capacitor pins 370. As shown in FIG. 81, the capacitor pins 370 couple between individual capacitors or individual capacitor modules of capacitor blades 310. For example, the capacitor pins 370 may connect to the conductive paths 312 between capacitors. Accordingly, the capacitor pins 370 serve as the electrical connection region for the capacitor blades 310. Each of the capacitor pins 370 in a column of pins 370 (e.g., between different capacitor blades 310) may be connected together in some embodiments. However, this is not required. One or more of the capacitor pins 370 in a column may be electrically insulated from the other pins 370 in the column.

As shown in FIG. 81, the ends 374 of capacitor pins 370 extend vertically. FIG. 82 shows the arrangement once cover plate 526 is provided. The cover plate 526 may be attached to the main body 500 using one or more of several expedients, such as clips, welding, staking, and adhesives. After placement of the cover plate 528, the ends 374 of the pins may be bent down toward the cover plate 528. Alternatively, the ends 374 may be kept straight. The length of the ends 374 above the surface of the main body 500 may be the same as pins 400, or a different length, for example, if the pins 370 and 400 are intended for connection at different levels.

Figure 83:
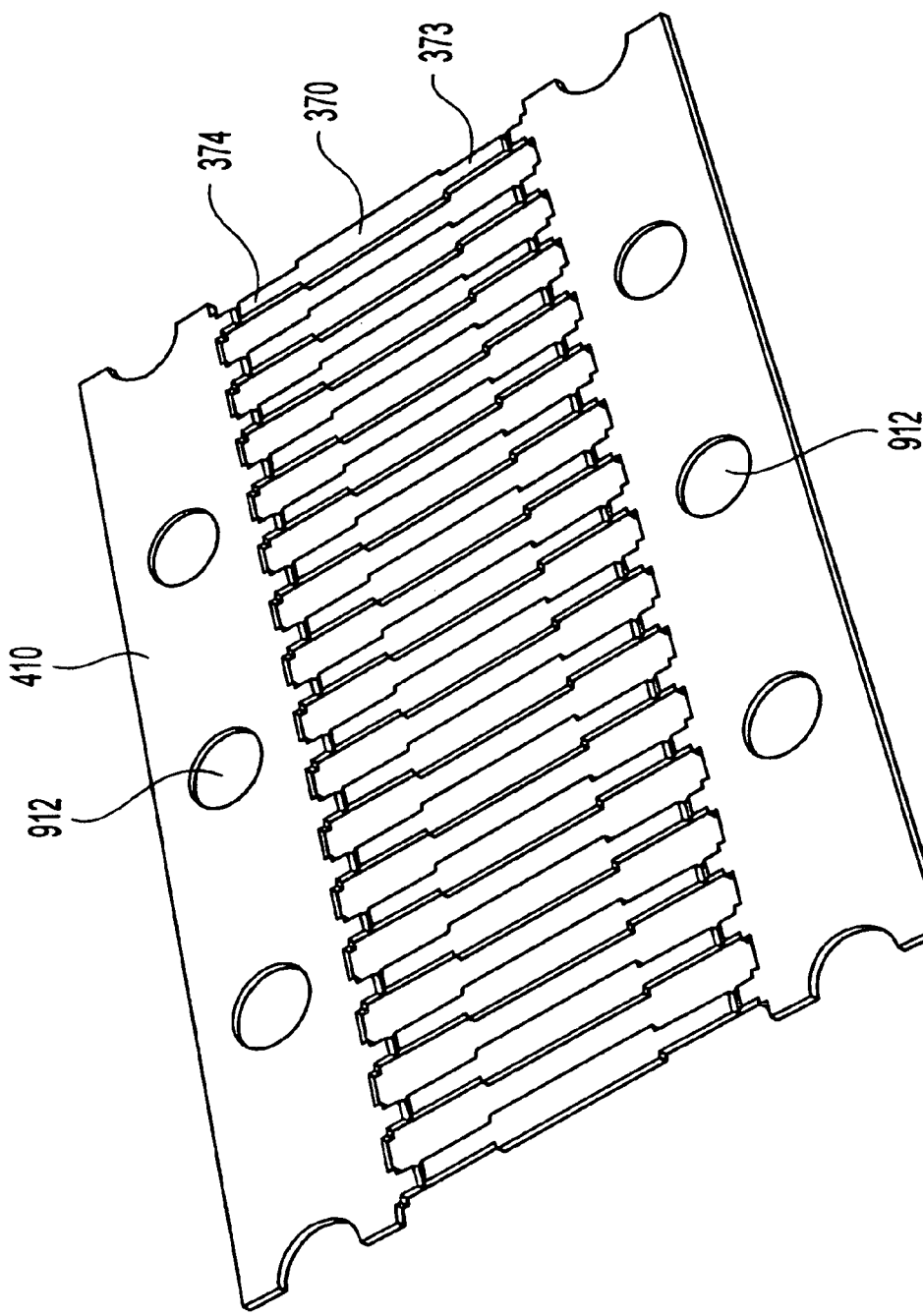
FIG. 83 illustrates an embodiment of a reel segment of capacitor pins according to an exemplary embodiment of the invention.

FIG. 83 illustrates an embodiment of a reel segment 910 of a take-up reel of capacitor pins 370 according to an exemplary embodiment of the invention. The reel segment 910 may be part of a reel of pins 370 used for automated fabrication of the capacitor blades 310. The reel segment 910 may be made from a conductive material, such as copper, and may be plated, in whole or in part, with a conductive material, such as gold. The reel may be formed by punching or stamping out portions of a metal strip. The strip may be plated either before or after this punching or stamping operation, preferably after, to increase the area of plating. The reel segment 910 includes holes 912 that may interface with a feeder mechanism to feed the reel and/or measure the length of fed material. The portion of the reel segment 910 that connects to the ends of the capacitor pins 370 may be narrowed or scored to facilitate removal of the pins 370 from the reel, e.g., by punching.

Figure 84:
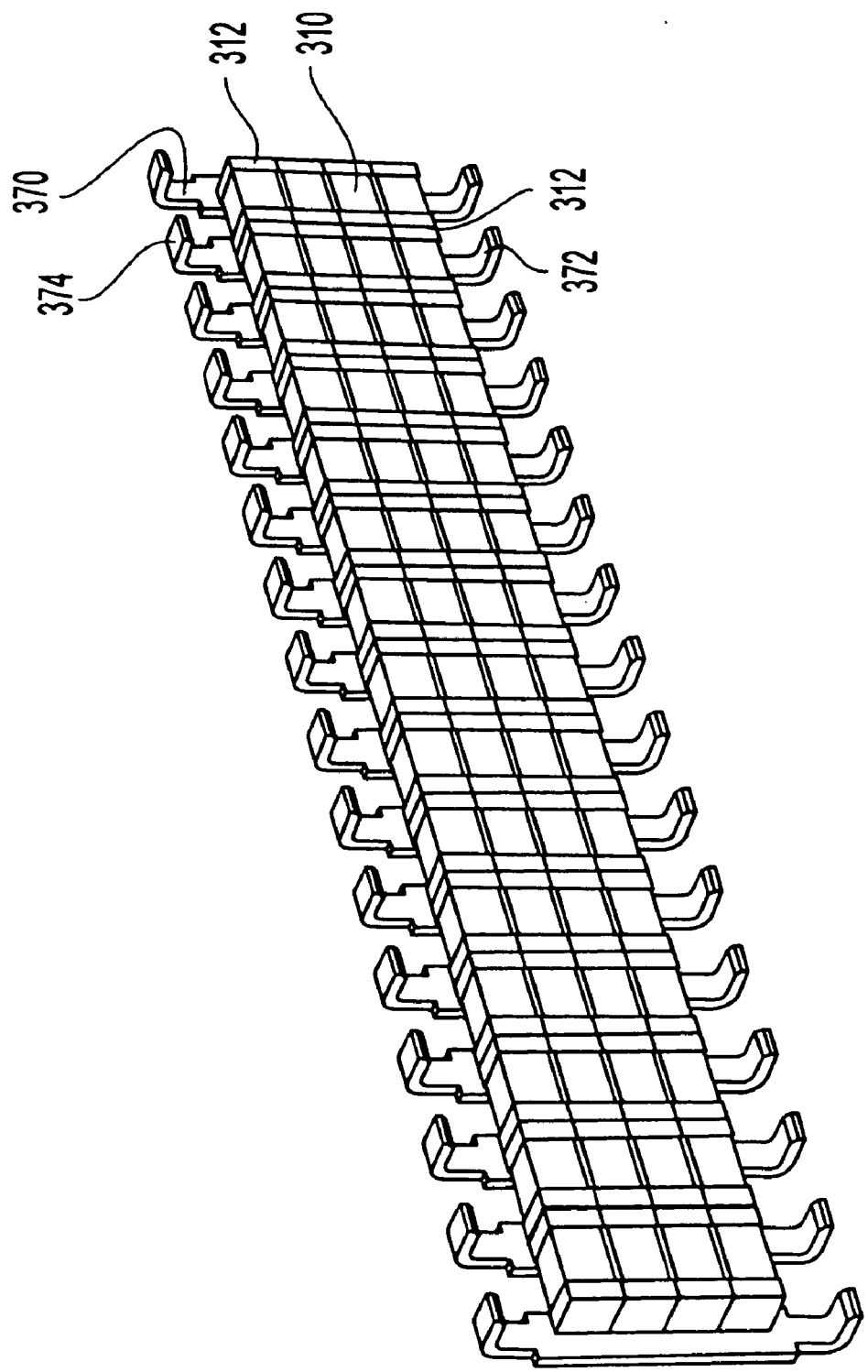
FIG. 84 illustrates an exemplary capacitor blade with pins according to an exemplary embodiment of the present invention.

FIG. 84 illustrates an exemplary capacitor blade 310 with attached pins 370 according to an exemplary embodiment of the present invention. As shown in FIG. 84, the pins 370 may be attached to the capacitor blade 310 along the conductive paths 312 of the blade. The attachment may be made, for example, using solder or a conductive paste. As shown, the ends 372, 374 (which are shown bent in this embodiment) may be narrower than the remainder of the pins 370. In this arrangement, the pins 370 provide electrical connection between the capacitor blade segments.

Figure 85:
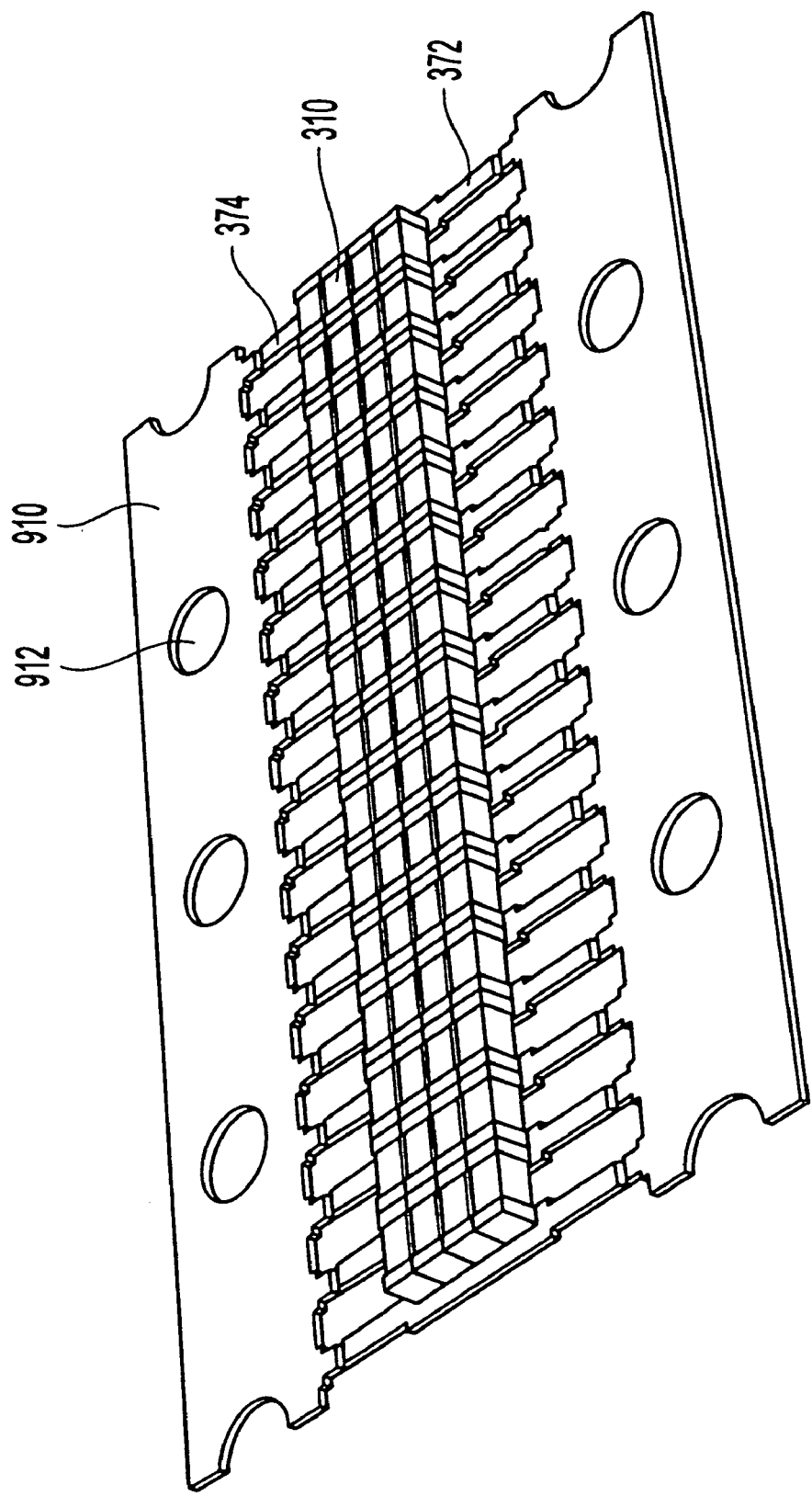
FIG. 85 illustrates an exemplary capacitor blade laid over a reel segment of capacitor pins according to an exemplary embodiment of the present invention.

FIG. 85 illustrates an exemplary capacitor blade 310 attached to the capacitor pins 370 that are still attached to a reel segment 910 of capacitor pins according to an exemplary embodiment of the present invention. As above, the blade 310 may be connected to the leads 370 using solder or a conductive paste.

Figure 86:
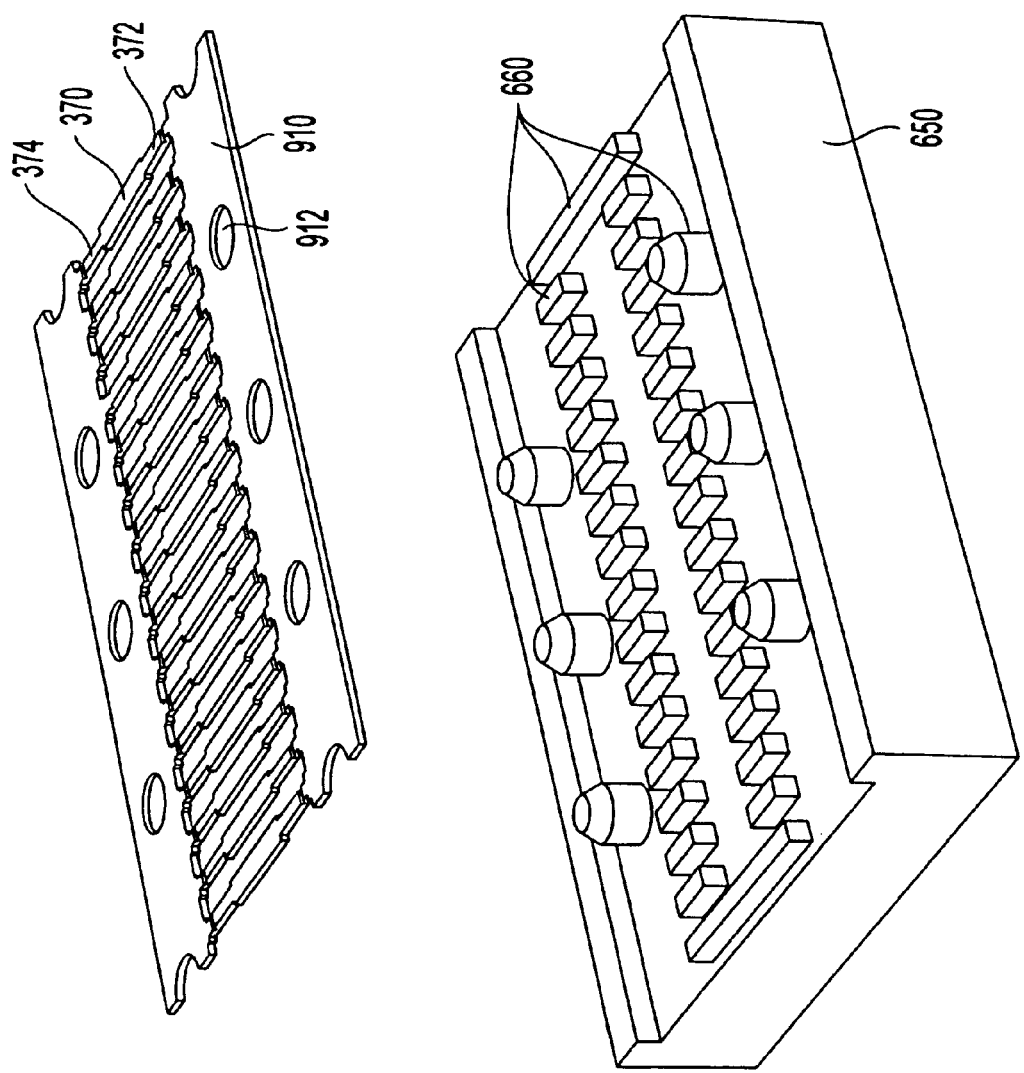
FIGS. 86–88 illustrate an exemplary method of manufacturing a capacitor blade with capacitor pins using a soldering tray according to an exemplary embodiment of the present invention.
Figure 87:
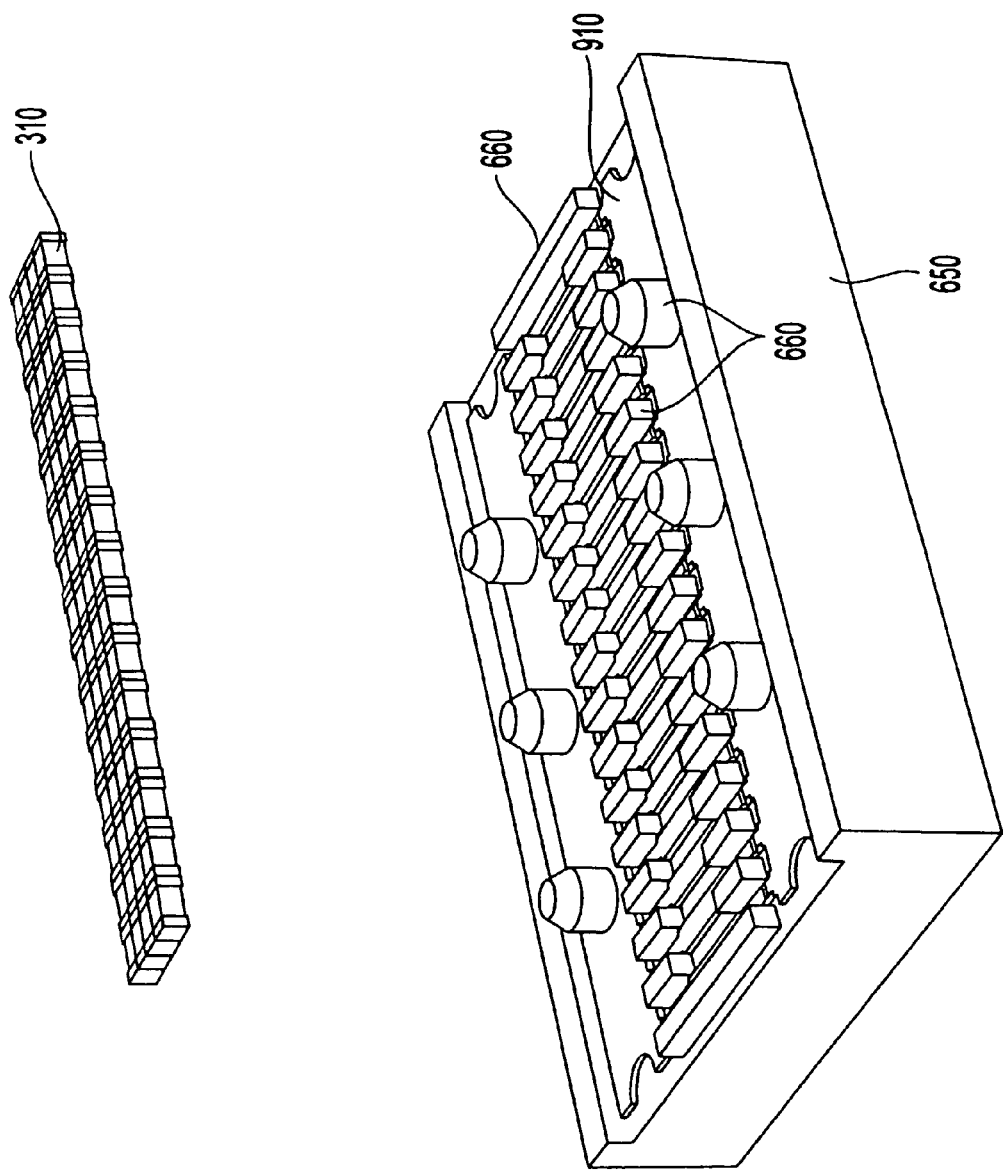
Figure 88:
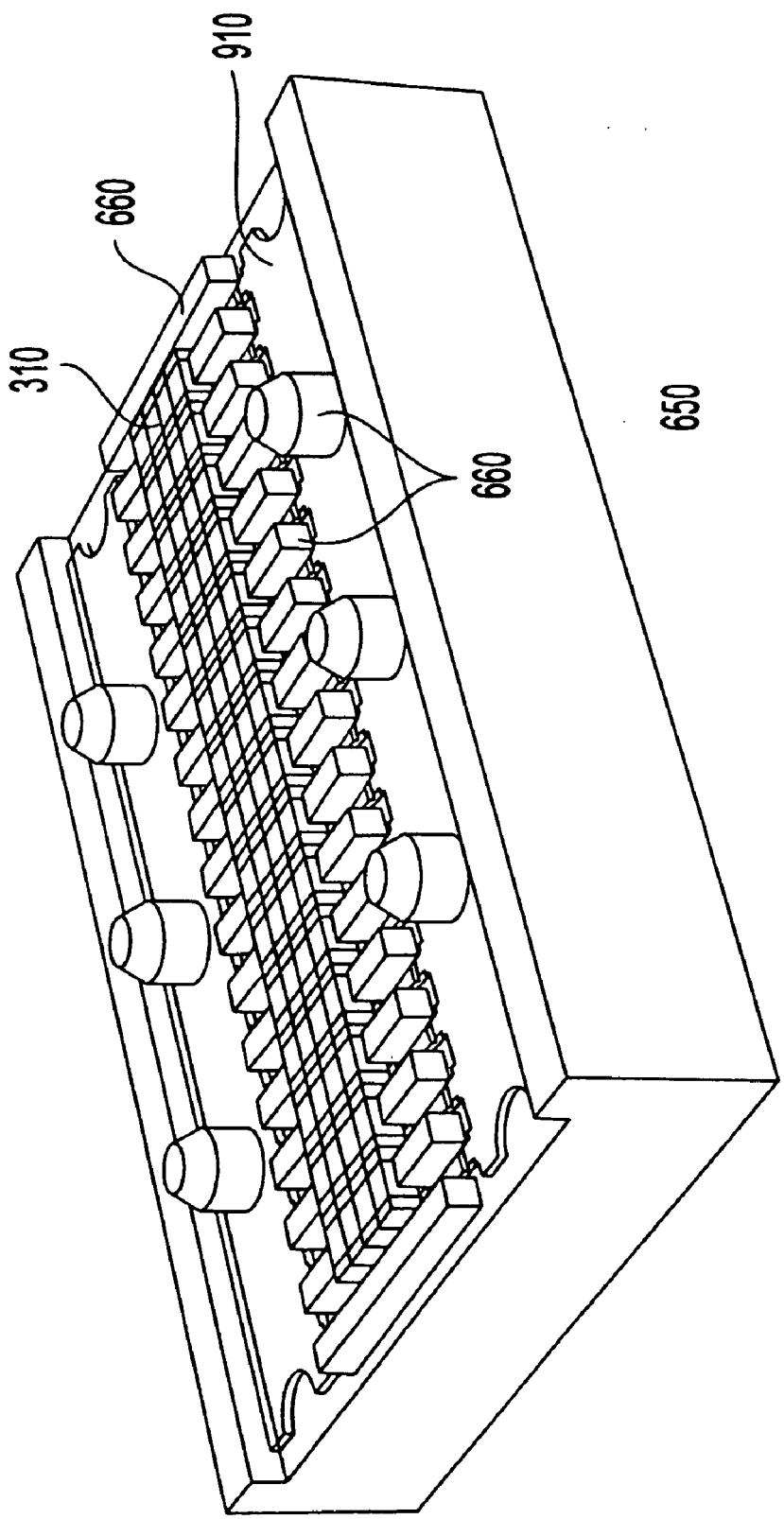
Figure 89:
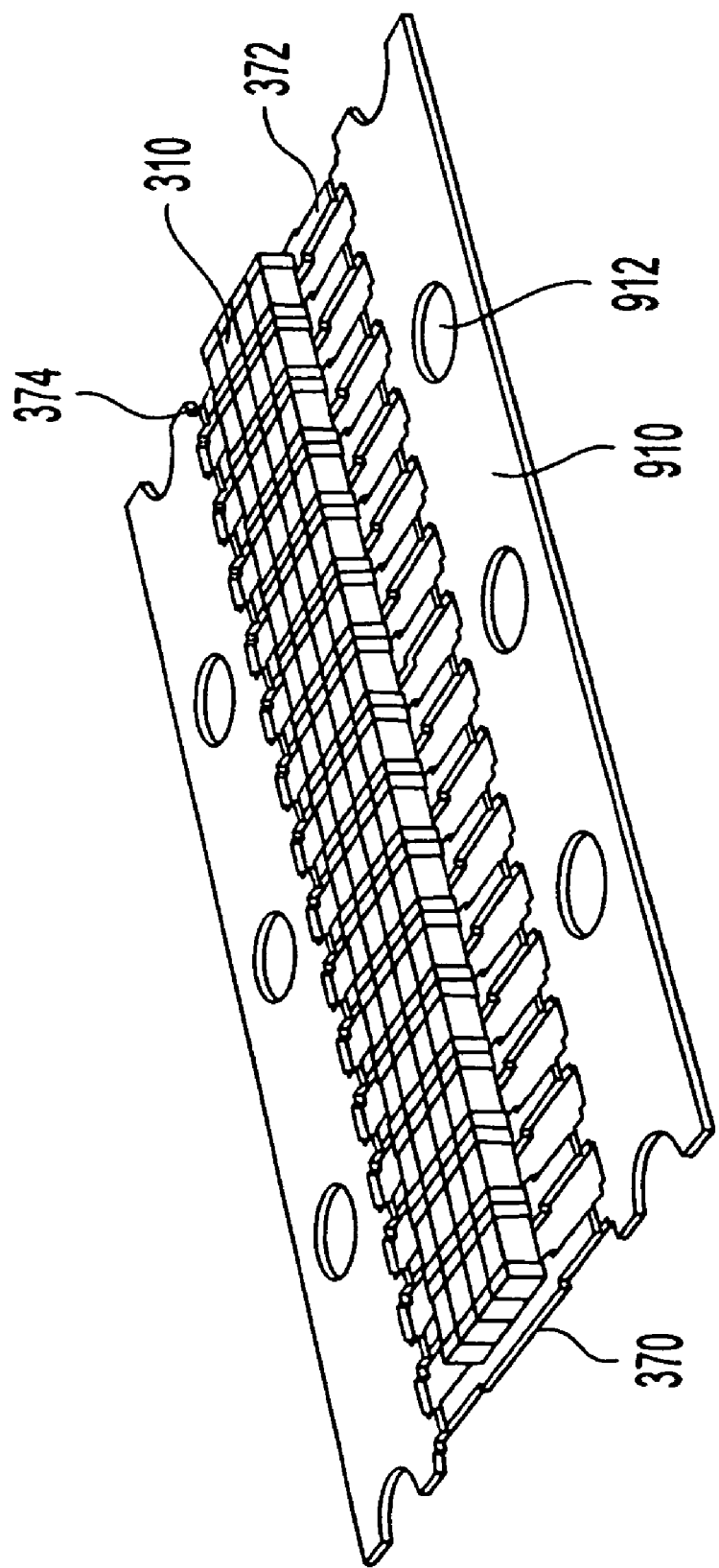
FIG. 89 illustrates an exemplary capacitor blade with capacitor pins according to an exemplary embodiment of the present invention manufactured in accordance with FIGS. 86–88.

FIGS. 86–88 illustrate an exemplary method of manufacturing a capacitor blade with capacitor pins using a soldering tray 650 according to an exemplary embodiment of the present invention. The soldering tray 650 includes features 660 for positioning the reel segment 910 and capacitor blade 310 in a stable manner for soldering. As shown in FIG. 86, the reel segment 910 is positioned on the soldering tray 650. A solder or conductive paste may be applied to portions of the reel segment 910. The capacitor blade 310 may then be positioned relative to the reel segment 910. The soldering tray 650 may then be heated in an oven or otherwise subjected to heat treatment, for example, to cause reflow of the solder or conductive paste, thereby electrically and physically connecting the pins 370 to the blade 310. The reel 910 may then be removed from the soldering tray 650. The exemplary capacitor blade 310 with capacitor pins 370 and mounted to the reel segment 910 is shown in FIG. 89.

Figure 90:
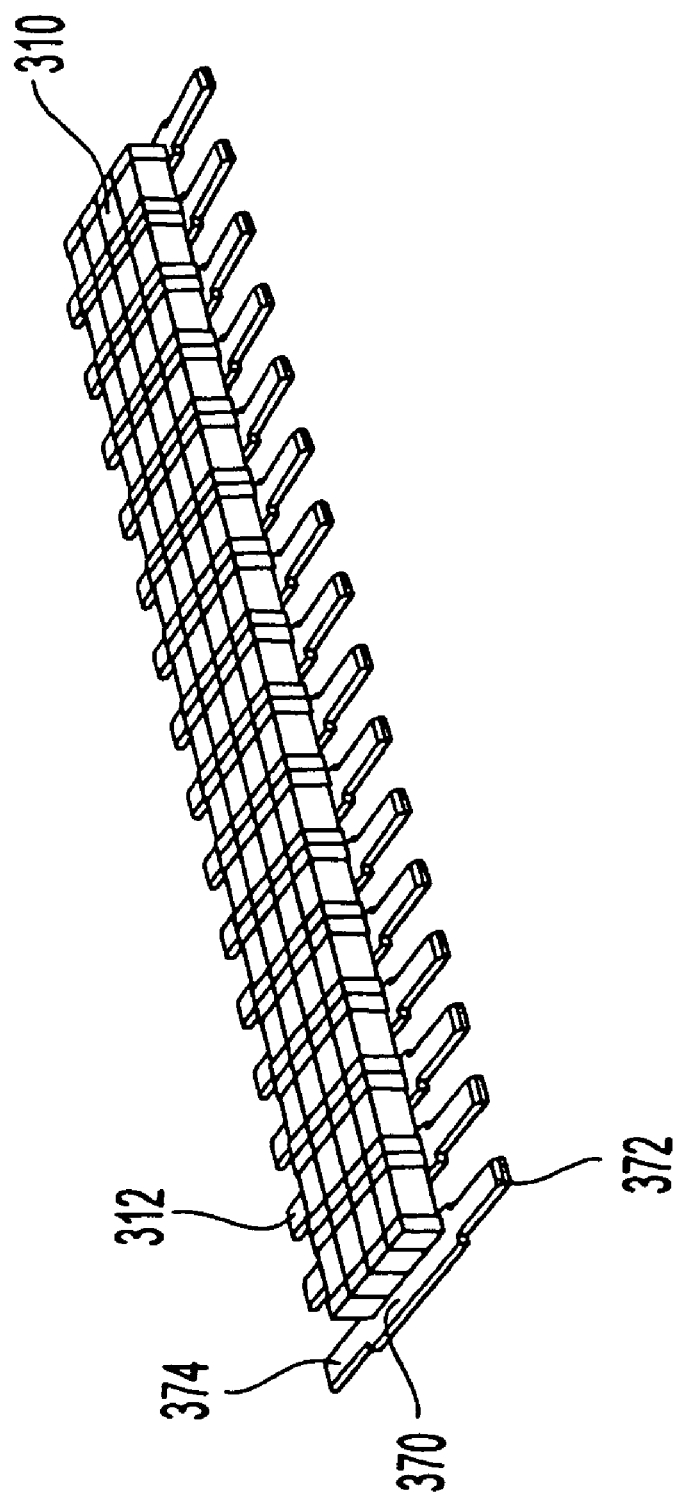
FIG. 90 illustrates an exemplary capacitor blade with capacitor pins in accordance with FIG. 89 with the reel removed.

FIG. 90 illustrates an exemplary capacitor blade 310 with capacitor pins 370 in accordance with an embodiment of the invention. For example, the arrangement of FIG. 90 may be obtained by removing the reel 910 from the embodiment shown in FIG. 89, e.g., with a punch or cutting tool.

Figure 91:
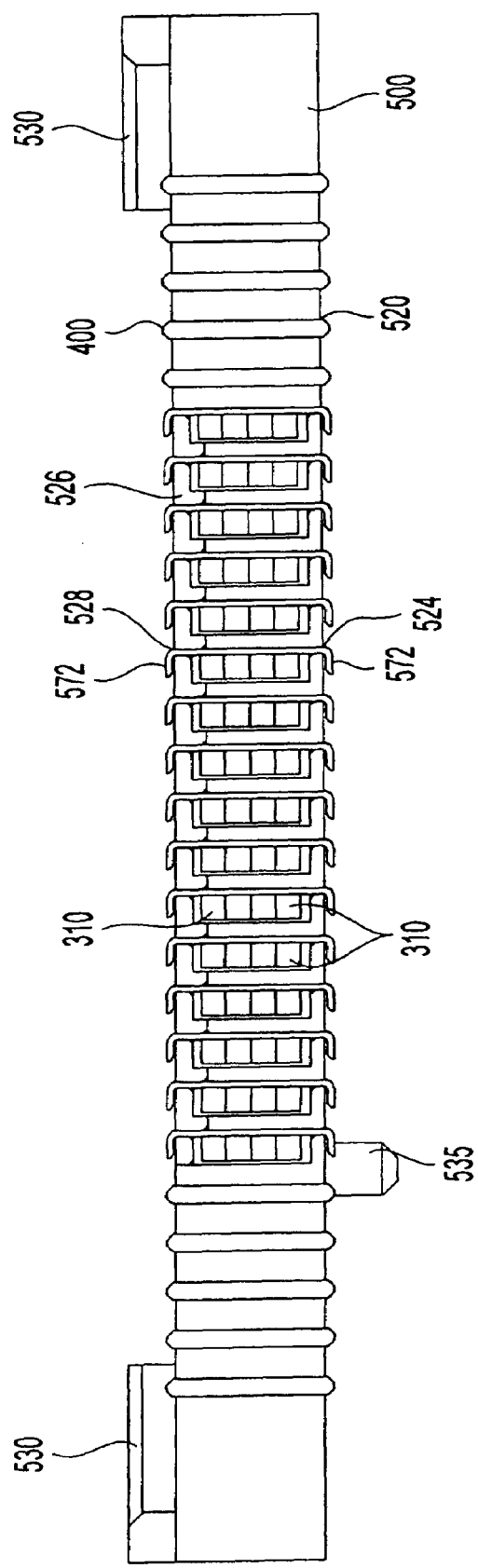
FIG. 91 illustrates a cross section of an exemplary interposer in accordance with the present invention.
Figure 92:
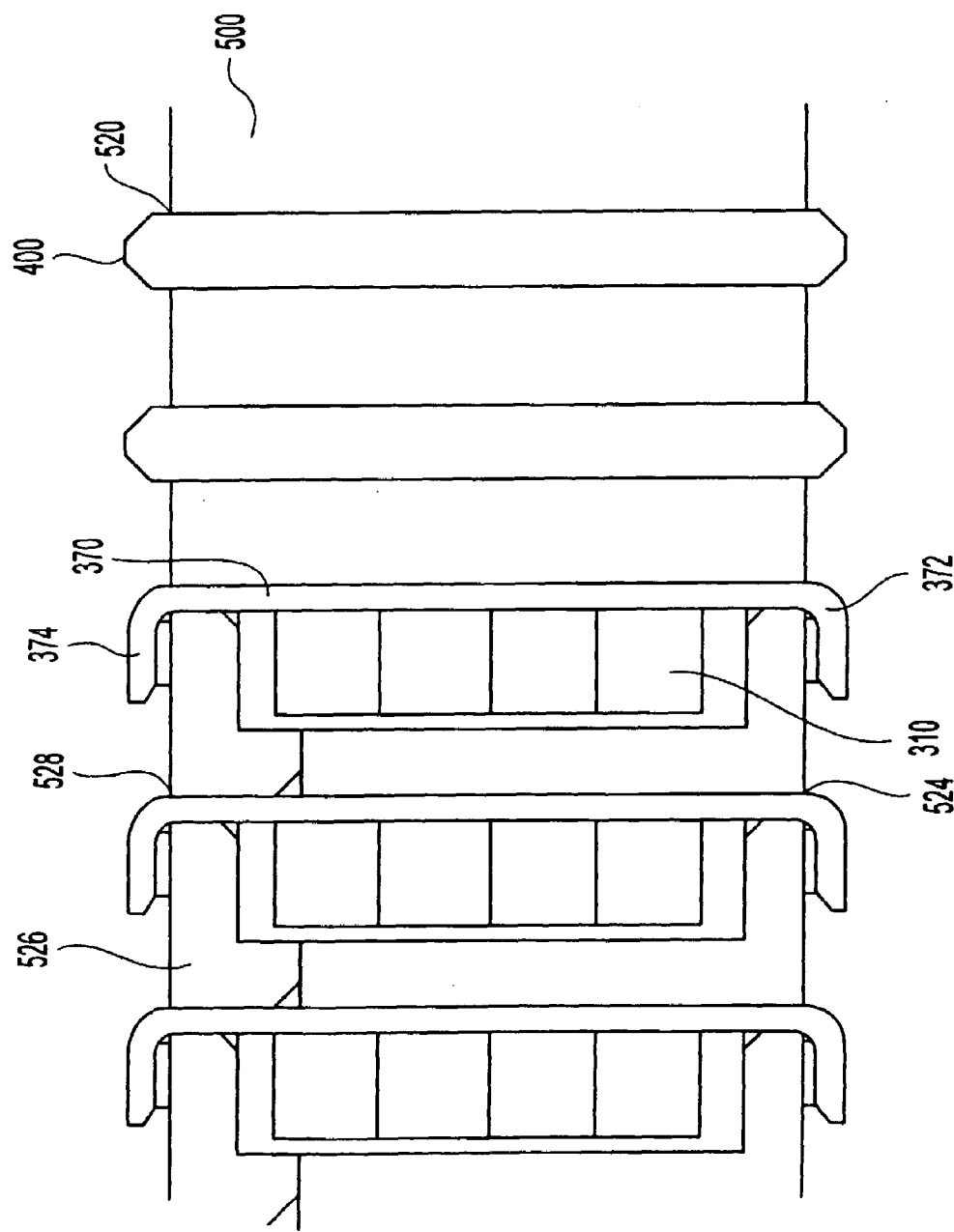
FIG. 92 illustrates a close-up view of the cross section of FIG. 91.

FIG. 91 illustrates a cross section of an exemplary interposer in accordance with the present invention. FIG. 92 illustrates a close-up view of the cross section of FIG. 91. The cross sections shown in FIGS. 91 and 92 are take through the main body 500 through multiple rows of capacitor blades 310. As shown in these Figs., the capacitor pin 370 extends from the top to the bottom of the main body 500, similar to that of the pins 400. The pins 370 electrically connect to the corresponding capacitor blade 310, but not in this arrangement to adjacent capacitor blades 310.

Figure 93:
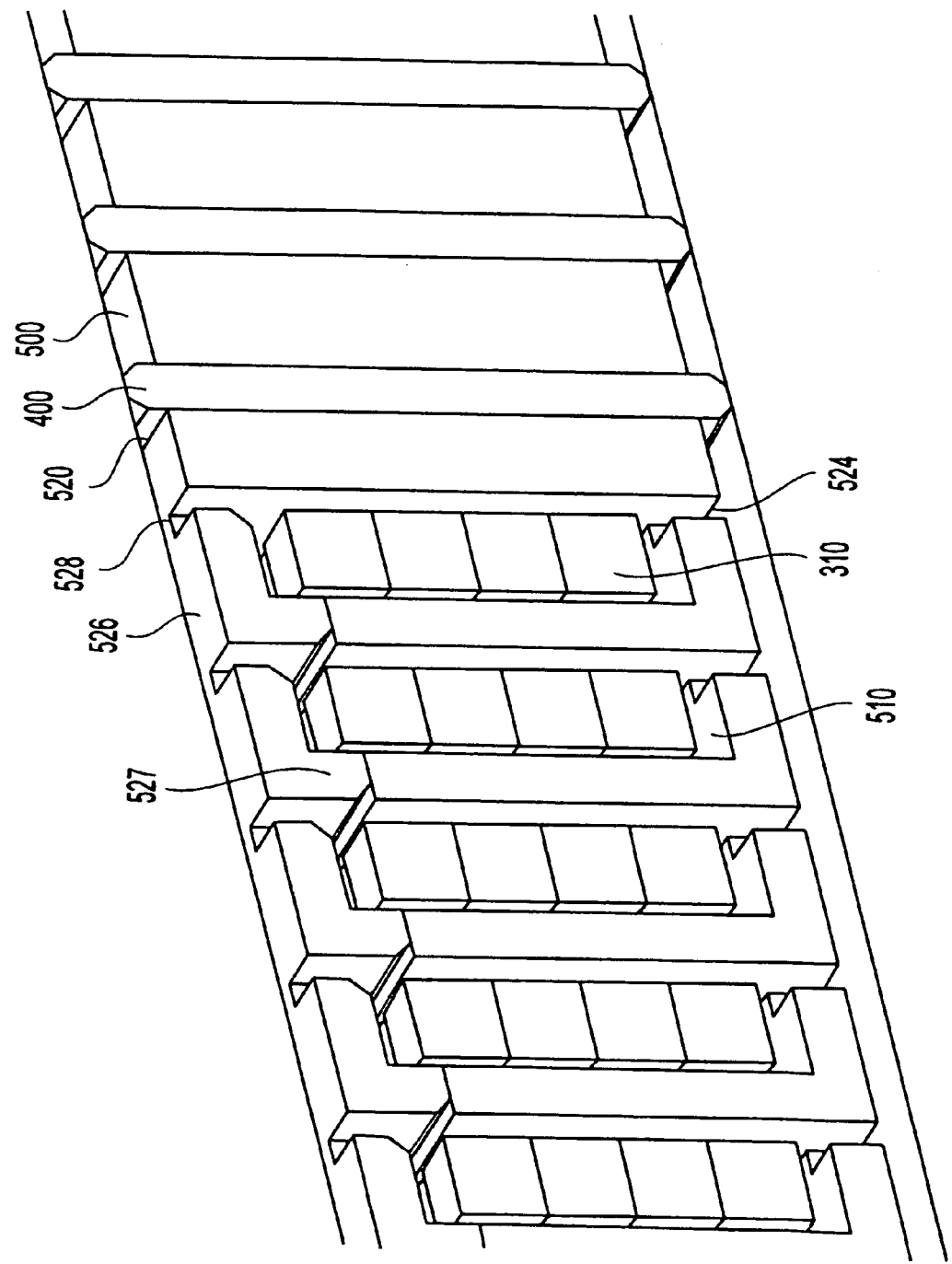
FIG. 93 illustrates a cross section of an exemplary interposer in accordance with the present invention.

FIG. 93 illustrates a cross section similar to that in FIGS. 91 and 92, however, with the capacitor pins 370 omitted to show the arrangement of the capacitor blades 310. The capacitor blades 310 are seated in trenches or slots 510 in the main body 500. Walls between the trenches 510 insulate one capacitor blade 310 from an adjacent blade 310. The trenches 510 have sufficient width to accommodate the capacitor pins 370. Hole 524 opens into the trench 510, as shown. Of course, the trenches may be formed by a capacitor tray that is connected to the main body 500 and forms a portion thereof.

Cover 526 having holes 528 fits over the trench area of the main body 500 to retain the capacitor blades 310. The cover 526 may have a smooth upper surface and a lower surface with segments 527 that may engage the trench walls.

Figure 94:
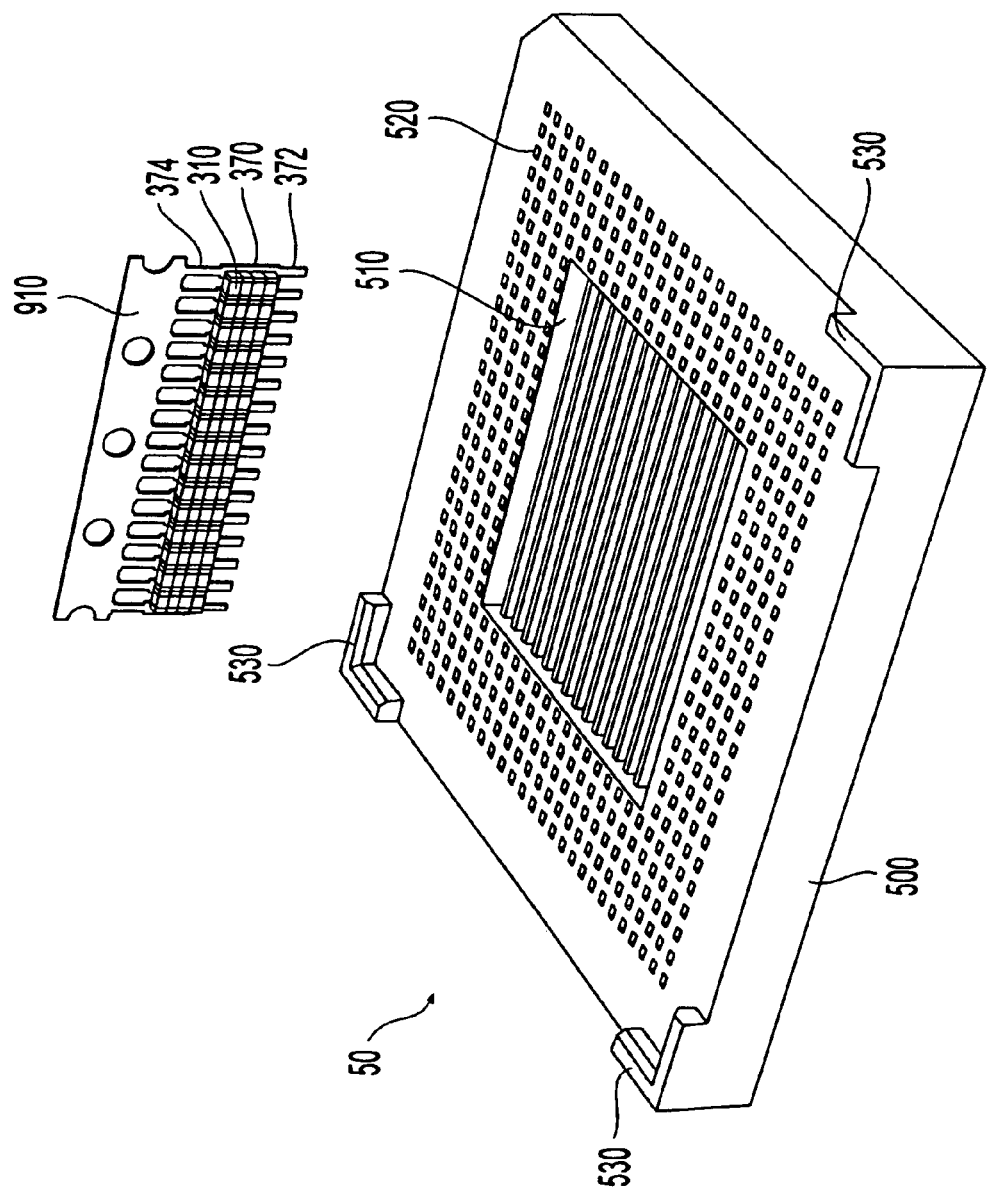
FIG. 94 illustrates an exemplary method of providing an interposer with a capacitor blade and reel segment of capacitor pins according to an exemplary embodiment of the present invention.

FIG. 94 illustrates an exemplary method of providing an interposer 50 with a capacitor blade 310 and reel segment 910 of capacitor pins 370 according to an exemplary embodiment of the present invention. The capacitor blade 310 may be inserted into the trench 510 of the main body 500 with the capacitor pins 370 still attached to the reel segment 910. Following insertion, pins 370 (and the capacitor blade 310) may be removed from the remainder of the reel segment 910. Of course, the blade 310 and pins 370 may be inserted into the trench 510 after removing the pins 370 from the segment 910.

When inserting the blade 310 into the trench 510, the ends 372 of the pins 370 may be inserted through the holes 524 in the bottom of the main body 500 and protrude therefrom. Moreover, the ends 374 of the pins 370 will extend upward from the main body 500. The cover 526 may then be provided over the blades 310 so that the ends 374 penetrate through the holes 528 in the cover 526. If desired, the ends 372 and/or 374 may be bent down.

Figure 95:
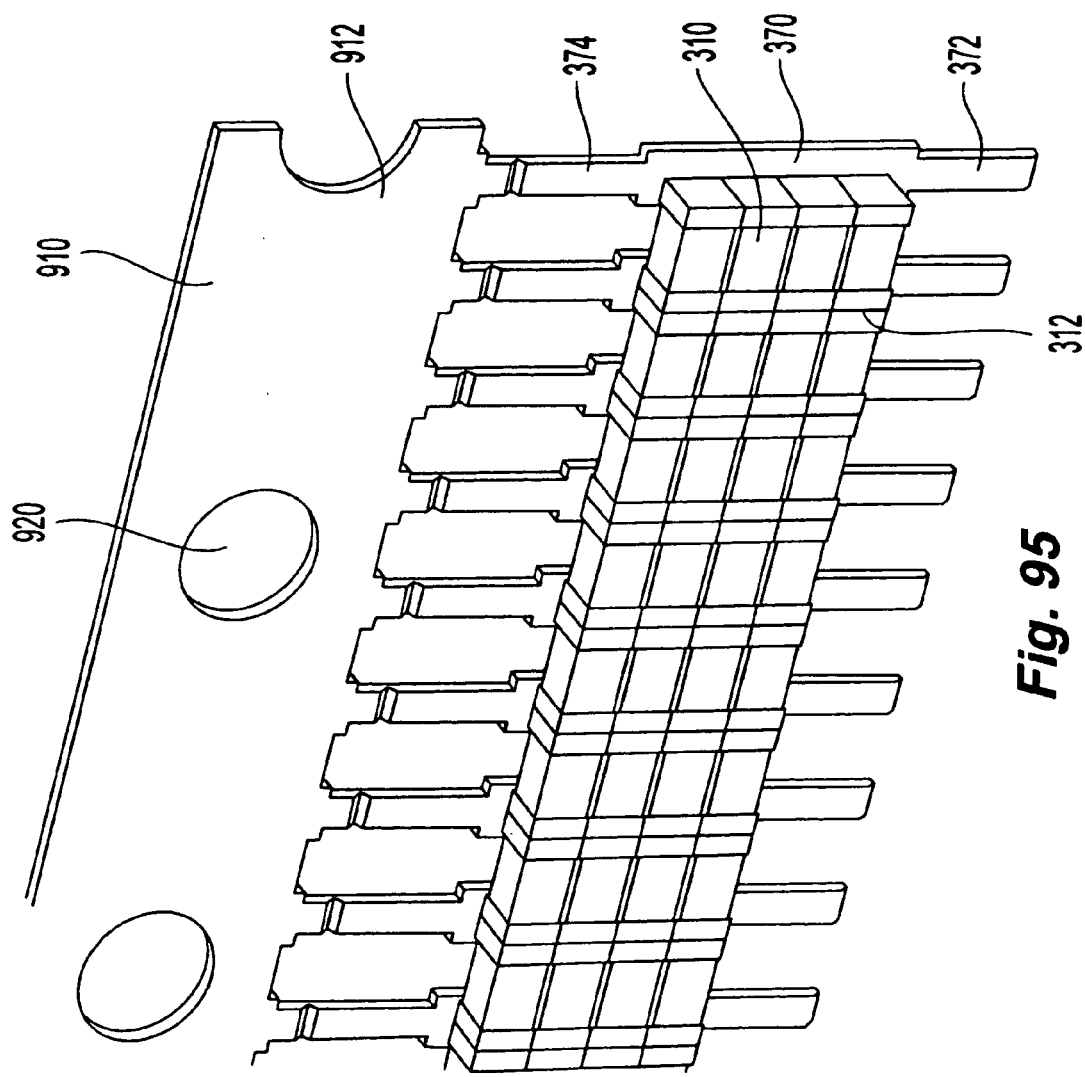
FIG. 95 illustrates an exemplary capacitor blade and reel segment of capacitor pins according to an exemplary embodiment of the present invention.

FIG. 95 illustrates an exemplary capacitor blade 310 and reel segment 910 of capacitor pins 370 according to an exemplary embodiment of the present invention. The arrangement is similar to that shown in FIG. 85, for example, except that the reel segment 910 includes only a top portion 912. In this case, the capacitor blade 310 may be attached to a reel segment 910 having only a top portion 912. Otherwise, the bottom portion of the reel segment 910 may be removed after the capacitor blade is attached.

Figure 96:
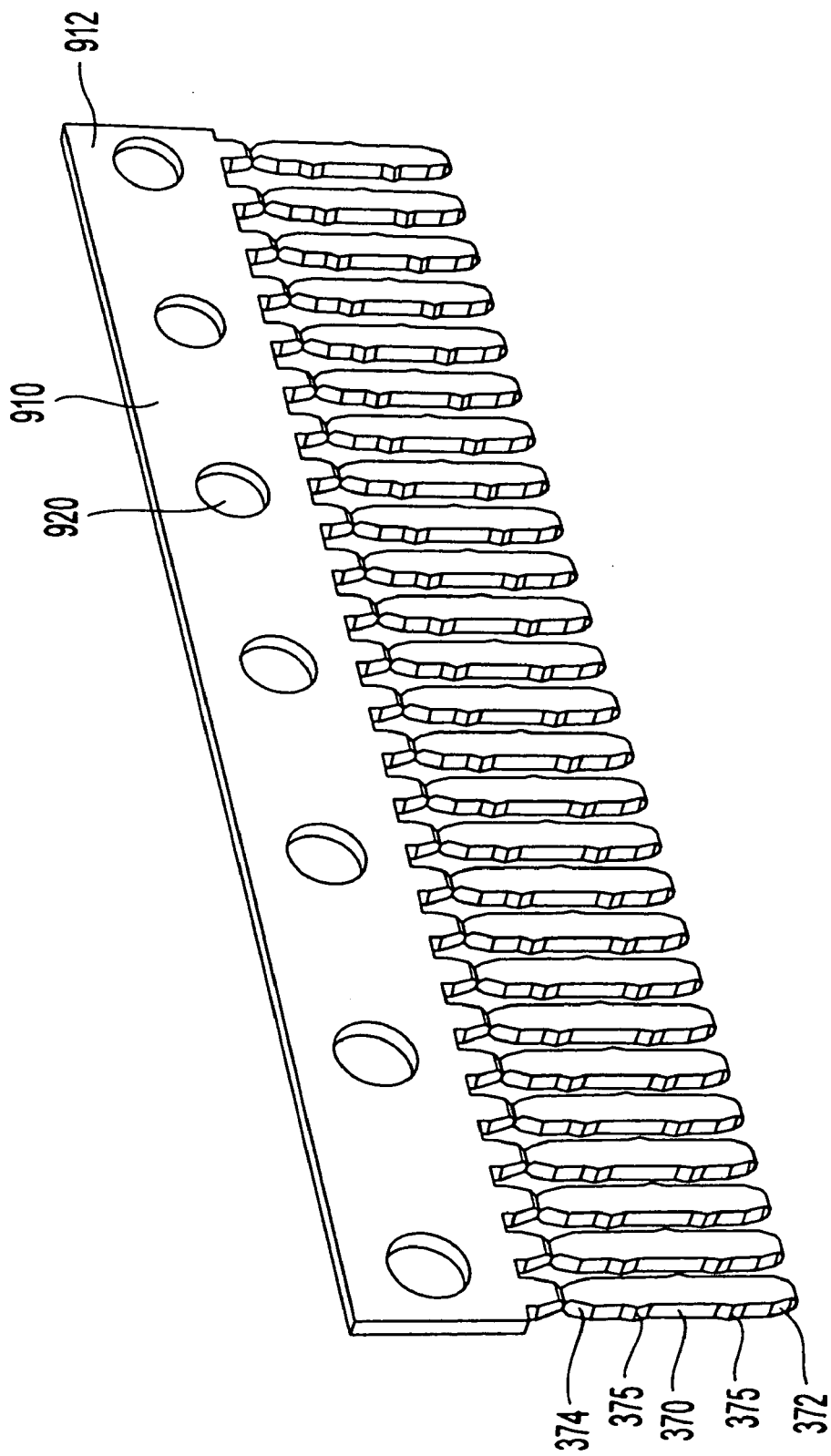
FIG. 96 illustrates a further embodiment of a reel segment of capacitor pins according to an exemplary embodiment of the invention.

FIG. 96 illustrates a further embodiment of a reel segment 910 of capacitor pins 370 according to an exemplary embodiment of the invention. As shown in FIG. 96, the reel segment 910 only includes a top portion 912. In addition, in the embodiment of FIG. 96, the capacitor pins 370 include tapered bottom portions 372 and top portions 374 and protrusions 375. The protrusions 375 may be used to retain the pins 370, either alone or together with an adhesive or other expedient, in the main body 500. In this case, the end 372, 374 may remain straight as they project through the holes 524, 528 in the main body 500 following assembly. Moreover, the pins 370 may have, if desired, the same length extension from the main body surface as the pins 400.

Figure 97:
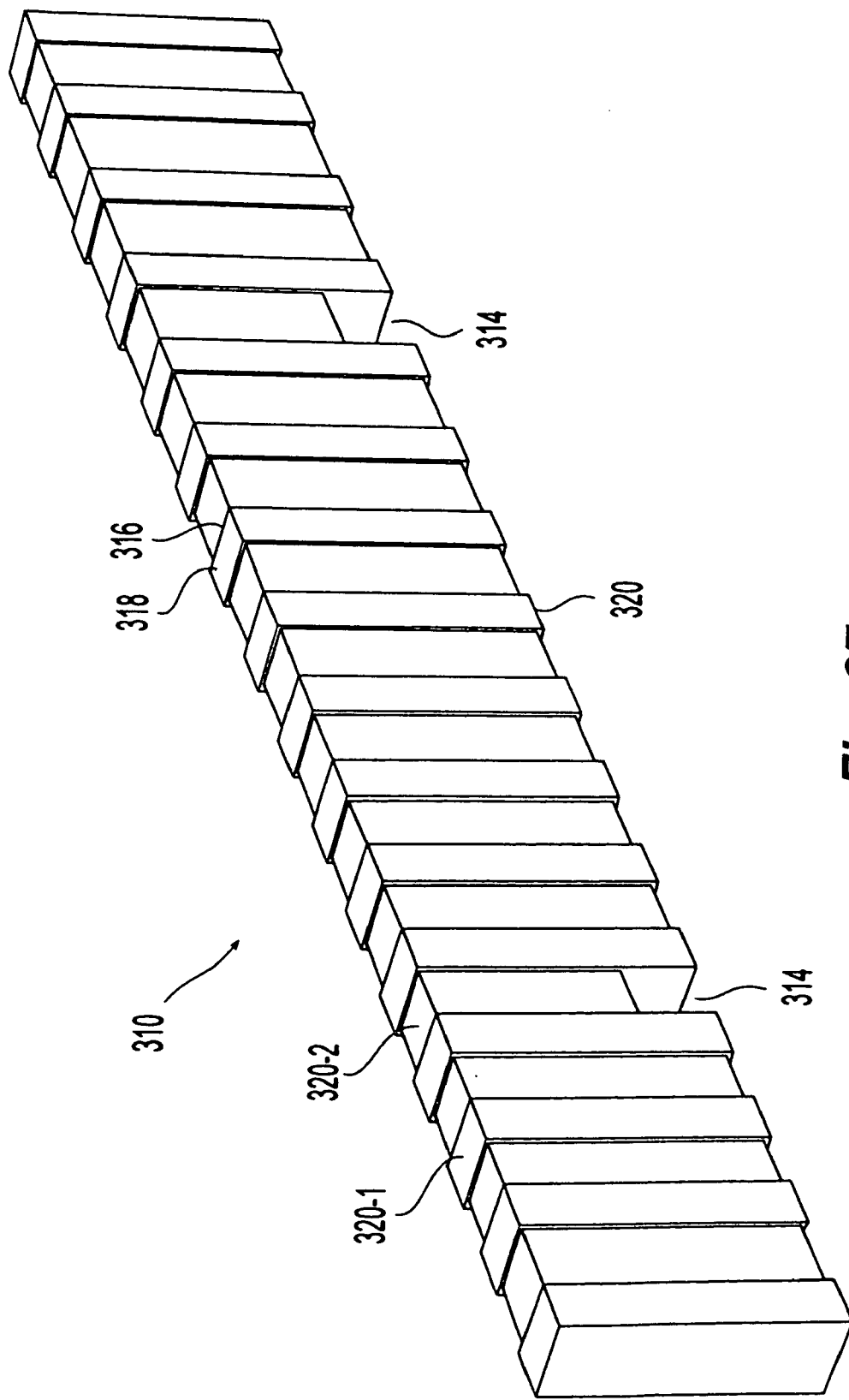
FIG. 97 illustrates a view of a further exemplary embodiment of a capacitor blade in accordance with the present invention.
Figure 98:
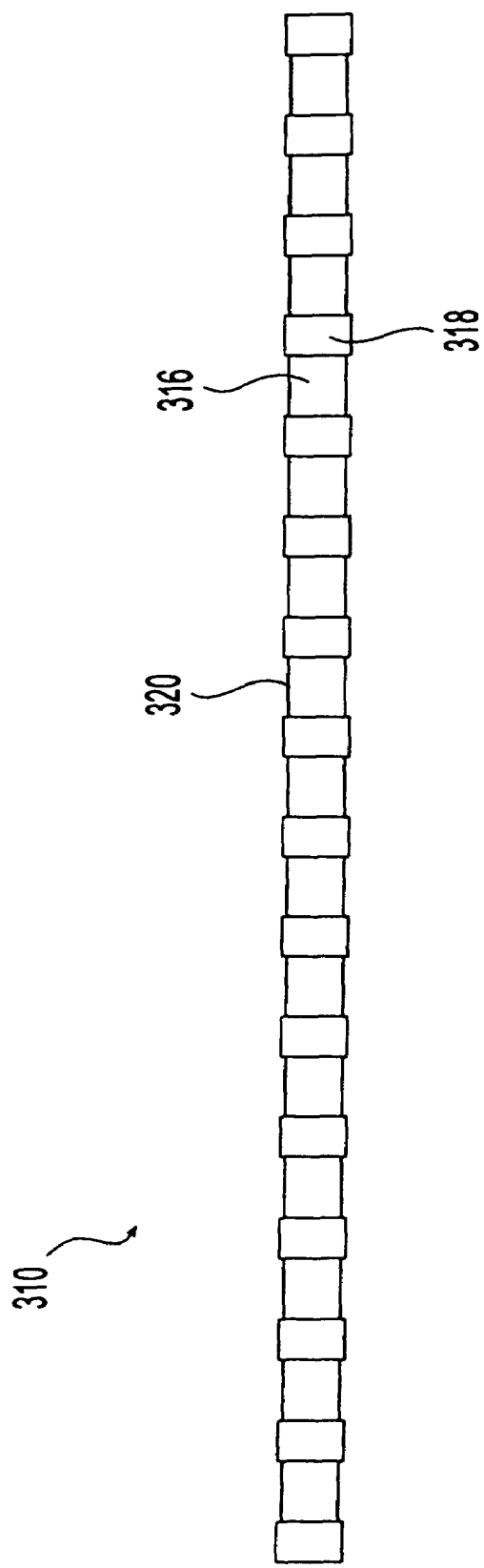
FIG. 98 illustrates a top view of the exemplary capacitor blade of FIG. 97.
Figure 99:
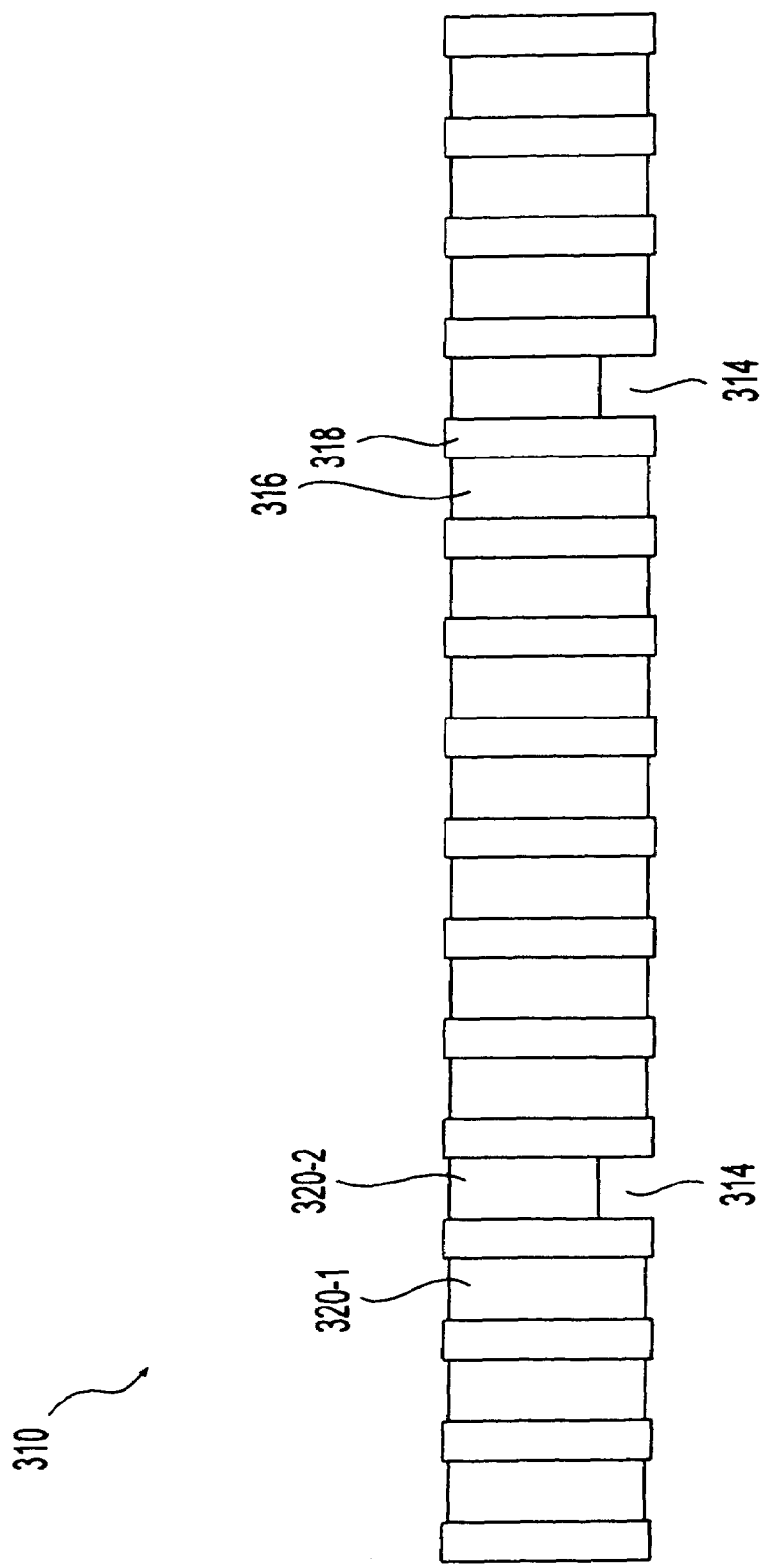
FIG. 99 illustrates a side view of the exemplary capacitor blade of FIG. 97.

FIG. 97 illustrates a view of a further exemplary embodiment of a capacitor blade 310 in accordance with the present invention. FIGS. 98 and 99 illustrate top and side views, respectively, of the exemplary capacitor blade of FIG. 97. The capacitor blade 310 is made up of multiple capacitors 320, with two of the capacitors 320-1 and 320-2 having different dimension, in this case, a different height. Of course, the different dimension may be height, width, and/or length. The different sizes of the capacitors 320-1, 320-2 define the alignment notches 314, of which two notches 314 are provided in the capacitor blade 310 by way of example. As above, another number and/or arrangement of notches may be provided.

In the embodiment of FIGS. 97–99, the individual capacitors 320 are joined together by, for example, joining alternating layers of dielectric or insulator material 316 and conductive material 318. The dielectric or insulator material 316 may be, for example, a ceramic material, an oxide, a nitride or other suitable material, or combination of the foregoing. The conductive material 318 may be, for example, a metal, such as aluminum, copper, gold, silver, steel, or other suitable metal or metal alloy. The capacitors 320 may be joined using a lamination process, for example, with a layer of dielectric or insulative material being formed or applied, followed by a layer of conductive material, etc. The capacitor blade 310 can be used in a substrate or a interposer, for example, as described above.

While the present invention has been disclosed with reference to certain preferred embodiments, numerous modifications, alterations, and changes to the described embodiments are possible without departing from the sphere and scope of the present invention, as defined in the appended claims. Accordingly, it is intended that the present invention not be limited to the described embodiments, but have the full scope defined by the language of the following claims, and equivalents thereof.

What is claimed is:

1. A decoupling capacitor module comprising:
   a plurality of conductive power layers providing a first capacitor plate;
   a plurality of conductive ground layers providing a second capacitor plate;
   a plurality of insulative layers, said power layers and said ground layers alternating along a dimension of the decoupling capacitor module, with at least one of the insulative layers located between the alternating power and ground layers,
   a first set of leads coupled to the power layers; and
   a second set of leads coupled to the ground layers.

2. The capacitor module according to claim 1, wherein the first and second sets of leads extend through the power, ground, and insulative layers.

3. The capacitor module according to claim 1, wherein the power layers are rectangular.

4. The capacitor module according to claim 1, wherein the power layers are cylindrical.

5. The capacitor module according to claim 2, wherein the leads of the first set connect to the power layers and the leads of the second set connect to the ground layers.

6. A substrate for a semiconductor die comprising:
   an insulating body having a first side and a second side opposite the first side and having electrically conductive paths extending between the first side and the second side, each of the electrical paths terminating in a landing pad on the first side of the body and a landing pad on the second side of the body, the landing pads on the first side sized and space for electrical connection to a semiconductor die, and a decoupling capacitor module disposed in said insulating body, the decoupling capacitor module comprising a plurality of conductive power layers, a plurality of conductive ground layers, and a plurality of insulative layers, the power layers and the ground layers alternating along a dimension of the decoupling capacitor module, with at least one of the insulative layers located between the alternating power and ground layers, a first set of leads coupled to the power layers; and a second set of leads coupled to the ground layers, the first and second sets of leads sized and spaced for electrical connection to the semiconductor die.

7. An electrical interposer for connecting between a semiconductor die and a circuit board, comprising:

an insulating body including a first side adapted to receive a semiconductor device and a second side adapted for mounting to a circuit board;

a plurality of electrically conductive pins extending through holes in the insulating body from the first side to the second side of the insulating body, the pins adapted to connect to the semiconductor device and to the circuit board; and a decoupling capacitor module disposed in said insulating body, the decoupling capacitor module comprising a plurality of conductive power layers, a plurality of conductive ground layers, and a plurality of insulative layers, the power layers and the ground layers alternating along a dimension of the decoupling capacitor module, with at least one of the insulative layers located between the alternating power and ground layers, a first set of leads coupled to the power layers; and a second set of leads coupled to the ground layers, the first and second sets of leads sized and spaced for electrical connection to the semiconductor die, the conductive paths sized and spaced for electrical connection to the semiconductor device and to the circuit board.

8. The electrical interposer according to claim 7, wherein the pins are individually held in the holes through the insulating body.

9. The electrical interposer according to claim 7, wherein a group of multiple pins are held in each of said holes through the insulating body.

10. The electrical interposer according to claim 9, wherein each group of multiple pins forms part of a pin module.

11. The electrical interposer according to claim 10, wherein the pin module includes an insulating material separating the multiple pins from each other.

12. The electrical interposer according to claim 11, wherein the pin module further includes electrically conductive plating around an outer side surface of the insulating material.

13. The electrical interposer according to claim 10, wherein the pin module includes a column.

14. The electrical interposer according to claim 13, wherein the column is formed from an electrically conductive material.

15. The electrical interposer according to claim 13, wherein the column is formed from an insulative material.

16. The electrical interposer according to claim 13, wherein the column is formed from an insulative material that is plated with an electrically conductive material.

17. The electrical interposer according to claim 7, further comprising insulative buttresses extending from the second side of the insulative body, wherein groups of the pins extend along sides of each of the buttresses.

18. The electrical interposer according to claim 17, wherein the insulative buttresses are integral with the insulative body.

19. The electrical interposer according to claim 17, wherein the buttresses include axial notches that receive individual pins of the groups of pins.

20. The electrical interposer according to claim 17, further comprising a socket including a plurality of socket pins, wherein the socket mates with the pluggable interconnect component to form an electrical connection therebetween.

21. The electrical interposer according to claim 20, further comprising a printed circuit board, wherein the socket is mounted to and electrically connected to the printed circuit board.

* * * * *